US008069428B1

(12) United States Patent  
Ogami et al.

(10) Patent No.: US 8,069,428 B1  
(45) Date of Patent: Nov. 29, 2011

(54) TECHNIQUES FOR GENERATING MICROCONTROLLER CONFIGURATION INFORMATION

(75) Inventors: Kenneth Y. Ogami, Bothell, WA (US); Doug Anderson, Edmund, WA (US); Matthew Pleis, Carnation, WA (US); Frederick Redding Hood, III, Auburn, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 393 days.

(21) Appl. No.: 11/818,005

(22) Filed: Jun. 12, 2007

Related U.S. Application Data

(63) Continuation of application No. 10/002,726, filed on Oct. 24, 2001, now Pat. No. 7,406,674.

(51) Int. Cl.  
*G06F 17/50* (2006.01)

(52) U.S. Cl. .................................... 716/117; 716/139

(58) Field of Classification Search ................ 716/1, 16, 716/17, 18, 117, 139; 326/37–41  
See application file for complete search history.

(56) References Cited

U.S. PATENT DOCUMENTS

| | | |
|---|---|---|
| 3,600,690 A | 8/1971 | White |
| 3,725,804 A | 4/1973 | Langan |
| 3,740,588 A | 6/1973 | Stratton et al. |
| 3,805,245 A | 4/1974 | Brooks et al. |
| 3,810,036 A | 5/1974 | Bloedorn |
| 3,831,113 A | 8/1974 | Ahmed |
| 3,845,328 A | 10/1974 | Hollingsworth |
| 3,940,760 A | 2/1976 | Brokaw |
| 4,061,987 A | 12/1977 | Nagahama |
| 4,134,073 A | 1/1979 | MacGregor |
| 4,138,671 A | 2/1979 | Comer et al. |
| 4,176,258 A | 11/1979 | Jackson |
| 4,250,464 A | 2/1981 | Schade, Jr. |
| 4,272,760 A | 6/1981 | Prazak et al. |
| 4,283,713 A | 8/1981 | Philipp |
| 4,326,135 A | 4/1982 | Jarrett et al. |
| 4,344,067 A | 8/1982 | Lee |
| 4,380,083 A | 4/1983 | Andersson et al. |
| 4,438,404 A | 3/1984 | Philipp |
| 4,475,151 A | 10/1984 | Philipp |
| 4,497,575 A | 2/1985 | Philipp |
| 4,604,363 A | 8/1986 | Newhouse et al. |
| 4,608,502 A | 8/1986 | Dijkmans et al. |

(Continued)

FOREIGN PATENT DOCUMENTS

DE 19710829 A1 9/1998

(Continued)

OTHER PUBLICATIONS

USPTO U.S. Appl. No. 11/850,260: "Circuit and Method for Improving the Accuracy of a Cystal-less Oscillator Having Dual-Frequency Modes," Wright et al., filed Sep. 5, 2007; 33 pages.

(Continued)

*Primary Examiner* — Vuthe Siek

(57) ABSTRACT

A method and apparatus for configuring a microcontroller. An XML description of the microcontroller's hardware resources may be accessed. A user may select from available hardware resources and pre-defined user modules to select a configuration. Configuration information, which may include register bit patterns and microprocessor instructions, may be automatically generated. Additionally, application programming interface calls and structure, as well as interrupt vector tables may be automatically generated. Embodiments of the present invention provide improved ease of use and the ability to manage greater complexity in the configuration of configurable microcontrollers.

14 Claims, 14 Drawing Sheets

U.S. PATENT DOCUMENTS

| | | |
|---|---|---|
| 4,656,603 A | 4/1987 | Dunn |
| 4,670,838 A | 6/1987 | Kawata |
| 4,689,740 A | 8/1987 | Moelands et al. |
| 4,692,718 A | 9/1987 | Roza et al. |
| 4,701,907 A | 10/1987 | Collins |
| 4,727,541 A | 2/1988 | Mori et al. |
| 4,736,097 A | 4/1988 | Philipp |
| 4,740,966 A | 4/1988 | Goad |
| 4,755,766 A | 7/1988 | Metz |
| 4,773,024 A | 9/1988 | Faggin et al. |
| 4,794,558 A | 12/1988 | Thompson |
| 4,802,103 A | 1/1989 | Faggin et al. |
| 4,802,119 A | 1/1989 | Heene et al. |
| 4,807,183 A | 2/1989 | Kung et al. |
| 4,809,345 A | 2/1989 | Tabata et al. |
| 4,812,684 A | 3/1989 | Yamagiwa et al. |
| 4,813,013 A | 3/1989 | Dunn |
| 4,827,401 A | 5/1989 | Hrustich et al. |
| 4,831,546 A | 5/1989 | Mitsuta et al. |
| 4,833,418 A | 5/1989 | Quintus et al. |
| 4,868,525 A | 9/1989 | Dias |
| 4,876,466 A | 10/1989 | Kondou et al. |
| 4,876,534 A | 10/1989 | Mead et al. |
| 4,878,200 A | 10/1989 | Asghar et al. |
| 4,879,461 A | 11/1989 | Philipp |
| 4,879,688 A | 11/1989 | Turner et al. |
| 4,885,484 A | 12/1989 | Gray |
| 4,907,121 A | 3/1990 | Hrassky |
| 4,935,702 A | 6/1990 | Mead et al. |
| 4,939,637 A | 7/1990 | Pawloski |
| 4,942,540 A | 7/1990 | Black et al. |
| 4,947,169 A | 8/1990 | Smith et al. |
| 4,953,928 A | 9/1990 | Anderson et al. |
| 4,962,342 A | 10/1990 | Mead et al. |
| 4,964,074 A | 10/1990 | Suzuki et al. |
| 4,969,087 A | 11/1990 | Tanagawa et al. |
| 4,970,408 A | 11/1990 | Hanke et al. |
| 4,972,372 A | 11/1990 | Ueno |
| 4,977,381 A | 12/1990 | Main |
| 4,980,652 A | 12/1990 | Tarusawa et al. |
| 4,999,519 A | 3/1991 | Kitsukawa et al. |
| 5,043,674 A | 8/1991 | Bonaccio et al. |
| 5,049,758 A | 9/1991 | Mead et al. |
| 5,050,168 A | 9/1991 | Paterson |
| 5,053,949 A | 10/1991 | Allison et al. |
| 5,055,827 A | 10/1991 | Philipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,088,822 A | 2/1992 | Kanda |
| 5,095,284 A | 3/1992 | Mead |
| 5,097,305 A | 3/1992 | Mead et al. |
| 5,099,191 A | 3/1992 | Galler et al. |
| 5,107,146 A | 4/1992 | El-Ayat |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,800 A | 6/1992 | Philipp |
| 5,126,685 A | 6/1992 | Platt et al. |
| 5,127,103 A | 6/1992 | Hill et al. |
| 5,128,871 A | 7/1992 | Schmitz |
| 5,136,188 A | 8/1992 | Ha et al. |
| 5,140,197 A | 8/1992 | Grider |
| 5,142,247 A | 8/1992 | Lada et al. |
| 5,144,582 A | 9/1992 | Steele |
| 5,146,106 A | 9/1992 | Anderson et al. |
| 5,150,079 A | 9/1992 | Williams et al. |
| 5,155,836 A | 10/1992 | Jordan et al. |
| 5,159,292 A | 10/1992 | Canfield et al. |
| 5,159,335 A | 10/1992 | Veneruso |
| 5,160,899 A | 11/1992 | Anderson et al. |
| 5,161,124 A | 11/1992 | Love |
| 5,165,054 A | 11/1992 | Platt et al. |
| 5,166,562 A | 11/1992 | Allen et al. |
| 5,175,884 A | 12/1992 | Suarez |
| 5,179,531 A | 1/1993 | Yamaki |
| 5,184,061 A | 2/1993 | Lee et al. |
| 5,198,817 A | 3/1993 | Walden et al. |
| 5,200,751 A | 4/1993 | Smith |
| 5,202,687 A | 4/1993 | Distinti |
| 5,204,549 A | 4/1993 | Platt et al. |
| 5,206,582 A | 4/1993 | Ekstedt et al. |
| 5,220,512 A | 6/1993 | Watkins et al. |
| 5,225,991 A | 7/1993 | Dougherty |
| 5,230,000 A | 7/1993 | Mozingo et al. |
| 5,235,617 A | 8/1993 | Mallard, Jr. |
| 5,241,492 A | 8/1993 | Girardeau, Jr. |
| 5,243,554 A | 9/1993 | Allen et al. |
| 5,245,262 A | 9/1993 | Moody et al. |
| 5,248,843 A | 9/1993 | Billings |
| 5,248,873 A | 9/1993 | Allen et al. |
| 5,258,760 A | 11/1993 | Moody et al. |
| 5,260,592 A | 11/1993 | Mead et al. |
| 5,260,979 A | 11/1993 | Parker et al. |
| 5,270,963 A | 12/1993 | Allen et al. |
| 5,276,407 A | 1/1994 | Mead et al. |
| 5,276,890 A | 1/1994 | Arai |
| 5,280,199 A | 1/1994 | Itakura |
| 5,280,202 A | 1/1994 | Chan et al. |
| 5,289,023 A | 2/1994 | Mead |
| 5,303,329 A | 4/1994 | Mead et al. |
| 5,304,955 A | 4/1994 | Atriss et al. |
| 5,305,017 A | 4/1994 | Gerpheide |
| 5,305,312 A | 4/1994 | Fornek et al. |
| 5,307,181 A | 4/1994 | Levien |
| 5,313,618 A | 5/1994 | Pawloski |
| 5,317,202 A | 5/1994 | Waizman |
| 5,319,370 A | 6/1994 | Signore et al. |
| 5,319,771 A | 6/1994 | Takeda |
| 5,321,828 A | 6/1994 | Phillips et al. |
| 5,324,958 A | 6/1994 | Mead et al. |
| 5,325,512 A | 6/1994 | Takahashi |
| 5,329,471 A | 7/1994 | Swoboda et al. |
| 5,331,215 A | 7/1994 | Allen et al. |
| 5,331,315 A | 7/1994 | Crosette |
| 5,331,571 A | 7/1994 | Aronoff et al. |
| 5,334,952 A | 8/1994 | Maddy et al. |
| 5,335,342 A | 8/1994 | Pope et al. |
| 5,336,936 A | 8/1994 | Allen et al. |
| 5,339,213 A | 8/1994 | O'Callaghan |
| 5,339,262 A | 8/1994 | Rostoker et al. |
| 5,341,044 A | 8/1994 | Ahanin et al. |
| 5,341,267 A | 8/1994 | Whitten |
| 5,345,195 A | 9/1994 | Cordoba et al. |
| 5,349,303 A | 9/1994 | Gerpheide |
| 5,355,097 A | 10/1994 | Scott et al. |
| 5,357,626 A | 10/1994 | Johnson et al. |
| 5,361,290 A | 11/1994 | Akiyama |
| 5,371,524 A | 12/1994 | Herczeg et al. |
| 5,371,860 A | 12/1994 | Mura et al. |
| 5,371,878 A | 12/1994 | Coker |
| 5,371,883 A | 12/1994 | Gross et al. |
| 5,374,787 A | 12/1994 | Miller et al. |
| 5,377,333 A | 12/1994 | Nakagoshi et al. |
| 5,378,935 A | 1/1995 | Korhonen et al. |
| 5,381,515 A | 1/1995 | Platt et al. |
| 5,384,467 A | 1/1995 | Plimon et al. |
| 5,384,745 A | 1/1995 | Konishi et al. |
| 5,384,910 A | 1/1995 | Torres |
| 5,390,173 A | 2/1995 | Spinney et al. |
| 5,392,784 A | 2/1995 | Gudaitis |
| 5,394,522 A | 2/1995 | Sanchez-Frank et al. |
| 5,396,245 A | 3/1995 | Rempfer |
| 5,398,261 A | 3/1995 | Marbot |
| 5,399,922 A | 3/1995 | Kiani et al. |
| 5,408,194 A | 4/1995 | Steinbach et al. |
| 5,414,308 A | 5/1995 | Lee et al. |
| 5,414,380 A | 5/1995 | Floyd et al. |
| 5,416,895 A | 5/1995 | Anderson et al. |
| 5,422,823 A | 6/1995 | Agrawal et al. |
| 5,424,689 A | 6/1995 | Gillig et al. |
| 5,426,378 A | 6/1995 | Ong |
| 5,426,384 A | 6/1995 | May |
| 5,428,319 A | 6/1995 | Marvin et al. |
| 5,430,395 A | 7/1995 | Ichimaru |

| | | | | | |
|---|---|---|---|---|---|
| 5,430,687 A | 7/1995 | Hung et al. | 5,630,102 A | 5/1997 | Johnson et al. |
| 5,430,734 A | 7/1995 | Gilson | 5,631,577 A | 5/1997 | Freidin et al. |
| 5,432,476 A | 7/1995 | Tran | 5,633,766 A | 5/1997 | Hase et al. |
| 5,438,672 A | 8/1995 | Dey | 5,642,295 A | 6/1997 | Smayling |
| 5,440,305 A | 8/1995 | Signore et al. | 5,646,544 A | 7/1997 | Iadanza |
| 5,451,887 A | 9/1995 | El-Avat et al. | 5,646,901 A | 7/1997 | Sharpe-Geisler et al. |
| 5,453,904 A | 9/1995 | Higashiyama et al. | 5,648,642 A | 7/1997 | Miller et al. |
| 5,455,525 A | 10/1995 | Ho et al. | 5,651,035 A | 7/1997 | Tozun |
| 5,455,731 A | 10/1995 | Parkinson | 5,663,900 A | 9/1997 | Bhandari et al. |
| 5,455,927 A | 10/1995 | Huang | 5,663,965 A | 9/1997 | Seymour |
| 5,457,410 A | 10/1995 | Ting | 5,664,199 A | 9/1997 | Kuwahara |
| 5,457,479 A | 10/1995 | Cheng | 5,666,480 A | 9/1997 | Leung et al. |
| 5,463,591 A | 10/1995 | Aimoto et al. | 5,670,915 A | 9/1997 | Cooper et al. |
| 5,479,603 A | 12/1995 | Stone et al. | 5,673,198 A | 9/1997 | Lawman et al. |
| 5,479,643 A | 12/1995 | Bhaskar et al. | 5,675,825 A | 10/1997 | Dreyer et al. |
| 5,479,652 A | 12/1995 | Dreyer et al. | 5,677,691 A | 10/1997 | Hosticka et al. |
| 5,481,471 A | 1/1996 | Naglestad et al. | 5,680,070 A | 10/1997 | Anderson et al. |
| 5,488,204 A | 1/1996 | Mead et al. | 5,682,032 A | 10/1997 | Philipp |
| 5,491,458 A | 2/1996 | McCune | 5,684,434 A | 11/1997 | Mann et al. |
| 5,493,246 A | 2/1996 | Anderson | 5,684,952 A | 11/1997 | Stein |
| 5,493,723 A | 2/1996 | Beck et al. | 5,686,844 A | 11/1997 | Hull et al. |
| 5,495,077 A | 2/1996 | Miller et al. | 5,687,325 A | 11/1997 | Chang |
| 5,495,593 A | 2/1996 | Elmer et al. | 5,689,195 A | 11/1997 | Cliff et al. |
| 5,495,594 A | 2/1996 | MacKenna et al. | 5,689,196 A | 11/1997 | Schutte |
| 5,497,119 A | 3/1996 | Tedrow et al. | 5,691,664 A | 11/1997 | Anderson et al. |
| 5,499,192 A | 3/1996 | Knapp et al. | 5,691,898 A | 11/1997 | Rosenberg et al. |
| 5,500,823 A | 3/1996 | Martin et al. | 5,694,063 A | 12/1997 | Burlison et al. |
| 5,517,198 A | 5/1996 | McEwan | 5,696,952 A | 12/1997 | Pontarelli |
| 5,519,854 A | 5/1996 | Watt | 5,699,024 A | 12/1997 | Manlove et al. |
| 5,521,529 A | 5/1996 | Agrawal et al. | 5,703,871 A | 12/1997 | Pope et al. |
| 5,530,444 A | 6/1996 | Tice et al. | 5,706,453 A | 1/1998 | Cheng et al. |
| 5,530,673 A | 6/1996 | Tobita et al. | 5,708,589 A | 1/1998 | Beauvais |
| 5,530,813 A | 6/1996 | Paulsen et al. | 5,708,798 A | 1/1998 | Lynch et al. |
| 5,537,057 A | 7/1996 | Leong et al. | 5,710,906 A | 1/1998 | Ghosh et al. |
| 5,541,878 A | 7/1996 | LeMoncheck et al. | 5,712,969 A | 1/1998 | Zimmermann et al. |
| 5,542,055 A | 7/1996 | Amini et al. | 5,721,931 A | 2/1998 | Gephardt et al. |
| 5,543,588 A | 8/1996 | Bisset et al. | 5,724,009 A | 3/1998 | Collins et al. |
| 5,543,590 A | 8/1996 | Gillespie et al. | 5,727,170 A | 3/1998 | Mitchell et al. |
| 5,543,591 A | 8/1996 | Gillespie et al. | 5,729,704 A | 3/1998 | Stone et al. |
| 5,544,067 A | 8/1996 | Rostoker et al. | 5,730,165 A | 3/1998 | Philipp |
| 5,544,311 A | 8/1996 | Harenberg et al. | 5,732,277 A | 3/1998 | Kodosky et al. |
| 5,546,433 A | 8/1996 | Tran et al. | 5,734,272 A | 3/1998 | Belot et al. |
| 5,546,562 A | 8/1996 | Patel | 5,734,334 A | 3/1998 | Hsieh et al. |
| 5,552,725 A | 9/1996 | Ray et al. | 5,737,557 A | 4/1998 | Sullivan |
| 5,552,748 A | 9/1996 | O'Shaughnessy | 5,737,760 A | 4/1998 | Grimmer, Jr. et al. |
| 5,554,951 A | 9/1996 | Gough | 5,745,011 A | 4/1998 | Scott |
| 5,555,452 A | 9/1996 | Callaway et al. | 5,748,048 A | 5/1998 | Moyal |
| 5,555,907 A | 9/1996 | Philipp | 5,748,875 A | 5/1998 | Tzori |
| 5,557,762 A | 9/1996 | Okuaki et al. | 5,752,013 A | 5/1998 | Christensen et al. |
| 5,559,502 A | 9/1996 | Schutte | 5,754,552 A | 5/1998 | Allmond et al. |
| 5,559,996 A | 9/1996 | Fujioka et al. | 5,754,826 A | 5/1998 | Gamal et al. |
| 5,563,526 A | 10/1996 | Hastings et al. | 5,757,368 A | 5/1998 | Gerpheide et al. |
| 5,563,529 A | 10/1996 | Seltzer et al. | 5,758,058 A | 5/1998 | Milburn |
| 5,564,010 A | 10/1996 | Henry et al. | 5,761,128 A | 6/1998 | Watanabe |
| 5,564,108 A | 10/1996 | Hunsaker et al. | 5,763,909 A | 6/1998 | Mead et al. |
| 5,565,658 A | 10/1996 | Gerpheide et al. | 5,764,714 A | 6/1998 | Stansell et al. |
| 5,566,702 A | 10/1996 | Philipp | 5,767,457 A | 6/1998 | Gerpheide et al. |
| 5,572,665 A | 11/1996 | Nakabayashi | 5,774,704 A | 6/1998 | Williams |
| 5,572,719 A | 11/1996 | Biesterfeldt | 5,777,399 A | 7/1998 | Shibuya |
| 5,574,678 A | 11/1996 | Gorecki | 5,781,030 A | 7/1998 | Agrawal et al. |
| 5,574,852 A | 11/1996 | Bakker et al. | 5,781,747 A | 7/1998 | Smith et al. |
| 5,574,892 A | 11/1996 | Christensen | 5,784,545 A | 7/1998 | Anderson et al. |
| 5,579,353 A | 11/1996 | Parmenter et al. | 5,790,957 A | 8/1998 | Heidari |
| 5,587,945 A | 12/1996 | Lin et al. | 5,796,183 A | 8/1998 | Hourmand |
| 5,587,957 A | 12/1996 | Kowalczyk et al. | 5,799,176 A | 8/1998 | Kapusta et al. |
| 5,590,354 A | 12/1996 | Klapproth et al. | 5,802,073 A | 9/1998 | Platt |
| 5,594,388 A | 1/1997 | O'Shaughnessy et al. | 5,802,290 A | 9/1998 | Casselman |
| 5,594,734 A | 1/1997 | Worsley et al. | 5,805,792 A | 9/1998 | Swoboda et al. |
| 5,594,876 A | 1/1997 | Getzlaff et al. | 5,805,897 A | 9/1998 | Glowny |
| 5,594,890 A | 1/1997 | Yamaura et al. | 5,808,883 A | 9/1998 | Hawkes |
| 5,600,262 A | 2/1997 | Kolze | 5,811,987 A | 9/1998 | Ashmore, Jr. et al. |
| 5,604,466 A | 2/1997 | Dreps et al. | 5,812,698 A | 9/1998 | Platt et al. |
| 5,608,892 A | 3/1997 | Wakerly | 5,818,254 A | 10/1998 | Agrawal et al. |
| 5,614,861 A | 3/1997 | Harada | 5,818,444 A | 10/1998 | Alimpich et al. |
| 5,625,316 A | 4/1997 | Chambers et al. | 5,819,028 A | 10/1998 | Manghirmalani et al. |
| 5,629,857 A | 5/1997 | Brennan | 5,822,387 A | 10/1998 | Mar |
| 5,629,891 A | 5/1997 | LeMoncheck et al. | 5,822,531 A | 10/1998 | Gorczyca et al. |
| 5,630,052 A | 5/1997 | Shah | 5,828,693 A | 10/1998 | Mays et al. |
| 5,630,057 A | 5/1997 | Hait | 5,838,583 A | 11/1998 | Varadarajan et al. |

| | | | | | | |
|---|---|---|---|---|---|---|
| 5,841,078 A | 11/1998 | Miller et al. | | 5,969,513 A | 10/1999 | Clark |
| 5,841,996 A | 11/1998 | Nolan et al. | | 5,969,632 A | 10/1999 | Diamant et al. |
| 5,844,265 A | 12/1998 | Mead et al. | | 5,973,368 A | 10/1999 | Pearce et al. |
| 5,844,404 A | 12/1998 | Caser et al. | | 5,974,235 A | 10/1999 | Nunally et al. |
| 5,848,285 A | 12/1998 | Kapusta et al. | | 5,977,791 A | 11/1999 | Veenstra |
| 5,850,156 A | 12/1998 | Wittman | | 5,978,584 A | 11/1999 | Nishibata et al. |
| 5,852,733 A | 12/1998 | Chien et al. | | 5,978,937 A | 11/1999 | Miyamori et al. |
| 5,854,625 A | 12/1998 | Frisch et al. | | 5,982,105 A | 11/1999 | Masters |
| 5,857,109 A | 1/1999 | Taylor | | 5,982,229 A | 11/1999 | Wong et al. |
| 5,861,583 A | 1/1999 | Schediwy et al. | | 5,982,241 A | 11/1999 | Nguyen et al. |
| 5,861,875 A | 1/1999 | Gerpheide | | 5,983,277 A | 11/1999 | Heile et al. |
| 5,864,242 A | 1/1999 | Allen et al. | | 5,986,479 A | 11/1999 | Mohan |
| 5,864,392 A | 1/1999 | Winklhofer et al. | | 5,987,246 A | 11/1999 | Thomsen et al. |
| 5,867,046 A | 2/1999 | Sugasawa | | 5,988,902 A | 11/1999 | Holehan |
| 5,867,399 A | 2/1999 | Rostoker et al. | | 5,994,939 A | 11/1999 | Johnson et al. |
| 5,869,979 A | 2/1999 | Bocchino | | 5,996,032 A | 11/1999 | Baker |
| 5,870,004 A | 2/1999 | Lu | | 5,999,725 A | 12/1999 | Barbier et al. |
| 5,870,309 A | 2/1999 | Lawman | | 6,002,268 A | 12/1999 | Sasaki et al. |
| 5,870,345 A | 2/1999 | Stecker | | 6,002,398 A | 12/1999 | Wilson |
| 5,872,464 A | 2/1999 | Gradinariu | | 6,003,054 A | 12/1999 | Oshima et al. |
| 5,874,958 A | 2/1999 | Ludolph | | 6,003,107 A | 12/1999 | Ranson et al. |
| 5,875,293 A | 2/1999 | Bell et al. | | 6,003,133 A | 12/1999 | Moughanni et al. |
| 5,877,656 A | 3/1999 | Mann et al. | | 6,005,814 A | 12/1999 | Mulholland et al. |
| 5,878,425 A | 3/1999 | Redpath | | 6,005,904 A | 12/1999 | Knapp et al. |
| 5,880,411 A | 3/1999 | Gillespie et al. | | 6,008,685 A | 12/1999 | Kunst |
| 5,880,598 A | 3/1999 | Duong | | 6,008,703 A | 12/1999 | Perrott et al. |
| 5,883,623 A | 3/1999 | Cseri | | 6,009,270 A | 12/1999 | Mann |
| 5,886,582 A | 3/1999 | Stansell | | 6,009,496 A | 12/1999 | Tsai |
| 5,887,189 A | 3/1999 | Birns et al. | | 6,011,407 A | 1/2000 | New |
| 5,889,236 A | 3/1999 | Gillespie et al. | | 6,012,835 A | 1/2000 | Thompson et al. |
| 5,889,723 A | 3/1999 | Pascucci | | 6,014,135 A | 1/2000 | Fernandes |
| 5,889,936 A | 3/1999 | Chan | | 6,014,509 A | 1/2000 | Furtek et al. |
| 5,889,988 A | 3/1999 | Held | | 6,014,723 A | 1/2000 | Tremblay et al. |
| 5,894,226 A | 4/1999 | Koyama | | 6,016,554 A | 1/2000 | Skrovan et al. |
| 5,894,243 A | 4/1999 | Hwang | | 6,016,563 A | 1/2000 | Fleisher |
| 5,894,565 A | 4/1999 | Furtek et al. | | 6,018,559 A | 1/2000 | Azegami et al. |
| 5,895,494 A | 4/1999 | Scalzi et al. | | 6,023,422 A | 2/2000 | Allen et al. |
| 5,896,068 A | 4/1999 | Moyal | | 6,023,565 A | 2/2000 | Lawman et al. |
| 5,896,330 A | 4/1999 | Gibson | | 6,026,134 A | 2/2000 | Duffy et al. |
| 5,898,345 A | 4/1999 | Namura et al. | | 6,026,501 A | 2/2000 | Hohl et al. |
| 5,900,780 A | 5/1999 | Hirose et al. | | 6,028,271 A | 2/2000 | Gillespie et al. |
| 5,901,062 A | 5/1999 | Burch et al. | | 6,028,959 A | 2/2000 | Wang et al. |
| 5,903,718 A | 5/1999 | Marik | | 6,031,365 A | 2/2000 | Sharpe-Geisler |
| 5,905,398 A | 5/1999 | Todsen et al. | | 6,032,268 A | 2/2000 | Swoboda et al. |
| 5,909,544 A | 6/1999 | Anderson, II et al. | | 6,034,538 A | 3/2000 | Abramovici |
| 5,911,059 A | 6/1999 | Profit, Jr. | | 6,037,807 A | 3/2000 | Wu et al. |
| 5,914,465 A | 6/1999 | Allen et al. | | 6,038,551 A | 3/2000 | Barlow et al. |
| 5,914,633 A | 6/1999 | Comino et al. | | 6,041,406 A | 3/2000 | Mann |
| 5,914,708 A | 6/1999 | LaGrange et al. | | 6,043,695 A | 3/2000 | O'Sullivan |
| 5,917,356 A | 6/1999 | Casal et al. | | 6,043,719 A | 3/2000 | Lin et al. |
| 5,920,310 A | 7/1999 | Faggin et al. | | 6,049,223 A | 4/2000 | Lytle et al. |
| 5,923,264 A | 7/1999 | Lavelle et al. | | 6,049,225 A | 4/2000 | Huang et al. |
| 5,926,566 A | 7/1999 | Wang et al. | | 6,051,772 A | 4/2000 | Cameron et al. |
| 5,929,710 A | 7/1999 | Bien | | 6,052,035 A | 4/2000 | Nolan et al. |
| 5,930,148 A | 7/1999 | Bjorksten et al. | | 6,052,524 A | 4/2000 | Pauna |
| 5,930,150 A | 7/1999 | Cohen et al. | | 6,055,584 A | 4/2000 | Bridges et al. |
| 5,931,959 A | 8/1999 | Kwiat | | 6,057,705 A | 5/2000 | Wojewoda et al. |
| 5,933,023 A | 8/1999 | Young | | 6,058,263 A | 5/2000 | Voth |
| 5,933,356 A | 8/1999 | Rostoker et al. | | 6,058,452 A | 5/2000 | Rangasayee et al. |
| 5,933,816 A | 8/1999 | Zeanah et al. | | 6,061,511 A | 5/2000 | Marantz et al. |
| 5,935,233 A | 8/1999 | Jeddeloh | | 6,066,961 A | 5/2000 | Lee et al. |
| 5,935,266 A | 8/1999 | Thurnhofer et al. | | 6,070,003 A | 5/2000 | Gove et al. |
| 5,939,904 A | 8/1999 | Fetterman et al. | | 6,072,803 A | 6/2000 | Allmond et al. |
| 5,939,949 A | 8/1999 | Olgaard et al. | | 6,075,941 A | 6/2000 | Itoh et al. |
| 5,941,991 A | 8/1999 | Kageshima | | 6,079,985 A | 6/2000 | Wohl et al. |
| 5,942,733 A | 8/1999 | Allen et al. | | 6,081,140 A | 6/2000 | King |
| 5,943,052 A | 8/1999 | Allen et al. | | 6,094,730 A | 7/2000 | Lopez et al. |
| 5,945,878 A | 8/1999 | Westwick et al. | | 6,097,211 A | 8/2000 | Couts-Martin et al. |
| 5,949,632 A | 9/1999 | Barreras, Sr. et al. | | 6,097,432 A | 8/2000 | Mead et al. |
| 5,952,888 A | 9/1999 | Scott | | 6,101,457 A | 8/2000 | Barch et al. |
| 5,956,279 A | 9/1999 | Mo et al. | | 6,101,617 A | 8/2000 | Burckhartt et al. |
| 5,959,871 A | 9/1999 | Pierzchala et al. | | 6,104,217 A | 8/2000 | Magana |
| 5,963,075 A | 10/1999 | Hiiragizawa | | 6,104,325 A | 8/2000 | Liaw et al. |
| 5,963,105 A | 10/1999 | Nguyen | | 6,107,769 A | 8/2000 | Saylor et al. |
| 5,963,503 A | 10/1999 | Lee | | 6,107,826 A | 8/2000 | Young et al. |
| 5,964,893 A | 10/1999 | Circello et al. | | 6,107,882 A | 8/2000 | Gabara et al. |
| 5,966,027 A | 10/1999 | Kapusta et al. | | 6,110,223 A | 8/2000 | Southgate et al. |
| 5,966,532 A | 10/1999 | McDonald et al. | | 6,111,431 A | 8/2000 | Estrada |
| 5,968,135 A | 10/1999 | Teramoto et al. | | 6,112,264 A | 8/2000 | Beasley et al. |

| Patent | Kind | Date | Inventor |
|---|---|---|---|
| 6,121,791 | A | 9/2000 | Abbott |
| 6,121,805 | A | 9/2000 | Thamsirianunt et al. |
| 6,121,965 | A | 9/2000 | Kenney et al. |
| 6,125,416 | A | 9/2000 | Warren |
| 6,130,548 | A | 10/2000 | Koifman |
| 6,130,551 | A | 10/2000 | Agrawal et al. |
| 6,130,552 | A | 10/2000 | Jefferson et al. |
| 6,133,773 | A | 10/2000 | Garlepp et al. |
| 6,134,181 | A | 10/2000 | Landry |
| 6,134,516 | A | 10/2000 | Wang et al. |
| 6,137,308 | A | 10/2000 | Nayak |
| 6,140,853 | A | 10/2000 | Lo |
| 6,141,376 | A | 10/2000 | Shaw |
| 6,141,764 | A | 10/2000 | Ezell |
| 6,144,327 | A | 11/2000 | Distinti et al. |
| 6,148,104 | A | 11/2000 | Wang et al. |
| 6,148,441 | A | 11/2000 | Woodward |
| 6,149,299 | A | 11/2000 | Aslan et al. |
| 6,150,866 | A | 11/2000 | Eto et al. |
| 6,154,064 | A | 11/2000 | Proebsting |
| 6,157,024 | A | 12/2000 | Chapdelaine et al. |
| 6,157,270 | A | 12/2000 | Tso |
| 6,161,199 | A | 12/2000 | Szeto et al. |
| 6,166,367 | A | 12/2000 | Cho |
| 6,166,960 | A | 12/2000 | Marneweck et al. |
| 6,167,077 | A | 12/2000 | Ducaroir |
| 6,167,559 | A | 12/2000 | Furtek et al. |
| 6,169,383 | B1 | 1/2001 | Johnson |
| 6,172,571 | B1 | 1/2001 | Moyal |
| 6,173,419 | B1 | 1/2001 | Barnett |
| 6,175,914 | B1 | 1/2001 | Mann |
| 6,175,949 | B1 | 1/2001 | Gristede et al. |
| 6,181,163 | B1 | 1/2001 | Agrawal et al. |
| 6,183,131 | B1 | 2/2001 | Holloway et al. |
| 6,185,127 | B1 | 2/2001 | Myers et al. |
| 6,185,450 | B1 | 2/2001 | Seguine et al. |
| 6,185,522 | B1 | 2/2001 | Bakker |
| 6,185,703 | B1 | 2/2001 | Guddat et al. |
| 6,185,732 | B1 | 2/2001 | Mann et al. |
| 6,188,228 | B1 | 2/2001 | Philipp |
| 6,188,241 | B1 | 2/2001 | Gauthier et al. |
| 6,188,381 | B1 | 2/2001 | van der Wal et al. |
| 6,188,391 | B1 | 2/2001 | Seely et al. |
| 6,188,975 | B1 | 2/2001 | Gay |
| 6,191,603 | B1 | 2/2001 | Muradali et al. |
| 6,191,660 | B1 | 2/2001 | Mar et al. |
| 6,191,998 | B1 | 2/2001 | Reddy et al. |
| 6,192,431 | B1 | 2/2001 | Dabral et al. |
| 6,198,303 | B1 | 3/2001 | Rangasayee |
| 6,201,407 | B1 | 3/2001 | Kapusta et al. |
| 6,201,829 | B1 | 3/2001 | Schneider |
| 6,202,044 | B1 | 3/2001 | Tzori |
| 6,204,687 | B1 | 3/2001 | Schultz et al. |
| 6,205,574 | B1 | 3/2001 | Dellinger et al. |
| 6,208,572 | B1 | 3/2001 | Adams et al. |
| 6,211,708 | B1 | 4/2001 | Klemmer |
| 6,211,715 | B1 | 4/2001 | Terauchi |
| 6,211,741 | B1 | 4/2001 | Dalmia |
| 6,215,352 | B1 | 4/2001 | Sudo |
| 6,219,729 | B1 | 4/2001 | Keats et al. |
| 6,222,528 | B1 | 4/2001 | Gerpheide et al. |
| 6,223,144 | B1 | 4/2001 | Barnett et al. |
| 6,223,147 | B1 | 4/2001 | Bowers |
| 6,223,272 | B1 | 4/2001 | Coehlo et al. |
| RE37,195 | E | 5/2001 | Kean |
| 6,225,866 | B1 | 5/2001 | Kubota et al. |
| 6,236,242 | B1 | 5/2001 | Hedberg |
| 6,236,275 | B1 | 5/2001 | Dent |
| 6,236,278 | B1 | 5/2001 | Olgaard |
| 6,236,593 | B1 | 5/2001 | Hong et al. |
| 6,239,389 | B1 | 5/2001 | Allen et al. |
| 6,239,798 | B1 | 5/2001 | Ludolph et al. |
| 6,240,375 | B1 | 5/2001 | Sonoda |
| 6,246,258 | B1 | 6/2001 | Lesea |
| 6,246,410 | B1 | 6/2001 | Bergeron et al. |
| 6,249,167 | B1 | 6/2001 | Oguchi et al. |
| 6,249,447 | B1 | 6/2001 | Boylan et al. |
| 6,253,250 | B1 | 6/2001 | Evans et al. |
| 6,253,754 | B1 | 7/2001 | Ward |
| 6,262,717 | B1 | 7/2001 | Donohue et al. |
| 6,263,302 | B1 | 7/2001 | Hellestrand et al. |
| 6,263,339 | B1 | 7/2001 | Hirsch |
| 6,263,484 | B1 | 7/2001 | Yang |
| 6,271,679 | B1 | 8/2001 | McClintock et al. |
| 6,272,646 | B1 | 8/2001 | Rangasayee |
| 6,275,117 | B1 | 8/2001 | Abugharbieh et al. |
| 6,278,568 | B1 | 8/2001 | Cloke et al. |
| 6,280,391 | B1 | 8/2001 | Olson et al. |
| 6,281,753 | B1 | 8/2001 | Corsi et al. |
| 6,282,547 | B1 | 8/2001 | Hirsch |
| 6,282,551 | B1 | 8/2001 | Anderson et al. |
| 6,286,127 | B1 | 9/2001 | King et al. |
| 6,288,707 | B1 | 9/2001 | Philipp |
| 6,289,300 | B1 | 9/2001 | Brannick et al. |
| 6,289,478 | B1 | 9/2001 | Kitagaki |
| 6,289,489 | B1 | 9/2001 | Bold et al. |
| 6,292,028 | B1 | 9/2001 | Tomita |
| 6,294,932 | B1 | 9/2001 | Watarai |
| 6,294,962 | B1 | 9/2001 | Mar |
| 6,298,320 | B1 | 10/2001 | Buckmaster et al. |
| 6,304,014 | B1 | 10/2001 | England et al. |
| 6,304,101 | B1 | 10/2001 | Nishihara |
| 6,304,790 | B1 | 10/2001 | Nakamura et al. |
| 6,307,413 | B1 | 10/2001 | Dalmia et al. |
| 6,310,521 | B1 | 10/2001 | Dalmia |
| 6,310,611 | B1 | 10/2001 | Caldwell |
| 6,311,149 | B1 | 10/2001 | Ryan et al. |
| 6,314,530 | B1 | 11/2001 | Mann |
| 6,320,184 | B1 | 11/2001 | Winklhofer et al. |
| 6,320,282 | B1 | 11/2001 | Caldwell |
| 6,321,369 | B1 | 11/2001 | Heile et al. |
| 6,323,846 | B1 | 11/2001 | Westerman et al. |
| 6,324,628 | B1 | 11/2001 | Chan |
| 6,324,672 | B1 * | 11/2001 | Lawman et al. ................. 716/1 |
| 6,326,859 | B1 | 12/2001 | Goldman et al. |
| 6,332,137 | B1 | 12/2001 | Hori et al. |
| 6,332,201 | B1 | 12/2001 | Chin et al. |
| 6,337,579 | B1 | 1/2002 | Mochida |
| 6,338,109 | B1 | 1/2002 | Snyder et al. |
| 6,339,815 | B1 | 1/2002 | Feng et al. |
| 6,342,907 | B1 | 1/2002 | Petty et al. |
| 6,345,383 | B1 | 2/2002 | Ueki |
| 6,347,395 | B1 | 2/2002 | Payne et al. |
| 6,351,789 | B1 | 2/2002 | Green |
| 6,353,452 | B1 | 3/2002 | Hamada et al. |
| 6,355,980 | B1 | 3/2002 | Callahan |
| 6,356,862 | B2 | 3/2002 | Bailey |
| 6,356,958 | B1 | 3/2002 | Lin |
| 6,356,960 | B1 | 3/2002 | Jones et al. |
| 6,359,950 | B2 | 3/2002 | Gossmann et al. |
| 6,362,697 | B1 | 3/2002 | Pulvirenti |
| 6,363,463 | B1 * | 3/2002 | Mattison ...................... 711/164 |
| 6,366,174 | B1 | 4/2002 | Berry et al. |
| 6,366,300 | B1 | 4/2002 | Ohara et al. |
| 6,366,874 | B1 | 4/2002 | Lee et al. |
| 6,366,878 | B1 | 4/2002 | Grunert |
| 6,369,660 | B1 | 4/2002 | Wei |
| 6,371,878 | B1 | 4/2002 | Bowen |
| 6,373,954 | B1 | 4/2002 | Malcolm, Jr. et al. |
| 6,374,370 | B1 | 4/2002 | Bockhaus et al. |
| 6,377,009 | B1 | 4/2002 | Philipp |
| 6,377,575 | B1 | 4/2002 | Mullaney et al. |
| 6,377,646 | B1 | 4/2002 | Sha |
| 6,380,811 | B1 | 4/2002 | Zarubinsky et al. |
| 6,380,929 | B1 | 4/2002 | Platt |
| 6,380,931 | B1 | 4/2002 | Gillespie et al. |
| 6,384,947 | B1 | 5/2002 | Ackerman et al. |
| 6,385,742 | B1 | 5/2002 | Kirsch et al. |
| 6,388,109 | B1 | 5/2002 | Schwarz et al. |
| 6,388,464 | B1 | 5/2002 | Lacey et al. |
| 6,396,302 | B2 | 5/2002 | New et al. |
| 6,396,657 | B1 | 5/2002 | Suzuki |
| 6,397,232 | B1 | 5/2002 | Cheng-Hung et al. |
| 6,404,204 | B1 | 6/2002 | Farruggia et al. |
| 6,404,445 | B1 | 6/2002 | Galea et al. |
| 6,407,953 | B1 | 6/2002 | Cleeves |
| 6,408,432 | B1 | 6/2002 | Herrmann et al. |
| 6,411,665 | B1 | 6/2002 | Chan et al. |

| | | | | | | |
|---|---|---|---|---|---|---|
| 6,411,974 B1 | 6/2002 | Graham et al. | | 6,574,590 B1 | 6/2003 | Kershaw et al. |
| 6,414,671 B1 | 7/2002 | Gillespie et al. | | 6,574,739 B1 | 6/2003 | Kung et al. |
| 6,421,698 B1 | 7/2002 | Hong | | 6,575,373 B1 | 6/2003 | Nakano |
| 6,425,109 B1 | 7/2002 | Choukalos et al. | | 6,577,258 B2 | 6/2003 | Ruha et al. |
| 6,429,882 B1 | 8/2002 | Abdelnur et al. | | 6,578,174 B2 | 6/2003 | Zizzo |
| 6,430,305 B1 | 8/2002 | Decker | | 6,580,329 B2 | 6/2003 | Sander |
| 6,433,645 B1 | 8/2002 | Mann et al. | | 6,581,191 B1 | 6/2003 | Schubert et al. |
| 6,434,187 B1 | 8/2002 | Beard | | 6,587,093 B1 | 7/2003 | Shaw et al. |
| 6,437,805 B1 | 8/2002 | Sojoodi et al. | | 6,587,995 B1 | 7/2003 | Duboc et al. |
| 6,438,565 B1 | 8/2002 | Ammirato et al. | | 6,588,004 B1 | 7/2003 | Southgate et al. |
| 6,438,735 B1 | 8/2002 | McElvain et al. | | 6,590,422 B1 | 7/2003 | Dillon |
| 6,438,738 B1 | 8/2002 | Elayda | | 6,590,517 B1 | 7/2003 | Swanson |
| 6,441,073 B1 | 8/2002 | Tanaka et al. | | 6,591,369 B1 | 7/2003 | Edwards et al. |
| 6,445,211 B1 | 9/2002 | Saripella | | 6,592,626 B1 | 7/2003 | Bauchot et al. |
| 6,449,628 B1 | 9/2002 | Wasson | | 6,594,799 B1 | 7/2003 | Robertson et al. |
| 6,449,755 B1 | 9/2002 | Beausang et al. | | 6,597,212 B1 | 7/2003 | Wang et al. |
| 6,449,761 B1 | 9/2002 | Greidinger et al. | | 6,597,824 B2 | 7/2003 | Newberg et al. |
| 6,452,437 B1 | 9/2002 | Takeuchi et al. | | 6,598,178 B1 | 7/2003 | Yee et al. |
| 6,452,514 B1 | 9/2002 | Philipp | | 6,600,346 B1 | 7/2003 | Macaluso |
| 6,453,175 B2 | 9/2002 | Mizell et al. | | 6,600,351 B2 | 7/2003 | Bisanti et al. |
| 6,453,461 B1 | 9/2002 | Chaiken | | 6,600,575 B1 | 7/2003 | Kohara |
| 6,456,304 B1 | 9/2002 | Angiulo et al. | | 6,601,189 B1 | 7/2003 | Edwards et al. |
| 6,457,355 B1 | 10/2002 | Philipp | | 6,601,236 B1 | 7/2003 | Curtis |
| 6,457,479 B1 | 10/2002 | Zhuang et al. | | 6,603,330 B1 | 8/2003 | Snyder |
| 6,460,172 B1 | 10/2002 | Insenser Farre et al. ........ 716/17 | | 6,603,348 B1 | 8/2003 | Preuss et al. |
| 6,463,488 B1 | 10/2002 | San Juan | | 6,604,179 B2 | 8/2003 | Volk et al. |
| 6,466,036 B1 | 10/2002 | Philipp | | 6,606,731 B1 | 8/2003 | Baum et al. |
| 6,466,078 B1 | 10/2002 | Stiff | | 6,608,472 B1 | 8/2003 | Kutz et al. |
| 6,466,898 B1 | 10/2002 | Chan | | 6,610,936 B2 | 8/2003 | Gillespie et al. |
| 6,473,069 B1 | 10/2002 | Gerpheide | | 6,611,220 B1 | 8/2003 | Snyder |
| 6,473,825 B1 | 10/2002 | Worley et al. | | 6,611,276 B1 | 8/2003 | Muratori et al. |
| 6,477,691 B1 | 11/2002 | Bergamashi/Rab et al. | | 6,611,856 B1 | 8/2003 | Liao et al. |
| 6,480,921 B1 | 11/2002 | Mansoorian et al. | | 6,611,952 B1 | 8/2003 | Prakash et al. |
| 6,483,343 B1 | 11/2002 | Faith et al. | | 6,613,098 B1 | 9/2003 | Sorge et al. |
| 6,487,700 B1 | 11/2002 | Fukushima | | 6,614,260 B1 | 9/2003 | Welch et al. |
| 6,489,899 B1 | 12/2002 | Ely et al. | | 6,614,320 B1 | 9/2003 | Sullam et al. |
| 6,490,213 B1 | 12/2002 | Mu et al. | | 6,614,374 B1 | 9/2003 | Gustavsson et al. |
| 6,492,834 B1 | 12/2002 | Lytle et al. | | 6,614,458 B1 | 9/2003 | Lambert et al. |
| 6,496,971 B1 | 12/2002 | Lesea et al. | | 6,615,167 B1 | 9/2003 | Herzl et al. |
| 6,498,720 B2 | 12/2002 | Glad | | 6,617,888 B2 | 9/2003 | Volk |
| 6,499,134 B1 | 12/2002 | Buffet et al. | | 6,618,854 B1 | 9/2003 | Mann |
| 6,499,359 B1 | 12/2002 | Washeleski et al. | | 6,621,356 B2 | 9/2003 | Gotz et al. |
| 6,504,403 B2 | 1/2003 | Bangs et al. | | 6,624,640 B2 | 9/2003 | Lund et al. |
| 6,507,214 B1 | 1/2003 | Snyder | | 6,625,765 B1 | 9/2003 | Krishnan |
| 6,507,215 B1 | 1/2003 | Piasecki et al. | | 6,628,163 B2 | 9/2003 | Dathe et al. |
| 6,507,857 B1 | 1/2003 | Yalcinalp | | 6,628,311 B1 | 9/2003 | Fang |
| 6,509,758 B2 | 1/2003 | Piasecki et al. | | 6,631,508 B1 | 10/2003 | Williams |
| 6,512,395 B1 | 1/2003 | Lacey et al. | | 6,634,008 B1 | 10/2003 | Dole |
| 6,516,428 B2 | 2/2003 | Wenzel et al. | | 6,636,096 B2 | 10/2003 | Schaffer et al. |
| 6,522,128 B1 | 2/2003 | Ely et al. | | 6,637,015 B1 | 10/2003 | Ogami et al. |
| 6,523,416 B2 | 2/2003 | Takagi et al. | | 6,639,586 B2 | 10/2003 | Gerpheide |
| 6,525,593 B1 | 2/2003 | Mar | | 6,642,857 B1 | 11/2003 | Schediwy et al. |
| 6,526,556 B1 | 2/2003 | Stoica et al. | | 6,643,151 B1 | 11/2003 | Nebrigic et al. |
| 6,529,791 B1 | 3/2003 | Takagi | | 6,643,810 B2 | 11/2003 | Whetsel |
| 6,530,065 B1 | 3/2003 | McDonald et al. | | 6,649,924 B1 | 11/2003 | Philipp et al. |
| 6,534,970 B1 | 3/2003 | Ely et al. | | 6,650,581 B2 | 11/2003 | Hong et al. |
| 6,535,061 B2 | 3/2003 | Darmawaskita et al. | | 6,658,498 B1 | 12/2003 | Carney et al. |
| 6,535,200 B2 | 3/2003 | Philipp | | 6,658,633 B2 | 12/2003 | Devins et al. |
| 6,535,946 B1 | 3/2003 | Bryant et al. | | 6,661,288 B2 | 12/2003 | Morgan et al. |
| 6,536,028 B1 | 3/2003 | Katsioulas et al. | | 6,661,410 B2 | 12/2003 | Casebolt et al. |
| 6,539,534 B1 | 3/2003 | Bennett | | 6,661,724 B1 | 12/2003 | Snyder et al. |
| 6,542,025 B1 | 4/2003 | Kutz et al. | | 6,664,978 B1 | 12/2003 | Kekic et al. |
| 6,542,844 B1 | 4/2003 | Hanna | | 6,664,991 B1 | 12/2003 | Chew et al. |
| 6,542,845 B1 | 4/2003 | Grucci et al. | | 6,667,642 B1 | 12/2003 | Moyal |
| 6,552,933 B2 | 4/2003 | Roohparvar | | 6,667,740 B2 | 12/2003 | Ely et al. |
| 6,553,057 B1 | 4/2003 | Sha | | 6,670,852 B1 | 12/2003 | Hauck |
| 6,554,469 B1 | 4/2003 | Thomson et al. | | 6,673,308 B2 | 1/2004 | Hino et al. |
| 6,557,164 B1 | 4/2003 | Faustini | | 6,677,814 B2 | 1/2004 | Low et al. |
| 6,559,685 B2 | 5/2003 | Green | | 6,677,932 B1 | 1/2004 | Westerman |
| 6,560,306 B1 | 5/2003 | Duffy et al. | | 6,678,645 B1 | 1/2004 | Rajsuman et al. |
| 6,560,699 B1 | 5/2003 | Konkle | | 6,678,877 B1 | 1/2004 | Perry et al. |
| 6,563,391 B1 | 5/2003 | Mar | | 6,680,632 B1 | 1/2004 | Meyers et al. |
| 6,564,179 B1 | 5/2003 | Belhaj | | 6,680,731 B2 | 1/2004 | Gerpheide et al. |
| 6,566,961 B2 | 5/2003 | Dasgupta et al. | | 6,681,280 B1 | 1/2004 | Miyake et al. |
| 6,567,426 B1 | 5/2003 | van Hook et al. | | 6,681,359 B1 | 1/2004 | Au et al. |
| 6,567,932 B2 | 5/2003 | Edwards et al. | | 6,683,462 B2 | 1/2004 | Shimizu |
| 6,570,557 B1 | 5/2003 | Westerman et al. | | 6,683,930 B1 | 1/2004 | Dalmia |
| 6,571,331 B2 | 5/2003 | Henry et al. | | 6,686,787 B2 | 2/2004 | Ling |
| 6,571,373 B1 | 5/2003 | Devins et al. | | 6,686,860 B2 | 2/2004 | Gulati et al. |

| Patent | Kind | Date | Inventor |
|---|---|---|---|
| 6,690,224 | B1 | 2/2004 | Moore |
| 6,691,193 | B1 | 2/2004 | Wang et al. |
| 6,691,301 | B2 | 2/2004 | Bowen |
| 6,697,754 | B1 | 2/2004 | Alexander |
| 6,701,340 | B1 | 3/2004 | Gorecki |
| 6,701,487 | B1 | 3/2004 | Ogami et al. |
| 6,701,508 | B1 | 3/2004 | Bartz et al. |
| 6,704,381 | B1 | 3/2004 | Moyal et al. |
| 6,704,879 | B1 | 3/2004 | Parrish |
| 6,704,889 | B2 | 3/2004 | Herrmann et al. |
| 6,704,893 | B1 | 3/2004 | Bauwens et al. |
| 6,705,511 | B1 | 3/2004 | Dames et al. |
| 6,711,226 | B1 | 3/2004 | Williams et al. |
| 6,711,731 | B2 | 3/2004 | Weiss |
| 6,713,897 | B2 | 3/2004 | Caldwell |
| 6,714,066 | B2 | 3/2004 | Gorecki et al. |
| 6,714,817 | B2 | 3/2004 | Daynes et al. |
| 6,715,132 | B1 | 3/2004 | Bartz et al. |
| 6,717,474 | B2 | 4/2004 | Chen et al. |
| 6,718,294 | B1 | 4/2004 | Bortfeld |
| 6,718,520 | B1 | 4/2004 | Lautzenheiser et al. |
| 6,718,533 | B1 | 4/2004 | Schneider et al. |
| 6,724,220 | B1 | 4/2004 | Snyder et al. |
| 6,728,900 | B1 | 4/2004 | Meli |
| 6,728,902 | B2 | 4/2004 | Kaiser et al. |
| 6,730,863 | B1 | 5/2004 | Gerpheide |
| 6,731,552 | B2 | 5/2004 | Perner |
| 6,732,068 | B2 | 5/2004 | Bauer et al. |
| 6,732,347 | B1 | 5/2004 | Bixler et al. |
| 6,738,858 | B1 | 5/2004 | Fernald et al. |
| 6,744,323 | B1 | 6/2004 | Moyal et al. |
| 6,748,569 | B1 | 6/2004 | Brooke et al. |
| 6,750,852 | B2 | 6/2004 | Gillespie |
| 6,750,889 | B1 | 6/2004 | Livingston et al. |
| 6,754,101 | B2 | 6/2004 | Terzioglu et al. |
| 6,754,723 | B2 | 6/2004 | Kato |
| 6,754,765 | B1 | 6/2004 | Chang et al. |
| 6,754,849 | B2 | 6/2004 | Tamura |
| 6,757,882 | B2 | 6/2004 | Chen et al. |
| 6,765,407 | B1 | 7/2004 | Snyder |
| 6,768,337 | B2 | 7/2004 | Kohno et al. |
| 6,768,352 | B1 | 7/2004 | Maher et al. |
| 6,769,622 | B1 | 8/2004 | Tournemille et al. |
| 6,771,552 | B2 | 8/2004 | Fujisawa |
| 6,774,644 | B2 | 8/2004 | Eberlein |
| 6,781,456 | B2 | 8/2004 | Pradhan |
| 6,782,068 | B1 | 8/2004 | Wilson et al. |
| 6,784,821 | B1 | 8/2004 | Lee |
| 6,785,881 | B1 | 8/2004 | Bartz et al. |
| 6,788,116 | B1 | 9/2004 | Cook et al. |
| 6,788,221 | B1 | 9/2004 | Ely et al. |
| 6,788,521 | B2 | 9/2004 | Nishi |
| 6,791,377 | B2 | 9/2004 | Ilchmann et al. |
| 6,792,584 | B1 | 9/2004 | Eneboe et al. |
| 6,798,218 | B2 | 9/2004 | Kasperkovitz |
| 6,798,299 | B1 | 9/2004 | Mar et al. |
| 6,799,198 | B1 | 9/2004 | Huboi et al. |
| 6,806,771 | B1 | 10/2004 | Hildebrant et al. |
| 6,806,782 | B2 | 10/2004 | Motoyoshi et al. |
| 6,809,275 | B1 | 10/2004 | Cheng et al. |
| 6,809,566 | B1 | 10/2004 | Xin-LeBlanc |
| 6,810,442 | B1 | 10/2004 | Lin et al. |
| 6,815,979 | B2 | 11/2004 | Ooshita |
| 6,816,544 | B1 | 11/2004 | Bailey et al. |
| 6,817,005 | B2 | 11/2004 | Mason et al. |
| 6,819,142 | B2 | 11/2004 | Viehmann et al. |
| 6,823,282 | B1 | 11/2004 | Snyder |
| 6,823,497 | B2 | 11/2004 | Schubert et al. |
| 6,825,689 | B1 | 11/2004 | Snyder |
| 6,825,869 | B2 | 11/2004 | Bang |
| 6,828,824 | B2 | 12/2004 | Betz et al. |
| 6,829,727 | B1 | 12/2004 | Pawloski |
| 6,834,384 | B2 | 12/2004 | Fiorella, II et al. |
| 6,836,169 | B2 | 12/2004 | Richmond et al. |
| 6,839,774 | B1 | 1/2005 | Ahn et al. |
| 6,842,710 | B1 | 1/2005 | Gehring et al. |
| 6,847,203 | B1 | 1/2005 | Conti et al. |
| 6,850,117 | B2 | 2/2005 | Weber et al. |
| 6,850,554 | B1 | 2/2005 | Sha et al. |
| 6,853,598 | B2 | 2/2005 | Chevallier |
| 6,854,067 | B1 | 2/2005 | Kutz et al. |
| 6,856,433 | B2 | 2/2005 | Hatano et al. |
| 6,859,884 | B1 | 2/2005 | Sullam |
| 6,862,240 | B2 | 3/2005 | Burgan |
| 6,864,710 | B1 | 3/2005 | Lacey et al. |
| 6,865,429 | B1 | 3/2005 | Schneider et al. |
| 6,865,504 | B2 | 3/2005 | Larson et al. |
| 6,868,500 | B1 | 3/2005 | Kutz et al. |
| 6,871,253 | B2 | 3/2005 | Greeff et al. |
| 6,871,331 | B1 | 3/2005 | Bloom et al. |
| 6,873,203 | B1 | 3/2005 | Latham, II et al. |
| 6,873,210 | B2 | 3/2005 | Mulder et al. |
| 6,876,941 | B2 | 4/2005 | Nightingale |
| 6,880,086 | B2 | 4/2005 | Kidder et al. |
| 6,888,453 | B2 | 5/2005 | Lutz et al. |
| 6,888,538 | B2 | 5/2005 | Ely et al. |
| 6,892,310 | B1 | 5/2005 | Kutz et al. |
| 6,892,322 | B1 | 5/2005 | Snyder |
| 6,893,724 | B2 | 5/2005 | Lin et al. |
| 6,894,928 | B2 | 5/2005 | Owen |
| 6,897,390 | B2 | 5/2005 | Caldwell et al. |
| 6,898,703 | B1 | 5/2005 | Ogami et al. |
| 6,900,663 | B1 | 5/2005 | Roper et al. |
| 6,901,563 | B1 | 5/2005 | Ogami et al. |
| 6,903,402 | B2 | 6/2005 | Miyazawa |
| 6,903,613 | B1 | 6/2005 | Mitchell et al. |
| 6,904,570 | B2 | 6/2005 | Foote et al. |
| 6,910,126 | B1 | 6/2005 | Mar et al. |
| 6,911,857 | B1 | 6/2005 | Stiff |
| 6,917,661 | B1 | 7/2005 | Scott et al. |
| 6,922,821 | B1 | 7/2005 | Nemecek |
| 6,924,668 | B2 | 8/2005 | Muller et al. |
| 6,934,674 | B1 | 8/2005 | Douezy et al. |
| 6,937,075 | B2 | 8/2005 | Lim et al. |
| 6,940,356 | B2 | 9/2005 | McDonald et al. |
| 6,941,336 | B1 | 9/2005 | Mar |
| 6,941,538 | B2 | 9/2005 | Hwang et al. |
| 6,944,018 | B2 | 9/2005 | Caldwell |
| 6,949,811 | B2 | 9/2005 | Miyazawa |
| 6,949,984 | B2 | 9/2005 | Siniscalchi |
| 6,950,954 | B1 | 9/2005 | Sullam et al. |
| 6,950,990 | B2 | 9/2005 | Rajarajan et al. |
| 6,952,778 | B1 | 10/2005 | Snyder |
| 6,954,511 | B2 | 10/2005 | Tachimori |
| 6,954,904 | B2 | 10/2005 | White |
| 6,956,419 | B1 | 10/2005 | Mann et al. |
| 6,957,180 | B1 | 10/2005 | Nemecek |
| 6,957,242 | B1 | 10/2005 | Snyder |
| 6,963,233 | B2 | 11/2005 | Puccio et al. |
| 6,963,908 | B1 | 11/2005 | Lynch et al. |
| 6,966,039 | B1 | 11/2005 | Bartz et al. |
| 6,967,511 | B1 | 11/2005 | Sullam |
| 6,967,960 | B1 | 11/2005 | Bross et al. |
| 6,968,346 | B2 | 11/2005 | Hekmatpour |
| 6,969,978 | B2 | 11/2005 | Dening |
| 6,970,844 | B1 | 11/2005 | Bierenbaum |
| 6,971,004 | B1 | 11/2005 | Pleis et al. |
| 6,973,400 | B2 | 12/2005 | Cahill-O'Brien et al. |
| 6,975,123 | B1 | 12/2005 | Malang et al. |
| 6,980,060 | B2 | 12/2005 | Boerstler et al. |
| 6,981,090 | B1 | 12/2005 | Kutz et al. |
| 6,988,192 | B2 | 1/2006 | Snider |
| 6,996,799 | B1 | 2/2006 | Cismas et al. |
| 7,005,933 | B1 | 2/2006 | Shutt |
| 7,009,444 | B1 | 3/2006 | Scott |
| 7,010,773 | B1 | 3/2006 | Bartz et al. |
| 7,015,735 | B2 | 3/2006 | Kimura et al. |
| 7,017,145 | B2 | 3/2006 | Taylor |
| 7,017,409 | B2 | 3/2006 | Zielinski et al. |
| 7,020,854 | B2 | 3/2006 | Killian et al. |
| 7,023,215 | B2 | 4/2006 | Steenwyk |
| 7,023,257 | B1 | 4/2006 | Sullam |
| 7,024,636 | B2 | 4/2006 | Weed |
| 7,024,654 | B2 | 4/2006 | Bersch et al. |
| 7,026,861 | B2 | 4/2006 | Steenwyk |
| 7,030,513 | B2 | 4/2006 | Caldwell |
| 7,030,656 | B2 | 4/2006 | Lo et al. |
| 7,030,688 | B2 | 4/2006 | Dosho et al. |

| | | | |
|---|---|---|---|
| 7,030,782 B2 | 4/2006 | Ely et al. | |
| 7,034,603 B2 | 4/2006 | Brady et al. | |
| 7,042,301 B2 | 5/2006 | Sutardja | |
| 7,047,166 B2 | 5/2006 | Dancea | |
| 7,055,035 B2 | 5/2006 | Allison et al. | |
| 7,058,921 B1 | 6/2006 | Hwang et al. | |
| 7,073,158 B2 | 7/2006 | McCubbrey | |
| 7,076,420 B1 | 7/2006 | Snyder et al. | |
| 7,079,166 B1 | 7/2006 | Hong | |
| 7,086,014 B1 | 8/2006 | Bartz et al. | |
| 7,088,166 B1 | 8/2006 | Reinschmidt et al. | |
| 7,089,175 B1 | 8/2006 | Nemecek et al. | |
| 7,091,713 B2 | 8/2006 | Erdelyi et al. | |
| 7,092,980 B1 | 8/2006 | Mar et al. | |
| 7,098,414 B2 | 8/2006 | Caldwell | |
| 7,099,818 B1 | 8/2006 | Nemecek | |
| 7,103,108 B1 | 9/2006 | Beard | |
| 7,109,978 B2 | 9/2006 | Gillespie et al. | |
| 7,117,485 B2 | 10/2006 | Wilkinson et al. | |
| 7,119,550 B2 | 10/2006 | Kitano et al. | |
| 7,119,602 B2 | 10/2006 | Davis | |
| 7,124,376 B2 | 10/2006 | Zaidi et al. | |
| 7,127,630 B1 | 10/2006 | Snyder | |
| 7,129,793 B2 | 10/2006 | Gramegna | |
| 7,129,873 B2 | 10/2006 | Kawamura | |
| 7,132,835 B1 | 11/2006 | Arcus | |
| 7,133,140 B2 | 11/2006 | Lukacs et al. | |
| 7,133,793 B2 | 11/2006 | Ely et al. | |
| 7,138,841 B1 | 11/2006 | Li et al. | |
| 7,138,868 B2 | 11/2006 | Sanchez et al. | |
| 7,139,530 B2 | 11/2006 | Kusbel | |
| 7,141,968 B2 | 11/2006 | Hibbs et al. | |
| 7,141,987 B2 | 11/2006 | Hibbs et al. | |
| 7,149,316 B1 | 12/2006 | Kutz et al. | |
| 7,150,002 B1 | 12/2006 | Anderson et al. | |
| 7,151,528 B2 | 12/2006 | Taylor et al. | |
| 7,152,027 B2 | 12/2006 | Andrade et al. | |
| 7,154,294 B2 | 12/2006 | Liu et al. | |
| 7,161,936 B1 | 1/2007 | Barrass et al. | |
| 7,162,410 B1 | 1/2007 | Nemecek et al. | |
| 7,171,455 B1 | 1/2007 | Gupta et al. | |
| 7,176,701 B2 | 2/2007 | Wachi et al. | |
| 7,178,096 B2 | 2/2007 | Rangan et al. | |
| 7,180,342 B1 | 2/2007 | Shutt et al. | |
| 7,185,162 B1 | 2/2007 | Snyder | |
| 7,185,321 B1 | 2/2007 | Roe et al. | |
| 7,188,063 B1 | 3/2007 | Snyder | |
| 7,193,901 B2 | 3/2007 | Ruby et al. | |
| 7,200,507 B2 | 4/2007 | Chen et al. | |
| 7,206,733 B1 | 4/2007 | Nemecek | |
| 7,212,189 B2 | 5/2007 | Shaw et al | |
| 7,221,187 B1 | 5/2007 | Snyder et al. | |
| 7,227,389 B2 | 6/2007 | Gong et al. | |
| 7,236,921 B1 | 6/2007 | Nemecek et al. | |
| 7,250,825 B2 | 7/2007 | Wilson et al. | |
| 7,256,588 B2 | 8/2007 | Howard et al. | |
| 7,265,633 B1 | 9/2007 | Stiff | |
| 7,266,768 B2 | 9/2007 | Ferlitsch et al. | |
| 7,281,846 B2 | 10/2007 | McLeod | |
| 7,282,905 B2 | 10/2007 | Chen et al. | |
| 7,283,151 B2 | 10/2007 | Nihei et al. | |
| 7,287,112 B1 | 10/2007 | Pleis et al. | |
| 7,288,977 B2 | 10/2007 | Stanley | |
| 7,290,244 B2 | 10/2007 | Peck et al. | |
| 7,295,049 B1 | 11/2007 | Moyal et al. | |
| 7,298,124 B2 | 11/2007 | Kan et al. | |
| 7,301,835 B2 | 11/2007 | Joshi et al. | |
| 7,305,510 B2 | 12/2007 | Miller | |
| 7,307,485 B1 | 12/2007 | Snyder et al. | |
| 7,308,608 B1 | 12/2007 | Pleis et al. | |
| 7,312,616 B2 | 12/2007 | Snyder | |
| 7,323,879 B2 | 1/2008 | Kuo et al. | |
| 7,332,976 B1 | 2/2008 | Brennan | |
| 7,342,405 B2 | 3/2008 | Eldridge et al. | |
| 7,358,714 B2 | 4/2008 | Watanabe et al. | |
| 7,367,017 B2 | 4/2008 | Maddocks et al. | |
| 7,373,437 B2 | 5/2008 | Seigneret et al. | |
| 7,376,001 B2 | 5/2008 | Joshi et al. | |
| 7,376,904 B2 | 5/2008 | Cifra et al. | |
| 7,386,740 B2 | 6/2008 | Kutz et al. | |
| 7,400,183 B1 | 7/2008 | Sivadasan et al. | |
| 7,406,674 B1 | 7/2008 | Ogami et al. | |
| 7,421,251 B2 | 9/2008 | Westwick et al. | |
| 7,466,307 B2 | 12/2008 | Trent, Jr. et al. | |
| 7,542,533 B2 | 6/2009 | Jasa et al. | |
| 7,554,847 B2 | 6/2009 | Lee | |
| 7,616,509 B2 | 11/2009 | Qureshi et al. | |
| 2001/0002129 A1 | 5/2001 | Zimmerman et al. | |
| 2001/0010083 A1 | 7/2001 | Satoh | |
| 2001/0038392 A1 | 11/2001 | Humpleman et al. | |
| 2001/0043081 A1 | 11/2001 | Rees | |
| 2001/0044927 A1 | 11/2001 | Karniewicz | |
| 2001/0045861 A1 | 11/2001 | Bloodworth et al. | |
| 2001/0047509 A1 | 11/2001 | Mason et al. | |
| 2002/0007467 A1* | 1/2002 | Ma et al. | 713/501 |
| 2002/0010716 A1 | 1/2002 | McCartney et al. | |
| 2002/0016706 A1 | 2/2002 | Cooke et al. | |
| 2002/0023110 A1 | 2/2002 | Fortin et al. | |
| 2002/0042696 A1 | 4/2002 | Garcia et al. | |
| 2002/0052729 A1 | 5/2002 | Kyung et al. | |
| 2002/0059543 A1 | 5/2002 | Cheng et al. | |
| 2002/0063688 A1 | 5/2002 | Shaw et al. | |
| 2002/0065646 A1 | 5/2002 | Waldie et al. | |
| 2002/0068989 A1 | 6/2002 | Ebisawa et al. | |
| 2002/0073119 A1 | 6/2002 | Richard | |
| 2002/0073380 A1 | 6/2002 | Cooke et al. | |
| 2002/0080186 A1 | 6/2002 | Frederiksen | |
| 2002/0085020 A1 | 7/2002 | Carroll, Jr. | |
| 2002/0099863 A1 | 7/2002 | Comeau et al. | |
| 2002/0109722 A1 | 8/2002 | Rogers et al. | |
| 2002/0116168 A1 | 8/2002 | Kim | |
| 2002/0121679 A1 | 9/2002 | Bazarjani et al. | |
| 2002/0122060 A1 | 9/2002 | Markel | |
| 2002/0129334 A1 | 9/2002 | Dane et al. | |
| 2002/0133771 A1 | 9/2002 | Barnett | |
| 2002/0133794 A1 | 9/2002 | Kanapathippillai et al. | |
| 2002/0138516 A1 | 9/2002 | Igra | |
| 2002/0144099 A1 | 10/2002 | Muro, Jr. et al. | |
| 2002/0145433 A1 | 10/2002 | Morrise et al. | |
| 2002/0152234 A1 | 10/2002 | Estrada et al. | |
| 2002/0152449 A1 | 10/2002 | Lin | |
| 2002/0156885 A1 | 10/2002 | Thakkar | |
| 2002/0156998 A1 | 10/2002 | Casselman | |
| 2002/0161802 A1 | 10/2002 | Gabrick et al. | |
| 2002/0166100 A1 | 11/2002 | Meding | |
| 2002/0174134 A1 | 11/2002 | Goykhman | |
| 2002/0174411 A1 | 11/2002 | Feng et al. | |
| 2002/0191029 A1 | 12/2002 | Gillespie et al. | |
| 2003/0011639 A1 | 1/2003 | Webb | |
| 2003/0014447 A1 | 1/2003 | White | |
| 2003/0025734 A1 | 2/2003 | Boose et al. | |
| 2003/0033588 A1* | 2/2003 | Alexander | 717/107 |
| 2003/0041235 A1 | 2/2003 | Meyer | |
| 2003/0056071 A1 | 3/2003 | Triece et al. | |
| 2003/0058469 A1 | 3/2003 | Buis et al. | |
| 2003/0061409 A1* | 3/2003 | RuDusky | 710/8 |
| 2003/0061572 A1 | 3/2003 | McClannahan et al. | |
| 2003/0062889 A1 | 4/2003 | Ely et al. | |
| 2003/0066057 A1* | 4/2003 | RuDusky | 717/140 |
| 2003/0080755 A1 | 5/2003 | Kobayashi | |
| 2003/0097640 A1 | 5/2003 | Abrams et al. | |
| 2003/0105620 A1 | 6/2003 | Bowen | |
| 2003/0126947 A1 | 7/2003 | Margaria | |
| 2003/0135842 A1 | 7/2003 | Frey et al. | |
| 2003/0149961 A1 | 8/2003 | Kawai et al. | |
| 2003/0229482 A1 | 12/2003 | Cook et al. | |
| 2004/0018711 A1 | 1/2004 | Madurawe | |
| 2004/0054821 A1 | 3/2004 | Warren et al. | |
| 2004/0153802 A1 | 8/2004 | Kudo et al. | |
| 2004/0205553 A1 | 10/2004 | Hall et al. | |
| 2004/0205617 A1 | 10/2004 | Light | |
| 2004/0205695 A1 | 10/2004 | Fletcher | |
| 2005/0024341 A1 | 2/2005 | Gillespie et al. | |
| 2005/0066152 A1 | 3/2005 | Garey | |
| 2005/0143968 A9 | 6/2005 | Odom et al. | |
| 2005/0240917 A1 | 10/2005 | Wu | |
| 2005/0248534 A1 | 11/2005 | Kehlstadt | |
| 2005/0280453 A1 | 12/2005 | Hsieh | |

| | | | |
|---|---|---|---|
| 2006/0015862 | A1 | 1/2006 | Odom et al. |
| 2006/0031768 | A1 | 2/2006 | Shah et al. |
| 2006/0032680 | A1 | 2/2006 | Elias et al. |
| 2006/0097991 | A1 | 5/2006 | Hotelling et al. |
| 2006/0273804 | A1 | 12/2006 | Delorme et al. |
| 2007/0139074 | A1 | 6/2007 | Reblewski |
| 2007/0258458 | A1 | 11/2007 | Kapoor |
| 2008/0095213 | A1 | 4/2008 | Lin et al. |
| 2008/0186052 | A1 | 8/2008 | Needham et al. |
| 2008/0259998 | A1 | 10/2008 | Venkataraman et al. |
| 2008/0294806 | A1 | 11/2008 | Swindle et al. |
| 2009/0066427 | A1 | 3/2009 | Brennan |
| 2009/0322305 | A1 | 12/2009 | De Cremoux |

FOREIGN PATENT DOCUMENTS

| | | |
|---|---|---|
| EP | 0308583 A2 | 3/1989 |
| EP | 368398 A1 | 5/1990 |
| EP | 04508632 A | 10/1991 |
| EP | 404083405 A1 | 3/1992 |
| EP | 0499383 A2 | 8/1992 |
| EP | 0639816 A2 | 2/1995 |
| EP | 1170671 A1 | 1/2002 |
| EP | 1205848 A1 | 5/2002 |
| EP | 1191423 A2 | 2/2003 |
| JP | 405055842 A1 | 3/1993 |
| JP | 06021732 A1 | 1/1994 |
| JP | 404095408 A1 | 3/2002 |
| WO | 9532478 A1 | 11/1995 |
| WO | PCT/US96/17305 A1 | 6/1996 |
| WO | PCT/US98/34376 A1 | 8/1998 |
| WO | PCT/US99/09712 A1 | 2/1999 |

OTHER PUBLICATIONS

USPTO Non-Final Rejection for U.S. Appl. No. 11/850,260 dated Mar. 6, 2009; 7 pages.
USPTO Non-Final Rejection for U.S. Appl. No. 11/644,100 dated Mar. 9, 2009; 11 pages.
USPTO Advisory Action for U.S. Appl. No. 11/644,100 dated Feb. 9, 2009; 3 pages.
USPTO Final Rejection for U.S. Appl. No. 11/644,100 dated Nov. 18, 2008; 12 pages.
USPTO Non-Final Rejection for U.S. Appl. No. 11/644,100 dated Apr. 14, 2008; 10 pages.
USPTO Notice of Allowance for U.S. Appl. No. 11/415,588 dated Mar. 11, 2008; 6 pages.
USPTO Advisory Action for U.S. Appl. No. 11/415,588 dated Jan. 14, 2008; 3 pages.
USPTO Final Rejection for U.S. Appl. No. 11/415,588 dated Oct. 19, 2007; 8 pages.
USPTO Non-Final Rejection for U.S. Appl. No. 11/415,588 dated Jun. 13, 2007; 8 pages.
USPTO Notice of Allowance for U.S. Appl. No. 12/218,404 dated Mar. 19, 2009; 7 pages.
USPTO Non-Final Rejection for U.S. Appl. No. 12/218,404 dated Sep. 30, 2008; 8 pages.
USPTO U.S. Appl. No. 11/644,100: "Differential-to-single ended signal converter circuit and method," Jonathon Stiff, filed Dec. 21, 2006; 33 pages.
USPTO U.S. Appl. No. 11/415,588: "Voltage Controlled Oscillator Delay Cell and Method," Sivadasan et al., filed May 1, 2006; 24 pages.
USPTO U.S. Appl. No. 12/218,404: "Voltage Controlled Oscillator Delay Cell and Method," Sivadasan et al., filed Jul. 14, 2008; 23 pages.
USPTO Notice of Allowance for U.S. Appl. No. 11/132,894 dated Apr. 26, 2007; 4 pages.
USPTO Non-Final Rejection for U.S. Appl. No. 11/132,894 dated Dec. 19, 2006; 12 pages.
USPTO U.S. Appl. No. 11/132,894: "Open Loop Bandwidth Test Architecture and Method for Phase Locked Loop (PLL)," Jonathon Stiff, filed May 19, 2005; 38 pages.
USPTO Non-Final Rejection for U.S. Appl. No. 11/322,044 dated May 4, 2009; 18 pages.
USPTO Non-Final Rejection for U.S. Appl. No. 11/322,044 dated Nov. 25, 2008; 15 pages.
USPTO Non-Final Rejection for U.S. Appl. No. 11/322,044 dated Apr. 11, 2008; 11 pages.
USPTO Advisory Action for U.S. Appl. No. 11/322,044 dated Nov. 30, 2007; 2 pages.
USPTO Final Rejection for U.S. Appl. No. 11/322,044 dated Sep. 21, 2007; 14 pages.
USPTO Non-Final Rejection for U.S. Appl. No. 11/322,044 dated Apr. 24, 2007; 13 pages.
USPTO U.S. Appl. No. 11/322,044: "Split charge pump PLL architecture," Jonathon Stiff, filed Dec. 28, 2005; 19 pages.
USPTO Notice of Allowance for U.S. Appl. No. 10/305,589 dated Feb. 4, 2005; 5 pages.
USPTO Final Rejection for U.S. Appl. No. 10/305,589 dated Oct. 21, 2004; 7 pages.
USPTO Non-Final Rejection for U.S. Appl. No. 10/305,589 dated Oct. 7, 2003; 6 pages.
USPTO U.S. Appl. No. 10/305,589: "Current Controlled Delay Circuit," Jonathon Stiff, filed Nov. 26, 2002; 18 pages.
USPTO U.S. Appl. No. 09/849,164: "Reduced Static Phase Error CMOS PLL Charge Pump," Jonathon Stiff, filed May 4, 2001; 30 pages.
Maneats "Low-Jitter Pocess-Inependen DLL and PLL Based on Self-Based Technique" IEEE Journal of Solid-State Circuits, vol. 31, No. 11, Nov. 1996; 10 pages.
Larsson, "A 2-1600-MHz CMOS Clock Recovery PLL with Low-V dd Capability," IEEE Journal of Solid-State Circuits, vol. 34, No. 12, Dec. 1999; 10 pages.
USPTO Notice of Allowance for U.S. Appl. No. 10/327,217 dated Aug. 12, 2004; 6 pages.
USPTO Non-Final Rejection for U.S. Appl. No. 10/327,217 dated Apr. 30, 2004; 5 pages.
USPTO Miscellaneous Action for U.S. Appl. No. 10/327,217 dated Feb. 10, 2004; 1 page.
USPTO U.S. Appl. No. 10/327,217: "Single Ended Clock Signal Generator Having a Differential Output," Richmond et al., filed Dec. 20, 2002; 27 pages.
USPTO Notice of Allowance for U.S. Appl. No. 10/871,582 dated Mar. 30, 2006; 6 pages.
USPTO Final Rejection for U.S. Appl. No. 10/871,582 dated Feb. 1, 2006; 5 pages.
USPTO Non-Final Rejection for U.S. Appl. No. 10/871,582 dated Sep. 7, 2005; 7 pages.
USPTO U.S. Appl. No. 10/871,582: "LVDS Input Circuit with Extended Common Mode Range," Reinschmidt et al., filed Jun. 17, 2004; 25 pages.
USPTO Notice of Allowance for U.S. Appl. No. 09/404,891 dated Mar. 4, 2005; 6 pages.
USPTO Final Rejection for U.S. Appl. No. 09/404,891 dated Dec. 8, 2004; 7 pages.
USPTO Non-Final Rejection for U.S. Appl. No. 09/404,891 dated Jun. 25, 2004; 6 pages.
USPTO Non-Final Rejection for U.S. Appl. No. 09/404,891 dated Jan. 5, 2004; 5 pages.
USPTO Non-Final Rejection for U.S. Appl. No. 09/404,891 dated Jul. 10, 2003; 6 pages.
USPTO Non-Final Rejection for U.S. Appl. No. 09/404,891 dated Mar. 5, 2003; 6 pages.
USPTO Non-Final Rejection for U.S. Appl. No. 09/404,891 dated Oct. 11, 2002; 5 pages.
USPTO U.S. Appl. No. 09/404,891: "Method, Architecture and Circuitry for Controlling Pulse Width in a Phase and/or Frequency Detector," Scott et al., filed Sep. 24, 1999; 17 pages.
USPTO Notice of Allowance for U.S. Appl. No. 10/226,911 dated Aug. 20, 2004; 4 pages.
USPTO Non-Final Rejection for U.S. Appl. No. 10/226,911 dated Mar. 19, 2004; 6 pages.
USPTO U.S. Appl. No. 10/226,911: "Calibration of Integrated Circuit Time Constants," Gehring et al.; filed Aug. 22, 2002; 32 pages.
USPTO Notice of Allowance for U.S. Appl. No. 09/943,149 dated Jan. 12, 2004; 7 pages.

USPTO Non-Final Rejection for U.S. Appl. No. 09/943,149 dated Aug. 28, 2003; 9 pages.
USPTO Final Rejection for U.S. Appl. No. 09/943,149 dated May 7, 2003; 10 pages.
USPTO Non-Final Rejection for U.S. Appl. No. 09/943,149 dated Nov. 20, 2002; 7 pages.
USPTO U.S. Appl. No. 09/943,149: "Method for Phase Locking in a Phase Lock Loop," Moyal et al., filed Aug. 30, 2001; 21 pages.
Durham et al., "Integrated Continuous-Time Balanced Filters for 16-bit DSP Interfaces," IEEE, 1993; 6 pages.
Durham et al., "Circuit Architectures for High Linearity Monolithic Continuous-Time Filtering," IEEE, 1992; 7 pages.
Durham et al., "High-Linearity Conitnuous-Time Filter in 5-V VLSI CMOS," IEEE, 1992; 8 pages.
USPTO U.S. Appl. No. 09/047,595: "Roving Range Control to Limit Receive PLL Frequency of Operation," Paul H. Scott, filed Mar. 29, 1998; 35 pages.
USPTO U.S. Appl. No. 09/216,460: "Circuit and Method for Controlling an Output of a Ring Oscillator," Abugharbieh et al., filed Dec. 18, 1998; 21 pages.
USPTO U.S. Appl. No. 09/471,914: "Reference-Free Clock Generator and Data Recovery PLL," Dalmia et al., filed Dec. 23, 1999; 32 pages.
USPTO U.S. Appl. No. 09/471,576: "Reference-Free Clock Generation and Data Recovery PLL," Kamal Dalmia, filed Dec. 23, 1999; 30 pages.
USPTO U.S. Appl. No. 10/083,442: "Method/Architecture for a Low Gain PLL with Wide Frequency Range,"Meyers et al., filed Feb. 26, 2002; 28 pages.
USPTO U.S. Appl. No. 09/470,665: "Digital Phase/Frequency Detector, and Clock Generator and Data Recovery Pll Containing the Same," Kamal Dalrnia, filed Dec. 23, 1999; 26 pages.
USPTO U.S. Appl. No. 09/893,161: "Architecture of a PLL with Dynamic Frequency Control on a PLD," Michael T. Moore, filed Jun. 27, 2001; 32 pages.
USPTO U.S. Appl. No. 09/608,753: "PLL Lockout Watchdog," Wilson et al., filed Aug. 24, 2004; 24 pages.
USPTO U.S. Appl. No. 09/398,956: "Frequency Acquisition Rate Control in Phase Lock Loop Circuits," Moyal et al., filed Sep. 17, 1999; 35 pages.
USPTO U.S. Appl. No. 09/747,262: "Linearized Digital Phase-Locked Loop," Williams et al., filed Dec. 22, 2000; 9 pages.
USPTO U.S. Appl. No. 09/981,448: "Oscillator Tuning Method," Lane T. Hauck, filed Oct. 17, 2001; 28 pages.
USPTO U.S. Appl. No. 09/538,989: "Memory Based Phase Locked Loop," Rengarajan S. Krishnan, filed on Mar. 30, 2000; 27 pages.
USPTO U.S. Appl. No. 09/048,905: "Programmable Clock Generator," Mann et al., filed Mar. 26, 1998; 42 pages.
USPTO U.S. Appl. No. 08/865,342: "Programmable clock Generator," Mann et al., filed May 29, 1997; 41 pages.
USPTO Notice of Allowance for U.S. Appl. No. 10/293,392 dated Mar. 10, 2004; 6 pages.
USPTO Non-Final Rejection for U.S. Appl. No. 10/293,392 dated Oct. 16, 2003; 6 pages.
USPTO U.S. Appl. No. 10/293,392: "Low Voltage Receiver Circuit and Method for Shifting the Differential Input Signals of the Receiver Depending on a Common Mode Voltage of the Input Signals," Maher et al., filed Nov. 13, 2002; 20 pages.
USPTO Notice of Allowance for U.S. Appl. No. 10/288,003 dated Jan. 14, 2005; 6 pages.
USPTO Final Rejection for U.S. Appl. No. 10/288,003 dated Oct. 6, 2004; 6 pages.
USPTO Non-Final Rejection for U.S. Appl. No. 10/288,003 dated Apr. 7, 2004; 9 pages.
USPTO U.S. Appl. No. 10/288,003: "Low Voltage Differential Signal Driver Circuit and Method," Roper et al., filed Nov. 4, 2002; 30 pages.
USPTO Notice of Allowance for U.S. Appl. No. 09/989,777 dated Mar. 9, 2009; 7 pages.
USPTO Advisory Action for U.S. Appl. No. 11/200,619 dated May 11, 2009; 3 pages.
USPTO Final Rejection for U.S. Appl. No. 11/200,619 dated Mar. 3, 2009; 14 pages.
USPTO Non-Final Rejection for U.S. Appl. No. 11/200,619 dated Aug. 27, 2008; 13 pages.
USPTO U.S. Appl. No. 11/200,619; "Providing hardware independence to automate code generation of processing device firmware," Snyder et al., filed Aug. 10, 2005; 41 pages.
USPTO Notice of Allowance for U.S. Appl. No. 11/201,922 dated Apr. 9, 2009; 4 pages.
USPTO Non-Final Rejection for U.S. Appl. No. 11/201,922 dated Oct. 21, 2008; 12 pages.
USPTO Final Rejection for U.S. Appl. No. 11/201,922 dated Apr. 30, 2008; 10 pages.
USPTO Non-Final Rejection for U.S. Appl. No. 11/201,922 dated Oct. 15, 2007; 10 pages.
USPTO U.S. Appl. No. 11/201,922: "Design model for a hardware device-independent method of defining embedded firmware for programmable systems," McDonald et al., filed on Aug. 10, 2005; 31 pages.
USPTO Non-Final Rejection for U.S. Appl. No. 11/201,627 dated Dec. 12, 2008; 17 pages.
USPTO Final Rejection for U.S. Appl. No. 11/201,627 dated Apr. 29, 2008; 21 pages.
USPTO Non-Final Rejection for U.S. Appl. No. 11/201,627 dated Nov. 16, 2007; 16 pages.
USPTO U.S. Appl. No. 11/201,627: "Method and an apparatus to design a processing system using a graphical user interface." Ogami et al., filed Aug. 10, 2005; 37 pages.
USPTO Notice of Allowance for U.S. Appl. No. 09/989,808 dated Feb. 13, 2006; 4 pages.
USPTO Non-Final Rejection for U.S. Appl. No. 09/989,808 dated Oct. 19, 2005; 8 pages.
USPTO Non-Final Rejection for U.S. Appl. No. 09/989,808 dated Apr. 14, 2005; 8 pages.
USPTO U.S. Appl. No. 09/989,808: "Automatic generation of application program interfaces, source code, interrupts, and data sheets for microcontroller programming," Bartz et al., filed Nov. 19, 2001; 67 pages.
USPTO Notice of Allowance for U.S. Appl. No. 10/109,979 dated Mar. 14, 2006; 6 pages.
USPTO Non-Final Rejection for U.S. Appl. No. 10/109,979 dated Jun. 30, 2005; 6 pages.
USPTO U.S. Appl. No. 10/109,979: "Graphical user interface with logic unifying functions," Anderson et al., filed Mar. 29, 2002; 100 pages.
USPTO U.S. Appl. No. 09/989,781 "System and mehod for decoupling and terating resources associated with a module," Ogami et al., file Nov. 19, 2001; 40 pages.
USPTO U.S. Appl. No. 09/989,775: "User defined names for registers in memory banks derived from configurations," Ogami et al., filed on Nov. 19, 2001; 29 pages.
USPTO Notice of Allowance for U.S. Appl. No. 09/989,819 dated Jan. 11, 2005; 7 pages.
USPTO Non-Final Rejection for U.S. Appl. No. 09/989,819 dated Jul. 13, 2004; 4 pages.
USPTO Miscellaneous Action for U.S. Appl. No. 09/989,819 dated Dec. 14, 2001; 1 page.
USPTO U.S Appl. No. 09/989,819: "System and method for creating a boot file utilizing a boot template," Ogami et al., filed Nov. 19, 2001; 43 pages.
USPTO Notice of Allowance for U.S. Appl. No. 09/989,761 dated Jan. 14, 2005; 6 pages.
USPTO Final Rejection for U.S. Appl. No. 09/989,761 dated Aug. 26, 2004; 7 pages.
USPTO Non-Final Rejection for U.S. Appl. No. 09/989,761 dated Mar. 10, 2004; 6 pages.
USPTO Final Rejection for U.S. Appl. No. 09/989,761 dated Oct. 3, 2003; 7 pages.
USPTO Non-Final Rejection for U.S. Appl. No. 09/989,761 dated Apr. 18, 2003; 5 pages.
USPTO U.S. Appl. No. 09/989,761: "Storing of global parameter defaults and using them over two or more design projects," Ogami et al., filed Nov. 19, 2001; 37 pages.
Wang, et al. "Synthesizing Operating System Based Device Drivers in Embedded Systems," Oct. 1-3, 2003; ACM; 8 pages.

Lutovac et al. "Symbolic Computation of Digital Filter Transfer Function Using MATLAB," Proceedings of 23rd International Conference on Microelectronics (MIEL 2002), vol. 2 NIS, Yugoslavia; 4 pages.

Nouta et al. "Design and FPGA-Implementation of Wave Digital Bandpass Filters with Arbitrary Amplitude Transfer Characteristics," Proceedings of IEEE International Symposium on Industrial Electronics; 1998, vol. 2; 5 pages.

Xilinx, Virtex-II Pro Platform FPGA Developer's Kit, "How Data2BRAM Fits in with Hardware and Software Flows," Chapter 2: Using Data2BRAM; Jan. 2003 Release; 2 pages, PCT Preliminary Report on Patentability (Chapter 1 of the Patent Cooperation Treaty), PCT/US2005/028793, filed Aug. 12, 2005, mailed Dec. 21, 2007; 2 pages.

PCT Written Opnon of the International Seaching Authority for PCT/US2005028793 fied Aug. 12, 2005 mailed Nov. 19, 2007; 7 pages.

PCT International Search Report of the International Searching Authority for PCT/US05/28793, filed Aug. 12, 2005, mailed Nov. 19, 2007; 5 pages.

International Search Report and Written Opinion of the International Searching Authority for PCT/US05/28898, filed Aug. 12, 2005, mailed Mar. 6, 2007; 6 pages.

Burogs et al., "Power Converter Analysis and Design using Matlab: A Transfer Function Approach," Proceedings of IEEE International Symposium on Industrial Electronics 1998, vol. 2; 6 pages.

Efstathiou, "Analog Electronics: Basic Circuits of Operational Amplifiers," <http://web.archive.org/ web/20021231045232> Dec. 31, 2002, version, retrieved from the Internet Archives; 10 pages.

PCT International Search Report for PCT/US05/28791, filed Aug. 12, 2005, mailed Mar. 31, 2008; 4 pages.

PCT International Written Opinion for PCT/US05/28791, filed Aug. 12, 2005, mailed Mar. 31, 2008; 8 pages.

Kory Hopkins, "Definition;" Jan. 16, 1997; <http://www.cs.sfu.ca/cs/people/GradStudent.html>; 1 pages Ebeing et al., "Validating VLSI Circuit Layout by Wirelist Comparison"Sep. 1983 in proceedings of the IEEE 1 International Conference on Computer Aided Design; 2 pages.

"The Gemini Netlist Comparison Project;" <http://www.cs.washington.edu/research/projects/lis/www/gemini/gemini.html> larry@cs.washington.edu; Mar. 19, 2002; 2 pages.

Ohlrich et al., "Sub-Gemini: Identifying Subcircuits using a Fast Subgraph Isomorphism Algorithm;" Jun. 1993; in proceedings of the 30th IEEE/ACM Design Automation Conference; 7 pages.

Ebling "Gemini II:AeondGeneaton Layout Validation Program;" 1988; in proceedings of the IEEE Internatonal Conference on Computer Aided Design (ICCAD-88); 4 pages.

USPTO U.S. Appl. No. 12/132,527: "System and Method for Performing Next Placements and Pruning of Disallowed Placements for Programming an Integrated Circuit;" Ogami et al., filed Jun. 3, 2008; 44 pages.

USPTO U.S. Appl. No. 12/356,468: "System and Method for Dynamically Generating a Configuration Datasheet," Anderson et al.; filed Jan. 20, 2009; 27 pages.

Written Opinion of the International Search Authority for International Application No. PCT/US08/60680 dated Aug. 15, 2008; 4 pages.

USPTO Notice of Allowance for U.S. Appl. No. 09/475,879 dated Oct. 22, 2004; 7 pages.

USPTO Advisory Action for U.S. Appl. No. 09/475,879 dated Mar. 4, 2002; 3 pages.

USPTO Advisory Action for U.S. Appl. No. 09/475,879 dated Dec. 31, 2001; 3 pages.

USPTO Final Rejection for U.S. Appl. No. 09/475,879 dated Oct. 11, 2001; 10 pages.

USPTO Non-Final Rejection for U.S. Appl. No. 09/475,879 dated Mar. 8, 2001; 6 pages.

USPTO U.S. Appl. No. 09/475,879: "Programmable Logic Device," Lacey et al.; filed Dec. 30, 1999; 50 pages.

USPTO U.S. Appl. No. 09/475,808): "Configurable Memory for Programmable Logic Circuits," Lacey et al., filed Dec. 30, 1999; 24 pages.

USPTO Non-Final Rejection for U.S. Appl. No. 09/475,808 dated Jun. 6, 2001; 8 pages.

USPTO Notice of Allowance for U.S. Appl. No. 09/475,808 dated Nov. 6, 2001; 8 pages.

USPTO U.S. Appl. No. 10/137,497: "Reconfigurable Testing System and Method," Pleis et al.; filed on May 1, 2002; 40 pages.

USPTO Non-Final Rejection for U.S. Appl. No. 10/137,497 dated Nov. 5, 2004; 17 pages.

USPTO Final Rejection for U.S. Appl. No. 10/137,497 dated May 5, 2005; 13 pages.

USPTO Non-Final Rejection for U.S. Appl. No. 10/137,497 dated Sep. 22, 2005; 21 pages.

USPTO Final Rejection for U.S. Appl. No. 10/137,497 dated Mar. 13, 2006; 15 pages.

USPTO Non-Final Rejection for U.S. Appl. No. 10/137,497 dated Aug. 2, 2006; 21 pages.

USPTO Notice of Allowance for U.S. Appl. No. 10/137,497 dated Jan. 24, 2007; 12 pages.

USPTO Notice of Allowance for U.S. Appl. No. 10/137,497 dated Jul. 20, 2007; 4 pages.

USPTO U.S. Appl. No. 10/653,050: "Method and System for Programming a Memory Device," Snyder et al.; filed Aug. 29, 2003; 69 pages.

USPTO Non-Final Rejection for U.S. Appl. No. 10/653,050 dated Apr. 6, 2004; 7 pages.

USPTO Notice of Allowance for U.S. Appl. No. 10/653,050 dated Jul. 29, 2004; 3 pages.

USPTO U.S. Appl. No. 10/172,670: "Method and System for Programming a Memory Device," Snyder et al.; filed Jun. 13, 2002; 66 pages.

USPTO U.S. Appl. No. 11/986,338: Reconfigurable Testing System and Method, Pleis et al., filed Nov. 20, 2007; 41 pages.

USPTO Notice of Allowance for U.S. Appl. No. 11/965,291 dated May 5, 2009; 7 pages.

USPTO Non-Final Rejection for U.S. Appl. No. 11/965,291 dated Dec. 17, 2008; 8 pages.

USPTO U.S. Appl. No. 11/965,291: "Universal Digital Block Interconnection and Channel Routing," Snyder et al., filed Dec. 27, 2007; 31 pages.

USPTO Notice of Allowance for U.S. Appl. No. 11/986,338 dated May 7, 2009; 1 page.

USPTO U.S. Appl. No. 11/273,708: "Capacitance Sensor Using Relaxation Oscillators," Snyder et al., filed Nov. 14, 2005; 33 pages.

USPTO Non-Final Rejection for U.S. Appl. No. 11/273,708 dated Mar. 19, 2007; 16 pages.

USPTO Final Rejection for U.S. Appl. No. 11/273,708 dated Jul. 5, 2007; 8 pages.

USPTO Notice of Allowance for U.S. Appl. No. 11/273,708 dated Aug. 9, 2007; 4 pages.

USPTO U.S. Appl. No. 11/337,272: "Successive Approximate Capacitance Measurement Circuit" Warren Snyder, filed Jan. 20, 2006 29 pages.

USPTO Requirement for Restriction/Election for U.S. Appl. No. 11/337,272 dated Sep. 11, 2006; 5 pages.

USPTO Non-Final Rejection for U.S. Appl. No. 11/337,272 dated Oct. 24, 2006; 9 pages.

USPTO Final Rejection for U.S. Appl. No. 11/337,272 dated Feb. 2, 2007; 11 pages.

USPTO Advisory Action for U.S. Appl. No. 11/337,27291) dated Apr. 3, 2007; 3 pages.

USPTO Non-Final Rejection for U.S. Appl. No. 11/337,272 dated May 17, 2007; 11 pages.

USPTO Notice of Allowance for U.S. Appl. No. 11/337,272 dated Aug. 15, 2007; 9 pages.

USPTO U.S. Appl. No. 11/983,29: "Successive Approximate Capacitance Measurement Circuit," Warren Snyder, filed on Nov. 7, 2007; 26 pages.

USPTO Non-Final Rejection for U.S. Appl. No. 11/983,291 dated Mar. 9, 2009; 9 pages.

USPTO U.S. Appl. No. 11/698,660: "Configurable Bus," Kutz et al., filed Jan. 25, 2007; 35 pages.

USPTO Non-Final Rejection for U.S. Appl. No. 11/698,660 dated Dec. 2, 2008; 12 pages.

USPTO Final Rejection for U.S. Appl. No. 11/698,660 dated May 28, 2009; 12 pages.

USPTO U.S. Appl. No. 11/709,866: "Input/Output Multiplexer Bus," Dennis Sequine, filed Feb. 21, 2007; 33 pages.

USPTO Non-Final Rejection for U.S. Appl. No. 11/709,866 dated Nov. 7, 2008; 14 pages.

USPTO Notice of Allowance for U.S. Appl. No. 11/709,866 dated Apr. 7, 2009; 8 pages.

Sedra et al., "Microelectronic Circuits," 3rd Edition, 1991, Oxford University Press, Feb. 5, 2007; 20 pages.

Van Ess, David; "Simulating a 555 Timer with PSoC," Cypress Semiconductor Corporation, Application Note AN2286, May 19, 2005; 10 pages.

Cypress Semiconductor Corporation, "Fan Controller CG6457AM and CG6462AM," PSoC Mixed Signal Array Preliminary Data Sheet; May 24, 2005; 25 pages.

Cypress Semiconductor Corporation, "PSoC Mixed-Signal Controllers," Production Description; <http://www.cypress.com/portal/server>; retrieved on Sep. 27, 2005; 2 pages.

Cypress Semiconductor Corporation, "CY8C21x34 Data Sheet," CSR User Module, CSR V.1.0; Oct. 6, 2005; 36 pages.

Chapweske, Adam; "The PS/2 Mouse Interface," PS/2 Mouse Interfacing, 2001, retrieved on May 18, 2006; 11 pages.

Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.

Seguine, Ryan; "Layout Guidelines for PSoC CapSense," Cypress Semiconductor Corporation, Application Note AN2292; Jul. 22, 2005; 13 pages.

Lee, Mark; "EMC Design Considerations for PSoC CapSense Applications," Cypress Semiconductor Corporation, Application Note AN2318; Sep. 16, 2005; 6 pages.

Cypress Semiconductor Corporation, "Release Notes srn017," Jan., 24, 2007; 3 pages.

Cypress Semiconductor Corporation, "PSoC CY8C20x34 Technical Reference Manual (TRM)," PSoC CY8C20x34 TRM, Version 1.0, 2006; 220 pages.

USPTO U.S. Appl. No. 11/166,622 : "Touch wake for electronic devices," Beard et al., filed Jun. 23, 2005; 22 pages.

International Written Opinion of the International Searching Authority for International Application No. PCT/ US2006/09572 dated Jan. 10, 2008; 5 pages.

International Search Report for International Application No. PCT/US2006/09572 dated Jan. 10, 2008; 2 pages.

USPTO Notice of Allowance for U.S. Appl. No. 10/024,093 dated Sep. 10, 2002; 7 pages.

USPTO U.S. Appl. No. 10/024,093: "Configurable Memory for Programmable Logic Circuits," Lacey et al., filed Dec. 18, 2001; 25 pages.

USPTO U.S. Appl. No. 11/088,028: "Method and Circuit for Rapid Alignment of Signals," Moyal et al., filed Nov. 13, 2007; 34 pages.

USPTO Notice of Allowance for U.S. Appl. No. 11/088,028 dated Jul. 2, 2007; 6 pages.

USPTO Notice of Allowance for U.S. Appl. No. 11/088,028 dated Jan. 26, 2007; 6 pages.

USPTO Non-Final Rejection for U.S. Appl. No. 11/088,028 dated Jun. 16, 2006; 8 pages.

USPTO U.S. Appl. No. 11/985,340: "Method and Circuit for Rapid Alignment of Signals," Moyal et al., filed Nov. 13, 2007; 34 pages.

USPTO Notice of Allowance for U.S. Appl. No. 11/985,340 dated Jun. 2, 2009; 7 pages.

USPTO Requirement for Restriction for U.S. Appl. No. 11/985,340 dated Mar. 16, 2009; 7 pages.

USPTO Non-Final Rejection for U.S. Appl. No. 11/865,672 dated Jul. 17, 2009; 6 pages.

USPTO Non-Final Rejection for U.S. Appl. No. 11/859,547 dated Oct. 1, 2009; 9 pages.

USPTO Non-Final Rejection for U.S. Appl. No. 11/967,243 dated Sep. 17, 2009; 9 pages.

USPTO Non-Final Rejection for U.S. Appl. No. 11/967,240 dated Jun. 10, 2009; 7 pages.

USPTO Non-Final Rejection for U.S. Appl. No. 11/857,947 dated Mar. 30, 2009; 18 pages.

USPTO Non-Final Rejection for U.S. Appl. No. 12/104,672 dated Aug. 26, 2009; 11 pages.

USPTO Non-Final Rejection for U.S. Appl. No. 12/060,128 dated Apr. 29, 2009; 11 pages.

International Search Report of the International Searching Authority for International Application No. PCT/ US08/60695 dated Jul. 22, 2009; 3 pages.

Written Opinion of the International Searching Authority for International Application No. PCT/US08/60695 dated Jul. 22, 2009; 6 pages.

Azim et al., "A Custom DSP Chip to Implement a Robot Motion Controller Proceedings of the IEEE Custom Integrated Circuits Conference," May 1988, pp. 8.7.1-8.7.5; 6 pages.

Catthoor et al., "Architectural Strategies for an Application-Specific Synchronous Multiprocessor Environment," IEEE transactions on Acoustics, Speech, and Signal Processing; vol. 36, No. 2, Feb. 1988, pp. 265-284; 20 pages.

International Search Report of the International Searching Authority for International Application No. PCT/ US08/60696 dated Sep. 22, 2008; 2 pages.

International Search Report of the International Searching Authority for International Application No. PCT/ US08/60698 dated Sep. 5, 2008; 2 pages.

Shahbahrami et al "Maritx Register File and Extended Subwords: Two Techniques fo Embeded Media Processors," ACM, May 2005; 9 pages.

Jung et al., "A Register File with Transposed Access Mode," 2000, IEEE; 2 pages.

International Search Report of the International Searching Authority for International Application No. PCT/ US08/60681 dated Sep. 12, 2008; 2 pages.

Written Opinion of the International Searching Authority for International U.S. Appl. No. PCT/US08/60681 dated Sep. 12, 2008; 4 pages.

USPTO Notice of Allowance for U.S. Appl. No. 11/965,677 dated Sep. 10, 2009; 6 pages.

USPTO Non-Final Rejection for U.S. Appl. No. 11/965,677 dated Mar. 10, 2009; 10 pages.

Written Opinion of the International Searching Authority for International. Applications No. PCT/US08/60696 dated Sep. 22, 2008; 4 pages.

USPTO Notice of Allowance for U.S. Appl. No. 10/238,966 dated Aug. 5, 2009; 5 pages.

USPTO Notice of Allowance for U.S. Appl. No. 10/033,027 dated Sep. 2, 2009; 4 pages.

USPTO Non-Final Rejection for U.S. Appl. No. 10/001,478 dated Aug. 4, 2009; 17 pages.

USPTO Advisory Action for U.S. Appl. No. 10/001,478 dated Jun. 30, 2009; 3 pages.

USPTO Final Rejection for U.S. Appl. No. 10/001,478 dated Apr. 20, 2009; 16 pages.

USPTO Notice of Allowance for U.S. Appl. No. 10/002,217 dated Sep. 17, 2009; 6 pages.

USPTO Notice of Allowance for U.S. Appl. No. 10/002,217 dated Jun. 8, 2009; 8 pages.

USPTO Notice of Allowance for U.S. Appl. No. 10/001,477 dated Dec. 4, 2009; 7 pages.

USPTO Notice of Allowance for U.S. Appl. No. 10/001,477 dated Aug. 26, 2009; 6 pages.

USPTO Ex Parte Quayle Action for U.S. Appl. No. 09/975,115 dated Aug. 20, 2009; 7 pages.

USPTO Non-Final Rejection for U.S. Appl. No. 09/994,601 dated Jul. 9, 2009; 11 pages.

USPTO Final Rejection for U.S. Appl. No. 09/989,767 dated Dec. 7, 2009; 22 pages.

USPTO Final Rejection for U.S. Appl. No. 11/850,260 dated Aug. 21, 2009; 9 pages.

USPTO Advisory Action for U.S. Appl. No. 09/989,778 dated Jun. 17, 2009; 3 pages.

USPTO Notice of Allowance for U.S. Appl. No. 09/994,600 dated Aug. 25, 2009; 4 pages.

USPTO Notice of Allowance for U.S. Appl. No. 09/994,600 dated Apr. 3, 2009; 5 pages.
USPTO Notice of Allowance for U.S. Appl. No. 09/989,762 dated Oct. 30, 2009; 6 pages.
USPTO Notice of Allowance for U.S. Appl. No. 09/989,762 dated Jul. 16, 2009; 6 pages.
USPTO Non-Final Rejection for U.S. Appl. No. 09/998,848 dated May 12, 2009; 16 pages.
USPTO Non-Final Rejection for U.S. Appl. No. 09/989,767 dated May 12, 2009; 21 pages.
USPTO Final Rejection for U.S. Appl. No. 09/989,771 dated Nov. 25, 2009; 12 pages.
USPTO Notice of Allowance for U.S. Appl. No. 09/989,765 dated Sep. 3, 2009; 7 pages.
USPTO Non-Final Rejection for U.S. Appl. No. 09/989,782 dated Oct. 27, 2009; 9 pages.
USPTO Final Rejection for U.S. Appl. No. 09/989,782 dated May 15, 2009; 10 pages.
USPTO Notice of Allowance for U.S. Appl. No. 11/986,338 dated Oct. 19, 2009; 4 pages.
USPTO Notice of Allowance for U.S. Appl. No. 09/989,777 dated Aug. 6, 2009; 8 pages.
USPTO Notice of Allowance for U.S. Appl. No. 10/008,096 dated Oct. 21, 2009; 6 pages.
USPTO Notice of Allowance for U.S. Appl. No. 10/008,096 dated Jun. 5, 2009; 12 pages.
USPTO Notice of Allowance for U.S. Appl. No. 11/985,340 dated Nov. 09, 2009; 7 pages.
USPTO Advisory Action for U.S. Appl. No. 11/201,627 dated Sep. 21, 2009; 3 pages.
USPTO Final Rejection for U.S. Appl. No. 11/201,627 dated Jul. 7, 2009; 19 pages.
USPTO Miscellaneous Action for U.S. Appl. No. 11/201,922 dated Oct. 1, 2009; 2 pages.
USPTO Non-Final Rejection for U.S. Appl. No. 11/200,619 dated Jun. 17, 2009; 12 pages.
USPTO Non-Final Rejection for U.S. Appl. No. 11/166,622 dated Sep. 29, 2009; 11 pages.
USPTO Advisory Action for U.S. Appl. No. 11/166,622 dated May 27, 2009; 3 pages.
USPTO Final Rejection for U.S. Appl. No. 11/166,622 dated Mar. 10, 2009; 11 pages.
USPTO Notice of Allowance for U.S. Appl. No. 12/218,404 dated Nov. 3, 2009; 8 pages.
USPTO Notice of Allowance for U.S. Appl. No. 12/218,404 dated Jul. 10, 2009; 7 pages.
USPTO Notice of Allowance for U.S. Appl. No. 11/709,866 dated Aug. 4, 2009; 7 pages.
USPTO Non-Final Rejection for U.S. Appl. No. 11/698,660 dated Oct. 7, 2009; 12 pages.
USPTO Advisory Action for U.S. Appl. No. 11/698,660 dated Jul. 31, 2009; 3 pages.
USPTO Notice of Allowance for U.S. Appl. No. 11/983,291 dated Oct. 22, 2009; 7 pages.
USPTO Final Rejection for U.S. Appl. No. 11/983,291 dated Aug. 12, 2009; 10 pages.
USPTO Final Rejection for U.S. Appl. No. 11/322,044 dated Oct. 19, 2009; 10 pages.
USPTO Final Rejection for U.S. Appl. No. 11/644,100 dated Aug. 19, 2009; 12 pages.
USPTO Advisory Action for U.S. Appl. No. 11/850,260 dated Nov. 2, 2009; 3 pages.
USPTO Final Rejection for U.S. Appl. No. 11/698,660 dated Feb. 16, 2010; 14 pages.
USPTO Notice of Allowance for U.S. Appl. No. 09/989,765 dated Dec. 22, 2009; 8 pages.
USPTO Notice of Allowance for U.S. Appl. No. 09/994,600 dated Jan. 4, 2010; 4 pages.
USPTO Notice of Allowance for U.S. Appl. No. 10/002,217 dated Jan. 11, 2010; 7 pages.
USPTO Notice of Allowance for U.S. Appl. No. 09/989,777 dated Jan. 15, 2010; 8 pages.
USPTO Notice of Allowance for U.S. Appl. No. 11/965,291 dated Jan. 13, 2010; 4 pages.
USPTO Notice of Allowance for U.S. Appl. No. 09/975,115 dated Jan. 29, 2010; 9 pages.
USPTO Notice of Allowance for U.S. Appl. No. 10/238,966 dated Feb. 1, 2010; 4 pages.
USPTO Final Rejection for U.S. Appl. No. 09/994,601 dated Jan. 5, 2010; 13 pages.
USPTO Non-Final Rejection for U.S. Appl. No. 09/998,848 dated Dec. 10, 2009; 16 pages.
USPTO Notice of Allowance for U.S. Appl. No. 10/008,096 dated Feb. 1, 2010; 6 pages.
USPTO Non-Final Rejection for U.S. Appl. No. 11/201,627 dated Dec. 24, 2009; 22 pages.
USPTO Final Rejection for U.S. Appl. No. 11/200,619 dated Jan. 4, 2010; 18 pages.
USPTO Non-Final Rejection for U.S. Appl. No. 11/644,100 dated Dec. 16, 2009; 13 pages.
USPTO Non-Final Rejection for U.S. Appl. No. 11/850,260 dated Jan. 14, 2010; 8 pages.
USPTO Notice of Allowance for U.S. Appl. No. 10/033,027 dated Feb. 18, 2010; 4 pages.
USPTO Notice of Allowance for U.S. Appl. No. 11/986,338 dated Feb. 22, 2010; 7 pages.
USPTO Notice of Allowance for U.S. Appl. No. 11/986,338 dated Feb. 16, 2010; 4 pages.
USPTO Non-Final Rejection for U.S. Appl. No. 12/136,557 dated Mar. 15, 2010; 10 pages.
USPTO Notice of Allowance for U.S. Appl. No. 11/965,677 dated Feb. 12, 2010; 4 pages.
USPTO Notice of Allowance for U.S. Appl. No. 11/985,340 dated Feb. 19, 2010; 8 pages.
USPTO Notice of Allowance for U.S. Appl. No. 12/218,404 dated Feb. 16, 2010; 7 pages.
USPTO Notice of Allowance for U.S. Appl. No. 11/709,866 dated Feb. 16, 2010; 7 pages.
USPTO Non-Final Rejection for U.S. Appl. No. 10/113,58188) dated Aug. 12, 2005; 12 pages.
USPTO Notice of Allowance for U.S. Appl. No. 10/113,581 dated Mar. 5, 2010; 9 pages.
USPTO Non-Final Rejection for U.S. Appl. No. 10/113,581 dated Sep. 1, 2009; 18 pages.
USPTO Final Rejection for U.S. Appl. No. 10/113,581 dated May 11, 2009; 21 pages.
USPTO Non-Final Rejection for U.S. Appl. No. 10/113,581 dated Nov. 26, 2008; 20 pages.
USPTO Final Rejection for U.S. Appl. No. 10/113,581 dated Jun. 11, 2008; 14 pages.
USPTO Non-Final Rejection for U.S. Appl. No. 10/113,581 dated Nov. 27, 2007; 15 pages.
USPTO Final Rejection for U.S. Appl. No. 10/113,581 dated Jul. 13, 2007; 15 pages.
USPTO Non-Final Rejection for U.S. Appl. No. 10/113,581 dated Jan. 10, 2007; 14 pages.
USPTO Final Rejection for U.S. Appl. No. 10/113,581 dated Aug. 10, 2006; 13 pages.
USPTO Non-Final Rejection for U.S. Appl. No. 10/113,581 dated Feb. 24, 2006; 11 pages.
USPTO Notice of Allowance for U.S. Appl. No. 10/001,477 dated Mar. 23, 2010; 6 pages.
USPTO Notice of Allowance for U.S. Appl. No. 09/989,765 dated Mar. 31, 2010; 8 pages.
USPTO Notice of Allowance for U.S. Appl. No. 12/104,672 dated Jan. 11, 2010; 7 pages.
USPTO Non-Final Rejection for U.S. Appl. No. 11/799,439, dated Nov. 2, 2008; 7 pages.
USPTO Non-Final Rejection for U.S. Appl. No. 11/799,439 dated May 29, 2008; 8 pages.
USPTO Final Rejection for U.S. Appl. No. 11/799,439 dated Dec. 18, 2008; 6 pages.
USPTO Notice of Allowance for U.S. Appl. No. 11/799,439 dated Jun. 25, 2009; 6 pages.

USPTO Notice of Allowance for U.S. Appl. No. 11/799,439 dated Feb. 5, 2010; 4 pages.
USPTO Notice of Allowance for U.S. Appl. No. 11/347,189 dated Sep. 27, 2007; 4 pages,
USPTO Non-Final Rejection for U.S. Appl. No. 11/347,189 dated Jun. 8, 2007; 6 pages.
USPTO Notice of Allowance for U.S. Appl. No. 12/070,547 dated Feb. 24, 2010; 4 pages.
USPTO Final Rejection for U.S. Appl. No. 12/070,547 dated Oct. 30, 2009; 5 pages.
USPTO Non-Final Rejection for U.S. Appl. No. 12/070,547 dated Jun. 3, 2009; 6 pages.
USPTO Non-Final Rejection for U.S. Appl. No. 11/201,922 dated Jun. 11, 2010; 12 pages.
USPTO Notice of Allowance for U.S. Appl. No. 09/943,052 dated Jun. 29, 2010; 4 pages.
USPTO Non-Final Rejection for U.S. Appl. No. 12/132,527 dated Apr. 29, 2010; 7 pages.
USPTO Notice of Allowance for U.S. Appl. No. 10/256,829 dated May 10, 2010; 4 pages.
USPTO Non-Final Rejection for U.S. Appl. No. 10/256,829 dated Oct. 26, 2009; 8 pages.
USPTO Final Rejection for U.S. Appl. No. 10/256,829 dated Jun. 23, 2009; 8 pages.
USPTO Non-Final Rejection for U.S. Appl. No. 10/256,829 dated Jan. 7, 2009; 7 pages.
USPTO Non-Final Rejection for U.S. Appl. No. 10/256,829 dated Jun. 26, 2008; 11 pages.
USPTO Notice of Allowance for U.S. Appl. No. 10/256,829 dated Oct. 29, 2007; 6 pages.
USPTO Final Rejection for U.S. Appl. No. 10/256,829 dated Jun. 1, 2007; 16 pages.
USPTO Non-Final Rejection for U.S. Appl. No. 10/256,829 dated Nov. 2, 2006; 13 pages.
USPTO Non-Final Rejection for U.S. Appl. No. 10/256,829 dated May 3, 2006; 16 pages.
USPTO Final Rejection for U.S. Appl. No. 10/256,829 dated Jan. 27, 2006; 24 pages.
USPTO Non-Final Rejection for U.S. Appl. No. 10/256,829 dated Jul. 28, 2005; 14 pages.
USPTO Notice of Allowance for U.S. Appl. No. 09/989,817 dated May 9, 2005; 6 pages.
USPTO Non-Final Rejection for U.S. Appl. No. 09/989,817 dated Jan. 12, 2005; 5 pages.
USPTO Non-Final Rejection for U.S. Appl. No. 09/989,817 dated Jun. 8, 2004; 7 pages.
USPTO Notice of Allowance for U.S. Appl. No. 10/327,207 dated Jun. 11, 2007; 4 pages.
USPTO Notice of Allowance for U.S. Appl. No. 10/327,207 dated Dec. 26, 2006; 5 pages.
USPTO Non-Final Rejection for U.S. Appl. No. 10/327,207 dated Jul. 21, 2006; 12 pages.
USPTO Final Rejection for U.S. Appl. No. 10/327,207 dated Mar. 2, 2006; 13 pages.
USPTO Non-Final Rejection for U.S. Appl. No. 10/327,207 dated Sep. 20, 2005; 11 pages.
USPTO Miscellaneous Action for U.S. Appl. No. 10/327,207 dated May 13, 2003; 1 page.
USPTO Notice of Allowance for U.S. Appl. No. 09/989,570 dated May 19, 2005; 4 pages.
USPTO Non-Final Rejection for U.S. Appl. No. 09/989,570 dated Jan. 26, 2005; 9 pages.
USPTO Notice of Allowance for U.S. Appl. No. 09/989,570 dated Sep. 10, 2004; 8 pages.
USPTO Non-Final Rejection for U.S. Appl. No. 09/989,570 dated Mar. 25, 2004; 8 pages.
USPTO Non-Final Rejection for U.S. Appl. No. 09/989,570 dated Oct. 7, 2003; 6 pages.
USPTO Advisory Action for U.S. Appl. No. 09/989,570 dated Aug. 14, 2003; 3 pages.
USPTO Final Rejection for U.S. Appl. No. 09/989,570 dated May 30, 2003; 9 pages.
USPTO Non-Final Rejection for U.S. Appl. No. 09/989,570 dated Jan. 2, 2003; 7 pages.
USPTO Notice of Allowance for U.S. Appl. No. 09/989,571 dated Sep. 13, 2005; 6 pages.
USPTO Non-Final Rejection for U.S. Appl. No. 09/989,571 dated May 23, 2005; 8 pages.
USPTO Final Rejection for U.S. Appl. No. 09/989,571 dated Jan. 26, 2005; 11 pages.
USPTO Non-Final Rejection for U.S. Appl. No. 09/989,571 dated Jul. 12, 2004; 9 pages.
M. MoorsMano, Compuer Sysem Achtecue, 1982, Pentce-Hal, 2nd Edton, pp. 261-264 and 435-440; 14 pages.
Dirk Killat, "A One-Chip Solution for Electronic Ballasts in Fluorescent Lamps," Power Electronics, <http://powerelectronics.com/mag/power_onechip_solution_electronic/>, dated Mar. 1, 2004, accessed Sep. 13, 2005; 4 pages.
Fred Eady, "PSoC 101," Circuit Cellar, Aug. 2004, accessed Sep. 13, 2005, <http://wwvv.circuitcellar.com/library/print/0804/eady169/2.htm>; 4 pages.
USPTO Notice of Allowance for U.S. Appl. No. 10/803,030 dated Jan. 8, 2007; 6 pages.
USPTO Non-Final Rejection for U.S. Appl. No. 10/803,030 dated Jun. 8, 2005; 4 pages.
U.S. Appl. No. 12/058,586: "System and Method for Monitoring a Target Device," Ogami et al., filed Mar. 28, 2008; 41 pages.
U.S. Appl. No. 12/058,534: "System and Method for Controlling a Target Device," Ogami et al., filed Mar. 28, 2008; 40 pages.
U.S. Appl. No. 12/004,833: "Systems and Methods for Dynamically Reconfiguring a Programmable System on a Chip," Ogami et al., filed Dec. 21, 2007; 40 pages.
U.S. Appl. No. 12/058,569: "Configuration of Programmable IC Design Elements," Best et al., filed Mar. 28, 2008; 19 pages.
U.S. Appl. No. 12/057,149: "Power Management Architecture, Method and Configuration System," Kenneth Ogami, filed on Mar. 27, 2008; 34 pages.
U.S. Appl. No. 12/765,400: "Autonomous Control in a Programmable System," Sullam et al., filed Apr. 22, 2010; 30 pages.
International Search Report for International Application No. PCT/US10/33626 mailed Jun. 24, 2010; 3 pages.
The Written Opinion of the International Search Report for International Application No. PCT/US10/33626 mailed Jun. 24, 2010; 5 pages.
USPTO Non-Final Rejection for U.S. Appl. No. 12/060,176 dated Mar. 30, 2010; 22 pages.
John Mangino, "USing DMA with High Performance Peripherals to Maximize System Performance," 2007, Texas Instruments, pp. 1-23; 23 pages.
Balough et al., "White Paper: Comparing IP Integration Approaches for FPGA Implementation," Feb. 2007, Version 1.1, Altera, pp. 1-7; 7 pages.
A.F. Harvey, "DMA Fundamentals on Various PC Platforms," 2001, 2004, National Instruments Corporation, pp. 1-19; 19 pages.
Vixel, "InSpeed SOC 320 Embedded Storage Switch," 2003, Vixel, pp. 1-5; 5 pages.
USPTO Notice of Allowance for U.S. Appl. No. 09/943,062 dated Jun. 29, 2010; 4 pages.
USPTO Miscellaneous Action for U.S. Appl. No. 10/113,581 dated Jun. 23, 2010; 6 pages.
USPTO Miscellaneous Action for U.S. Appl. No. 10/001,478 dated Feb. 23, 2010; 5 pages.
USPTO Notice of Allowance for U.S. Appl. No. 10/001,478 dated Jun. 2, 2010; .11 pages.
USPTO Notice of Allowance for U.S. Appl. No. 11/985,340 dated Jun. 9, 2010; 8 pages.
USPTO Notice of Allowance for U.S. Appl. No. 11/850,260 dated Jul. 2, 2010; 8 pages.
USPTO Notice of Allowance for U.S. Appl. No. 12/060,128 dated Oct. 19, 2009; 8 pages.
USPTO Non-Final Rejection for U.S. Appl. No. 09/975,338 dated Apr. 30, 2010; 2 pages.
USPTO Non-Final Rejection for U.S. Appl. No. 11/968,145 dated Mar. 4, 2010; 11 pages.

USPTO Advisory Action for U.S. Appl. No. 11/201,627 dated Aug. 5, 2010; 3 pages.
USPTO Final Rejection for U.S. Appl. No. 11/201,627 dated May 24, 2010; 26 pages.
USPTO Non-Final Rejection for U.S. Appl. No. 11/166,622 dated Jun. 22, 2010; 11 pages.
USPTO Final Rejection for U.S. Appl. No. 11/166,622 dated Mar. 18, 2010; 12 pages.
USPTO Non-Final Rejection for U.S. Appl. No. 11/698,660 dated May 21, 2010; 15 pages.
USPTO Advisory Action for U.S. Appl. No. 11/644,100 dated Jul. 21, 2010; 3 pages.
USPTO Final Rejection for U.S. Appl. No. 11/644,100 dated May 19, 2010; 13 pages.
USPTO Final Rejection for U.S. Appl. No. 11/865,672 dated Dec. 30, 2009; 6 pages.
USPTO Final Rejection for U.S. Appl. No. 11/857,947 dated Oct. 14, 2009; 22 pages.
USPTO Non-Final Rejection for U.S. Appl. No. 11/857,947 dated Feb. 3, 2010; 23 pages.
USPTO Non-Final Rejection for U.S. Appl. No. 11/857,947 dated Jul. 21, 2010; 15 pages.
USPTO Non-Final Rejection for U.S. Appl. No. 12/058,569 dated Aug. 2, 2010; 9 pages.
USPTO Final Rejection for U.S. Appl. No. 11/968,145 dated Aug. 2, 2010; 6 pages.
USPTO Non-Final Rejection for U.S. Appl. No. 12/104,678 dated Jul. 2, 2010; 8 pages.
USPTO Notice of Allowance for U.S. Appl. No. 10/238,966 dated Jan. 27, 2009; 4 pages.
USPTO Non-Final Rejection for U.S. Appl. No.10/238,966 dated Jun. 30, 2008; 12 pages.
USPTO Non-Final Rejection for U.S. Appl. No. 10/238,966 dated Dec. 26, 2007; 12 pages.
UPTO Final Rejection for U.S. Appl. No. 10/238,966 dated Sep. 27, 2009; 9 pages.
USPTO Non-Final Rejection for U.S. Appl. No. 10/238,966 dated Apr. 19, 2007; 7 pages.
USPTO Non-Final Rejection for U.S. Appl. No. 10/238,966 dated Oct. 20, 2006; 8 pages.
USPTO Non-Final Rejection for U.S. Appl. No. 10/238,966 dated Apr. 6, 2006; 8 pages.
USPTO Notice of Allowance for U.S. Appl. No. 10/033,027 dated Mar. 31, 2009; 7 pages.
USPTO Non-Final Rejection for U.S. Appl. No. 10/033,027 dated Dec. 18, 2008; 5 pages.
USPTO Final Rejection for U.S. Appl. No. 10/033,027 dated Jun. 8, 2007; 8 pages.
USPTO Non-Final Rejection for U.S. Appl. No. 10/033,027 dated Dec. 21, 2006; 31 pages.
USPTO Final Rejection for U.S. Appl. No. 10/033,027 dated Aug. 26, 2006; 6 pages.
USPTO Non-Final Rejection for U.S. Appl. No.10/033,027 dated Apr. 26, 2005; 26 pages.
USPTO Final Rejection for U.S. Appl. No. 10/033,027 dated Oct. 31, 2005; 24 pages.
USPTO Non-Final Rejection for U.S. Appl. No. 10/033,027 dated Apr. 20, 2005; 20 pages.
USPTO Non-Final Rejection for U.S. Appl. No. 10/033,027 dated Oct. 18, 2004; 17 pages.
USPTO Non-Final Rejection for U.S. Appl. No. 10/001,478 dated Oct. 20, 2008; 18 pages.
USPTO Final Rejection for U.S. Appl. No. 10/001,478 dated Jun. 4, 2008 ; 18 pages.
USPTO Non-Final Rejection for U.S. Appl. No. 10/001,478 dated Jan. 30, 2008; 19 pages.
USPTO Final Rejection for U.S. Appl. No. 10/001,478 dated Sep. 17, 2007; 15 pages.
USPTO Non-Final Rejection for U.S. Appl. No. 10/001,478 dated Apr. 2, 2007; 17 pages.
USPTO Final Rejection for U.S. Appl. No. 10/001,478 dated Sep. 5, 2006; 19 pages.
USPTO Non-Final Rejection for U.S. Appl. No. 10/001,478 dated Mar. 15, 2006; 19 pages.
USPTO Final Rejection for U.S. Appl. No. 10/001,478 dated Oct. 24, 2005; 15 pages.
USPTO Non-Final Rejection for U.S. Appl. No. 10/001,478 dated May 16, 2005; 13 pages.
USPTO Notice of Allowance for U.S. Appl. No. 10/002,217 dated Jan. 28, 2009; 4 pages.
USPTO Notice of Allowance for U.S. Appl. No. 10/002,217 dated Oct. 14, 2008; 6 pages.
USPTO Notice of Allowance for U.S. Appl. No. 10/002,217 dated Jun. 6, 2008; 7 pages.
USPTO Final Rejection for U.S. Appl. No. 10/002,217 dated Feb. 6, 2008; 10 pages.
USPTO Non-Final Rejection for U.S. Appl. No. 10/002,217 dated Aug. 3, 2007; 10 pages.
USPTO Final Rejection for U.S. Appl. No. 10/002,217 dated Mar. 7, 2007; 12 pages.
USPTO Non-Final Rejection for U.S. Appl. No. 10/002,217 dated Oct. 2, 2006; 21 pages.
USPTO Non-Final Rejection for U.S. Appl. No. 10/002,217 dated Apr. 3, 2006; 12 pages.
USPTO Final Rejection for U.S. Appl. No. 10/002,217 dated Nov. 17, 2005; 17 pages.
USPTO Non-Final Rejection for U.S. Appl. No. 10/002,217 dated May 19, 2005; 15 pages.
USPTO Advisory Action for U.S. Appl. No. 10/001,477 dated Oct. 10, 2008; 3 pages.
"An Analog PPL-Based Clock and Data Recovery Circuit with High Input Jitter Tolerance," Sun, Reprinted from IEEE Journal of Solid-State Circuits, 1989; 4 pages.
"WP 3.5: An Integrated Time Reference;" Blauschild, Digest of Technical Papers, 1994; 4 pages.
"Micropower CMOS Temperature Sensor with Digital Output;" Bakker et al., IEEE Journal of Solid-State Circuits, 1996; 3 pages.
U.S. Appl. No. 09/964,991: "A Novel Band-Gap Circuit for Providing an Accurate Reference Voltage Compensated for Process State, Process Variations and Temperature," Kutz et al., filed Sep. 26, 2001; 25 pages.
U.S. Appl. No. 09/842,966: "Precision Crystal Oscillator Circuit Used in Microcontroller," Monte Mar, filed Apr. 25, 2001; 28 pages.
USPTO Non-Final Rejection for U.S. Appl. No. 09/975,115 dated Oct. 9, 2008; 34 pages.
USPTO Final Rejection for U.S. Appl. No. 09/975,115 dated May 12, 2008; 33 pages.
USPTO Non-Final Rejection for U.S. Appl. No. 09/975,115 dated Jan. 7, 2008; 30 pages.
USPTO Non-Final Rejection for U.S. Appl. No. 09/975,115 dated Jul. 31, 2007; 28 pages.
USPTO Final Rejection for U.S. Appl. No. 09/975,115 dated Feb. 21, 2007; 25 pages.
USPTO Non-Final Rejection for U.S. Appl. 09/975,115 dated Oct. 31, 2006; 19 pages.
USPTO Final Rejection for U.S. Appl. No. 09/975,115 dated Jun. 23, 2006; 20 pages.
USPTO Non-Final Rejection for U.S. Appl. No. 09/975,115 dated Jan. 11, 2006; 15 pages.
USPTO Non-Final Rejection for U.S. Appl. No. 09/975,115 dated Jul. 27, 2005; 11 pages.
USPTO Non-Final Rejection for U.S. Appl. No. 09/975,115 dated Feb. 11, 2005; 86 pages.
USPTO Final Rejection for U.S. Appl. No. 09/975,338 dated Jan. 31, 2008; 21 pages.
USPTO Non-Final Rejection for U.S. Appl. No. 09/975,338 dated Aug. 14, 2007; 19 pages.
USPTO Final Rejection for U.S. Appl. No. 09/975,338 dated Feb. 27, 2007; 23 pages.
USPTO Non-Final Rejection for U.S. Appl. No. 09/975,338 dated Sep. 6, 2006; 11 pages.
USPTO Advisory Action for U.S. Appl. No. 09/975,338 dated May 15, 2006; 4 pages.
USPTO Final Rejection for U.S. Appl. No. 09/975,338, dated Jan. 18, 2006; 12 pages.

USPTO Non-Final Rejection for U.S. Appl. No. 09/975,338 dated Apr. 5, 2005; 13 pages.
USPTO Final Rejection for U.S. Appl. No. 10/008,096 dated Feb. 10, 2005; 15 pages.
USPTO Final Rejection for U.S. Appl. No. 10/008,096 dated Jun. 16, 2008; 23 pages.
USPTO Final Rejection for U.S. Appl. 10/008,096 dated Sep. 4, 2007; 19 pages.
USPTO Final Rejection for U.S. Appl. No. 10/008,096 dated Oct. 13, 2006; 17 pages.
USPTO Final Rejection for U.S. Appl. No. 10/008,096 dated Nov. 13, 2006; 17 pages.
USPTO Non-Final Rejection for U.S. Appl. No. 10/008,096 dated Mar. 7, 2007; 19 pages.
USPTO Non-Final Rejection for U.S. Appl. No. 10/008,096 dated Apr. 17, 2006; 18 pages.
USPTO Non-Final Rejection for U.S. Appl. No. 10/008,096 dated Jun. 14, 2004; 24 pages.
USPTO Non-Final Rejection for U.S. Appl. No. 10/008,096 dated Jun. 24, 2005; 15 pages.
USPTO Non-Final Rejection for U.S. Appl. No. 10/008,096 dated Dec. 12, 2007; 14 pages.
USPTO Notice of Allowance for U.S. Appl. No. 10/008,096 dated Dec, 22, 2007; 24 pages.
USPTO Notice of Allowance for U.S. Appl. No. 09/975105 dated Dec. 4, 2006; 4 pages.
USPTO Final Rejection for U.S. Appl. No. 09/975,105, dated Jul. 13, 2006; 7 pages.
USPTO Non-Final Rejection for U.S. Appl. No. 09/975,105 dated Jan. 19, 2006; 5 pages.
USPTO Non-Final Rejection for U.S. Appl. No. 09/975,105 dated Apr. 19, 2005; 9 pages.
U.S. Appl. No. 09/943,062: "Apparatus and Method for Programmable Power Management in a Programmable Analog Circuit Block," Monte Mar, filed Aug. 29, 2001; 46 pages.
U.S. Appl. No. 10/238,966: "Method for Parameterizing a User Module," Perrin et al., filed Sep. 9, 2002; 41 pages.
USPTO Notice of Allowance for U.S. Appl. No. 10/324,455 dated Feb. 12, 2004; 4 pages.
USPTO Non-Final Rejection for U.S. Appl. No. 10/324,455 dated Nov. 6, 2003; 4 pages.
USPTO Non-Final Rejection for U.S. Appl. No. 10/324,455 dated Aug. 21, 2003; 4 pages.
USPTO Notice of Allowance for U.S. Appl. No. 09/998,859 dated Mar. 14, 2005; 6 pages.
USPTO Non-Final Rejection for U.S. Appl. No. 09/998,859 Nov. 4, 2004; 6 pages.
USPTO Final Rejection for U.S. Appl. No. 09/998,859 dated Nov. 19, 2003; 5 pages.
USPTO Non-Final Rejection for U.S. Appl. No. 09/998,859 dated May 28, 2003; 6 pages.
USPTO Non-Final Rejection for U.S. Appl. No. 09/998,859 dated May 15, 2003; 6 pages.
USPTO Notice of Allowance for U.S. Appl. No. 09/998,834 dated May 19, 2005; 7 pages.
USPTO Non-Final Rejection for U.S. Appl. No. 09/998,834 dated Sep. 20, 2004; 11 pages.
USPTO Notice of Allowance for U.S. Appl. No. 10/113,065 dated Apr. 6, 2006; 8 pages.
USPTO Final Rejection for U.S. Appl. No. 10/113,065 dated Oct. 26, 2005; 17 pages.
USPTO Non-Final Rejection for U.S. Appl. No. 10/113,065 dated May 20, 2005; 14 pages.
U.S. Appl. No. 09/207,912: "Circuit(s), Architecture and Method(s) for Operating and/or Tuning a Ring Oscillator," Monte Mar, filed Dec. 9, 1998; 23 pages.
USPTO Notice of Allowance for U.S. Appl. No. 10/001,477dated May 8, 2009; 6 pages.
Goodenough, F. "Analog Counterparts of FPGAS Ease System Design" Electronic Design, Penton Publishing, Cleveland, OH, US vol. 42, No. 21, Oct. 14, 1994; 10 pages.
Harbaum, T. et al. "Design of a Flexible Coprocessor Unit" Proceedings of the Euromicro Conference, XX XX, Sep. 1999; 10 pages.

USPTO U.S. Appl. No. 09/924,734: "Programmable Microcontroller (PSoC) Architecture (Mixed Analog/Digital)"; Snyder et al., filed Aug. 7, 2001; 28 pages.
USPTO U.S. Appl. No. 09/909,045: "Digital Configurable Macro Architecture," Warren Snyder, filed Jul. 18, 2001; 37 pages.
USPTO U.S. Appl. No. 09/909,109: "Configuring Digital Functions in a Digital Configurable Macro Architecture," Warren Snyder, filed Jul. 18, 2001; 38 pages.
USPTO U.S. Appl. No. 09/909,047: "A Programmable Analog System Architecture," Monte Mar, filed Jul. 18, 2001; 60 pages.
USPTO U.S. Appl. No. 09/930,021: "Programmable Methodology and Architecture for a Programmable Analog System"; Mar et al., filed Aug. 14, 2001; 87 pages.
USPTO U.S. Appl. No. 09/969,311: "Method for Synchronizing and Resetting Clock Signals Supplied to Multiple Programmable Analog Blocks," Bert Sullam, filed Oct. 1, 2001; 57 pages.
USPTO U.S. Appl. No. 09/875,599: "Method and Apparatus for Programming a Flash Memory," Warren Snyder, filed Jun. 5, 2001; 23 pages.
USPTO U.S. Appl. No. 09/975,115: "In-System Chip Emulator Architecture," Snyder et al., filed Oct. 10, 2001; 38 pages.
USPTO U.S. Appl. No. 09/953,423: "A Configurable Input/Output Interface for a Microcontroller," Warren Snyder, filed Sep. 14, 2001; 28 pages.
USPTO U.S. Appl. No. 09/893,050: "Multiple Use of Microcontroller Pad," Kutz et al., filed Jun. 26, 2001; 21 pages.
USPTO U.S. Appl. No. 09/929,891: "Programming Architecture for a Programmable Analog System," Mar et al., filed Aug. 14, 2001; 82 pages.
USPTO U.S. Appl. No. 09/969,313: "Architecture for Synchronizing and Resetting Clock Signals Supplied to Multiple Analog Programmable Analog Blocks," Bert Sullam, filed on Oct. 1, 2001; 50 pages.
USPTO Non-Final Rejection for U.S. Appl. No. 09/994,601 dated Nov. 14, 2006; 15 pages.
USPTO Final Rejection for U.S. Appl. No. 09/994,601 dated Mar. 8, 2006; 11 pages.
USPTO Non-Final Rejection for U.S. Appl. No. 09/994,601 dated Sep. 21, 2005; 12 pages.
USPTO Final Rejection for U.S. Appl. No. 09/994,601 dated Mar. 24, 2005; 10 pages.
Hintz et al., "Microcontrollers", 1992, McGraw-Hill; 11 pages.
Ganapathy et al., "Hardware Emulation for Functional Verification of K5", Jun. 1996, 33rd Design Automation Conference Proceedings, Jun. 3-7, 1996; 4 pages.
The U.S. Appl. No. 60/243,708 "Advanced Programmable Microcontroller Device"; Snyder et al., filed Oct. 26, 2000; 277 pages.
"Webster's Third New International Dictionary", 1996, G. & C. Merriam Company; 3 pages (including pp. 1328-1329).
USPTO Advisory Action for U.S. Appl. No. 09/998,848 dated Sep. 7, 2005; 3 pages.
USPTO U.S. Appl. No. 09/957,084: "A Crystal-Less Oscillator with Trimmable Analog Current Control for Increased Stability," Mar et al., filed Sep. 19, 2001; 28 pages.
USPTO U.S. Appl. No. 10/011,214: "Method and Circuit for Synchronizing a Write Operation between an On-Chip Microprocessor and an On-Chip Programmable Analog Device Operating at Different Frequencies," Sullam et al., filed Oct. 25, 2001; 49 pages.
USPTO U.S. Appl. No. 09/972,319: "Method for Applying Instructions to Microprocessor in Test Mode," Warren Snyder, filed Oct. 5, 2001; 31 pages.
USPTO U.S. Appl. No. 09/972,003: "Test Architecture for Microcontroller Providing for a Serial Communication Interface," Warren Snyder, filed Oct. 5, 2001; 32 pages.
USPTO U.S. Appl. No. 09/972,133: "Method for Entering Circuit Test Mode," Warren Snyder, filed Oct. 5, 2001; 30 pages.
USPTO U.S. Appl. No. 09/973,535: "Architecture for Decimation Algorithm," Warren Snyder, filed Oct. 9, 2001; 26 pages.
USPTO U.S. Appl. No. 09/977,111: "A Frequency Doubler Circuit with Trimmable Current Control," Shutt et al., filed Oct. 11, 2001; 35 pages.
USPTO U.S. Appl. No. 10/272,231: "Digital Configurable Macro Architecture," Warren Snyder, filed Oct. 15, 2002; 36 pages.

USPTO U.S. Appl. No. 11/125,554:"A Method for a Efficient Supply to a Mcoconroler," Kutz et al., filed May 9, 2005; 1 page.
USPTO U.S. Appl. No. 09/855,868: "Protecting Access to Microcontroller Memory Blocks," Warren Snyder, filed May 14, 2001; 28 pages.
USPTO U.S. Appl. No. 09/887,923: "Novel Method and System for Interacting between a Processor and a Poweron Reset to Dynamically Control PowerStates in a Microcontroller" Kutz et al fied Jun. 22, 2001; 44 pages.
USPTO U.S. Appl. No. 10/000,383: "System and Method of Providing a Programmable Clock Architecture for an Advanced Microcontroller," Sullam et al., filed Oct. 24, 2001; 34 pages.
USPTO U.S. Appl. No. 10/001,477: "Breakpoint Control in an In-Circuit Emulation System," Roe et al., filed Nov. 1, 2001; 43 pages.
USPTO U.S. Appl. No. 10/004,197: "In-Circuit Emulator with Gatekeeper Based Halt Control," Nemecek et al., filed Nov. 14, 2001; 47 pages.
USPTO U.S. Appl. No. 10/004,039: "In-Circuit Emulator with Gatekeeper for Watchdog Timer," Nemecek et al., filed Nov. 14, 2001; 46 pages.
USPTO U.S. Appl. No. 10/002,217: "Conditional Branching in an In-Circuit Emulation System," Craig Nemecek, filed Nov. 1, 2001; 43 pages.
USPTO U.S. Appl. No. 10/001,568: "Combined In-Circuit Emulator and Programmer," Nemecek et al., filed Nov. 1, 2001; 47 pages.
USPTO U.S. Appl. No.10/001,478: "In-Cicut Emulator and POD Synchrnzed Boot," Nemecek et al., filed Nov. 1, 2001; 44 pages.
USPTO U.S. Appl. No. 09/887,955: "Novel Power on Reset Circuit for Microcontroller," Kutz et al., filed Jun. 22, 2001; 42 pages.
USPTO U.S. Appl. No. 09/826,397:"Method and Circuit for Allowing a Microprocessor to change its Operating Frequency on-the-Fly," Bert Sullam, filed Apr. 2, 2001; 24 pages.
USPTO U.S. Appl. No. 09/893,048: "A Microcontroller having an On-Chip High Gain Amplifier," Kutz et al., filed Jun. 26, 2001; 22 pages.
USPTO U.S. Appl. No. 09/912,768: "A Microcontroller having a Dual Mode Relax Oscillator that is Trimmable," James Shutt; filed Jul. 24, 2001; 33 pages.
USPTO U.S. Appl. No. 09/922,419: "A Power Supply Pump Circuit for a Microcontroller," Kutz et al., filed Aug. 3, 2001; 38 pages.
USPTO U.S. Appl. No. 09/922,579:"Method for a Efficient Supply to a Microcontroller," Kutz et al., filed Aug. 3, 2001; 37 pages.
USPTO U.S. Appl. No. 09/923,461: "Non-Interfering Multiply-Mac (Multiply Accumulate) Circuit," Warren Snyder, filed Aug. 6, 2001; 25 pages.
USPTO Appl. No. 09/935,454: "Method and Apparatus for Local and Global Power Management in a Programmable Analog Circuit," Monte Mar, filed Aug. 22, 2001; 51 pages.
Bursky, "FPGA Combines Multiple Interfaces and Logic," Electronic Design, vol. 48 No. 20, pp. 74-78 (Oct. 2, 2000); 5 pages.
Anonymous, "Warp Nine Engineering—The IEEE 1284 Experts—F/Port Product Sheet," undated web page found at http://www.fapo.com/fport.htm; printed on Apr. 12, 2005; 2 pages.
Anonymous, "F/Port:Fast Parallel Port for the PC Installation Manual" Release 7.1, circa 1997, available for download from http://www.fapo.com/fport.htm; 25 pages.
Nam et al.; "Fast Development of Source-Level Debugging System Using Hardware Emulation"; IEEE 2000; 4 pages.
Huang et al.; "Iceberg: An Embedded In-Cicuit Emulator Synthesizer for Microcontrollers"; ACM 1999; 6 pages.
Khan et al.; "FPGA Architectures for Asic Hardware Emulators"; IEEE 1993; 5 pages.
Oh et al.; Emulator Environment Based on an FPGA Prototyping Board; IEEE Jun. 21-23, 2000; 6 pages.
Hong et al.; "An FPGA-Based Hardware Emulator for Fast Fault Emulation"; IEEE 1997; 4 pages.
Chng et al.; "An In-Curcuit-Emulator for TMS320C25";IEEE1994; 6 pages.
Pastermak et al.; "In-Circuit-Emulation in ASIC Architecture Core Designs"; IEEE 1989; 4 pages.
Melear; "Using Background Modes for Testing, Debugging and Emulation of Microcontrollers"; IEEE 1997; 8 pages.

Walters, Stephen; "Computer-Aided Prototyping for ASIC-Based Systems", 1991, IEEE Design & Test of Computers; vol. 8, Issue 2; 8 pages.
Anonymous; "JEENI JTAG EmbeddedICE Ethernet Interface"; Aug. 1999; Embedded Performance, Inc.; 3 pages.
Sedory; "A Guide to Debug"; 2004; retrieved on May 20, 2005; 7 pages.
"Microsoft Files Summary Judgement Motions"; Feb. 1999; Microsoft PressPass; retrieved on May 20, 2005 from http://www.microsoft.com/presspass/press/1999/feb99/Feb99/Calderapr.asp; 3 pages.
Xerox; "Mesa Debugger Documentation"; Apr. 1979; Xerox Systems Development Department; Version 5.0; 33 pages.
Sallman et al.; "Debugg with GGDB the GNU Souce-LeveL Debugger";Jan. 1994; retrieved on May 2, 2005 from http;/www.cs.utah.edu; 4 pages.
Wikipedia.org; "Von Neumann architecture"; retrieved from http://en.wikipedia.org/wiki/Von_Neumann_architecture on Jan. 22, 2007; 4 pages.
Stan Augarten; "The Chip Collection—Introduction—Smithsonian Institute"; "State of the Art"; "The First 256-Bit Static RAM"; retrieved on Nov. 14, 2005 from http://smithsonianchips.si.edu/augarten/p24.htm; 2 pages.
"POD—Piece of Data, Plain Old Documentation, Plain Old Dos . . ."; retrieved on Nov. 14, 2005 from http://www. auditmypc.com/acronym/POD.asp; 2 pages.
USPTO Non-Final Rejection for U.S. Appl. No. 09/989,767 dated Oct. 6, 2004; 15 pages.
USPTO Final Rejection for U.S. Appl. No. 09/989,771 dated 02/27/07; 8 pages.
USPTO Final Rejection for U.S. Appl. No. 09/989,771 dated Mar. 28, 2006 ; 9 pages.
USPTO Final Rejection for U.S. Appl. No. 09/989,771 dated Apr. 6, 2005; 7 pages.
USPTO Final Rejection for U.S. Appl. No. 09/989,771 dated Dec. 10, 2008; 12 pages.
USPTO Final Rejection for U.S. Appl. No. 09/989,771 dated Dec. 27, 2007; 15 pages.
USPTO Non-Final Rejection for U.S. Appl. No. 09/989,771 dated May 28, 2008; 14 pages.
USPTO Non-Final Rejection for U.S. Appl. No. 09/989,771 dated Jul. 16, 2007; 14 pages.
USPTO Non-Final Rejection for U.S. Appl. No. 09/989,771 dated Aug. 23, 2006; 7 pages.
USPTO Non-Final Rejection for U.S. Appl. No. 09/989,771 dated Sep. 12, 2005; 7 pages.
USPTO Non-Final Rejection for U.S. Appl. No. 09/989,771 dated Sep. 22, 2004; 7 pages.
USPTO Final Rejection for U.S. Appl. No. 09/989,765 dated Apr. 3, 2007; 12 pages.
USPTO Final Rejection for U.S. Appl. No. 09/989,765 dated Apr. 4, 2008; 16 pages.
USPTO Final Rejection for U.S. Appl. No. 09/989,765 dated Apr. 17, 2008; 12 pages.
USPTO Non-Final Rejection for U.S. Appl. No. 09/989,765 dated Sep. 19, 2007; 14 pages.
USPTO Non-Final Rejection for U.S. Appl. No. 09/989,765 dated Sep. 26, 2008; 17 pages.
USPTO Non-Final Rejection for U.S. Appl. No. 09/989,765 dated Oct. 2, 2006; 13 pages.
USPTO Non-Final Rejection for U.S. Appl. No. 09/989,765 dated Oct. 5, 2005; 9 pages.
USPTO Final Rejection for U.S. Appl. No. 09/989,782 dated Jul. 9, 2008; 10 pages.
USPTO Final Rejection for U.S. Appl. No. 09/989,782 dated Jul. 24, 2007; 9 pages.
USPTO Final Rejection for U.S. Appl. No. 09/989,782 dated Sep. 21, 2006; 10 pages.
USPTO Final Rejection for U.S. Appl. No. 09/989,782 dated Nov. 3, 2005; 11 pages.
USPTO Non-Final Rejection for U.S. Appl. No. 09/989,782 dated Jan. 29, 2007; 9 pages.

USPTO Non-Final Rejection for U.S. Appl. No. 09/989,782 dated Mar. 28, 2006; 8 pages.
USPTO Non-Final Rejection for U.S. Appl. No. 09/989,782 dated Apr. 28, 2005; 11 pages.
USPTO Non-Final Rejection for U.S. Appl. No. 09/989,782 dated Oct. 6, 2004: 11 pages.
USPTO Non-Final Rejection for U.S. Appl. No. 09/989,782 dated Nov. 28, 2008; 10 pages.
USPTO Non-Final Rejection for U.S. Appl. No. 09/989,782 dated Dec. 14, 2007; 8 pages.
USPTO Final Rejection for U.S. Appl. No. 09/989,765 dated Mar. 31, 2009; 18 pages.
USPTO Final Rejection for U.S. Appl. No. 09/989,778 dated Mar. 16, 2009; 26 pages.
"Pod-Wikipedia, the free encyclopedia"; retrieved on Nov. 14, 2005 from http://en.wikipedia.org/wiki/Pod; 3 pages.
"pod-defintion by dict.die.net"; retrieved on Nov. 14, 2005 from http://dict.die.net/pod; 2 pages.
"In-Curcuit Emulators—descriptions of the major ICEs around"; retrieved on Nov. 14, 2005 from http://www. algonet.se/~staffann/developer/emulator.htm; 6 pages.
USPTO U.S. Appl. No. 09/975,104: "Capturing Test/Emulation and Enabling Real-Time Debugging Using FPGA for In-Circuit Emulation," Warren Snyder, filed on Oct. 10, 2001; 35 pages.
USPTO Non-Final Rejection for 09/989,767 dated Jul. 24, 2008; 21 pages.
Anonymous; "Using Debug"; 1999; Prentice-Hall Publishing; 20 pages.
Harrison et al.; "Xilinx FPGA Desgn in a Goup Envronment Usng VHDS and Synthesis Toos";Coloquium on Digital System Design Using Synthesis Techniques; Feb. 15, 1996; 4 pages.
Microsoft Press Computer User's Dictionary; 1998; 3 pages (including p. 18).
Sreeram Duvvuru and Siamak Arya, "Evaluation of a Branch Target Address Cache," 1995; IEEE; 8 pages.
Andrew S. Tanenbaum with contributions from James R. Goodman, "Structured Computer Organization," 1999, Prentice Hall, Fourth Edition; 32 pages.
USPTO U.S. Appl. No. 09/975,338: "Method for Breaking Execution of a Test Code in DUT and Emulator Chip Essentially Simultaneously and Handling Complex Breakpoint Events," Nemecek et al., filed Dec. 10, 2001; 34 pages.
USPTO U.S. Appl. No. 09/975,030: "Emulator Chip-Board Architecture for Interface," Snyder et al., filed on Oct. 10, 2001; 37 pages.
Wikipedia—Main Page, retrieved on Mar. 8, 2006 from http://en. wikipedia.org/wiki/Main_Page and http://en.wikipedia. org/wiki/Wikipedia:Introduction; 5 pages.
Wikipedia—Processor register, retrieved on Mar. 7, 2006 from http://en.wikipedia.org/wiki/Processor_register; 4 pages.
Jonathan B. Rosenburg, "How Debuggers Work" John Wiley & Sons, Inc. 1996; 259 pages.
Dah et al.; "Emulation of the Sparcle microprocessor with the MIT Vrual Wires Emulaton Sysem";1994; IEEE; 9 pages.
Bauer et al.; "A Reconfigurable Logic Machine for Fast Event-Driven Simulation"; Jun. 1998; Design Automation Conference Proceedings; 8 pages.
USPTO U.S. Appl. No. 09/975,105 "Host to FPGA Interface in an In-Circuit Emulation System," Craig Nemecek, filed Oct. 10, 2001; 44 pages.
USPTO Advisory Action for U.S. Appl. No. 09/994,601 dated May 23, 2006; 3 pages.
USPTO Non-Final Rejection for U.S. Appl. No. 09/994,601 dated Jul. 29, 2004; 10 pages.
USPTO Ex Parte Qualyle Action for U.S. Appl. No. 09/992,076 dated Jun. 18, 2007; 6 pages.
USPTO Non-Final Rejection for U.S. Appl. No. 09/989,767 dated Jul. 2, 2007; 22 pages.
USPTO Notice of Allowance for U.S. Appl. No. 09/992,076 dated Mar. 26, 2008; 23 pages.
USPTO Notice of Allowance for U.S. Appl. No. 09/992,076 dated Jul. 29, 2008; 6 pages.
UPSTO Advisory Action for U.S. Appl. No. 09/989,778 dated May 15, 2006; 4 pages.

USPTO Final Rejection for U.S. Appl. No. 09/989,778 dated Jan. 8, 2009; 25 pages.
USPTO Final Rejection for U.S. Appl. No. 09/989,778 dated Feb. 5, 2007; 17 pages.
USPTO Final Rejection for U.S. Appl. No. 09/989,778 dated Feb. 15, 2006; 9 pages.
USPTO Final Rejection for U.S. Appl. No. 09/989,778 dated Dec. 20, 2007; 14 pages.
USPTO Non-Final Rejection for U.S. Appl. No. 09/989,778 dated Mar. 29, 2005; 14 pages.
USPTO Non-Final Rejection for U.S. Appl. No. 09/989,778 dated Jul. 14, 2008; 24 pages.
USPTO Non-Final Rejection for U.S. Appl. No. 09/989,778 dated Jul. 19, 2007; 18 pages.
USPTO Non-Final Rejection for U.S. Appl. No. 09/989,778 dated Sep. 1, 2005; 10 pages.
USPTO Non-Final Rejection for U.S. Appl. No. 09/989,778 dated Sep. 18, 2006; 11 pages.
USPTO Final Rejection for U.S. Appl. No. 09/998,848 dated Jun. 14, 2005 ; 17 pages.
USPTO Final Rejection for U.S. Appl. No. 09/998,848 dated Jul. 25, 2006; 16 pages.
USPTO Final Rejection for U.S. Appl. No. 09/998,848 dated Aug. 10, 2007; 14 pages.
USPTO Final Rejection for U.S. Appl. No. 09/998,848 dated Nov. 24, 2008; 15 pages.
USPTO Non-Final Rejection for U.S. Appl. No. 09/998,848 dated Jan. 26, 2006; 17 pages.
USPTO Non-Final Rejection for U.S. Appl. No. 09/998,848 dated Jan. 29, 2007; 13 pages.
USPTO Non-Final Rejection for U.S. Appl. No. 09/998,848 dated Jan. 22, 2008; 15 pages.
USPTO Non-Final Rejection for U.S. Appl. No. 09/998,848 dated Dec. 21, 2004; 14 pages.
USPTO Final Rejection for U.S. Appl. No. 09/989,767 dated Jan. 11, 2007; 12 pages.
USPTO Final Rejection for U.S. Appl. No. 09/989,767 dated Jan. 15, 2009; 21 pages.
USPTO Final Rejection for U.S. Appl. No. 09/989,767 dated Mar. 6, 2006; 15 pages.
USPTO Final Rejection for U.S. Appl. No. 09/989,767 dated Apr. 6, 2005; 13 pages.
USPTO Final Rejection for U.S. Appl. No. 09/989,767 dated Dec. 27, 2007; 21 pages.
USPTO Non-Final Rejection for U.S. App. No. 09/989,767 dated Jul. 17, 2006; 12 pages.
USPTO Notice of Allowance for U.S. Appl. 09/992,076 dated Nov. 13, 2008; 15 pages.
USPTO Final Rejection for U.S. Appl. No. 09/994,601 dated May 18, 2007; 17 pages.
USPTO Notice of Allowance for U.S. Appl. No. 09/992,076 dated Nov. 29, 2007; 8 pages.
USPTO Final Rejection for U.S. Appl. 09/992,076 dated Jan. 30, 2007; 32 pages.
USPTO Non-Final Rejection for U.S. Appl. No. 09/992,076 dated Aug. 10, 2006; 19 pages.
USPTO Final Rejection for U.S. Appl. No. 09/992,076 dated Mar. 17, 2006; 16 pages.
USPTO Non-Final Rejection for U.S. Appl. No. 09/992,076 dated Nov. 21, 2005; 29 pages.
USPTO Non-Final Rejection for U.S. Appl. No. 09/992,076 dated Jun. 1, 2005; 20 pages.
USPTO Notice of Allowance for U.S. Appl. 09/994,600 dated Nov. 12, 2008; 35 pages.
USPTO Notice of Allowance for U.S. Appl. No. 09/994,600 dated May 14, 2008; 22 pages.
USPTO Final Rejection for U.S. Appl. No. 09/994,600 dated Oct. 17, 2007; 13 pages.
USPTO Non-Final Rejection for 09/994,600 dated May 15, 2007; 14 pages.
USPTO Final Rejection for U.S. Appl. 09/994,600 dated Dec. 8, 2006; 14 pages.

USPTO Non-Final Rejection for U.S. Appl. No. 09/994,600 dated Jul. 17, 2006; 14 pages.
USPTO Final Rejection for U.S. Appl. 09/994,600 dated Feb. 13, 2006; 13 pages.
USPTO Non-Final Rejection for U.S. Appl. No. 09/994,600 (CD01174) dated Aug. 23, 2005; 13 pages.
USPTO Final Rejection for U.S. Appl. No. 09/994,600 dated May 4, 2005; 16 pages.
USPTO Non-Final Rejection for U.S. Appl. No. 09/994,600 dated Oct. 21, 2004; 37 pages.
USPTO Notice of Allowance for U.S. Appl. 10/001,477 dated Nov. 10, 2008; 7 pages.
USPTO Final Rejection for U.S. Appl. No.10/001,477 dated Jun. 30, 2008; 19 pages.
USPTO Non-Final Rejection for U.S. Appl. No. 10/001,477 dated Dec. 6, 2007; 17 pages.
USPTO Final Rejection for U.S. Appl. No. 10/001,477 dated Jul. 23, 2007; 19 pages.
USPTO Non-Final Rejection for U.S. Appl. No. 10/001,477 dated Jan. 22, 2007; 17 pages.
USPTO Final Rejection for U.S. Appl. No. 10/001,477 dated Aug. 24, 2006; 15 pages.
USPTO Non-Final Rejection for U.S. Appl. No. 10/001,477 dated Mar. 2, 2006; 17 pages.
USPTO Final Rejection for U.S. Appl. No. 10/001,477 dated Oct. 24, 2005; 18 pages.
USPTO Non-Final Rejection for U.S. Appl. No. 10/001,477 dated May 11, 2005; 31 pages.
Ito, Sergio Akira and Carro, Luigi; "A Comparison of Microcontrollers Targeted to FPGA-Based Embedded Applications", Sep. 2000, Proceedings of 13th Symposium on Integrated Circuits and Systems Design, Sep. 18-24, 2000; 6 pages.
Julio Faura et al.; "A Novel Mixed Signal Programmable Device With On-Chip Microprocessor", 1997, IEEE 1997 Custom Integrated Circuits Conference; 4 pages.
Monte Mar, Bert Sullam, Eric Blom; "An architecture for a configurable Mixed-signal device", 2003, IEEE Journal of Solid-State Circuits, vol. 3; 4 pages.
Robinson, Gordon D; "Why 1149.1 (JTAG) Really Works", May 1994, Conference Proceedings Electro/94 International, May 10-12, 1994, Combined Volumes: 6 pages.
USPTO Non-Final Rejection for U.S. Appl. No. 09/994,601 dated Oct. 4, 2007; 20 pages.
"PSoC designer: Integrated development environment, getting started 25-minute tutorial, version 1.0", Cypress Microsystems., Cypress Microsystems, Inc. CMS10006A, Jul. 3, 2001; 25 pages.
"PSoC technology complete changes 8-bit MCU system design", Cypress Microsystems, Inc. retrieved from <http>:// www.archive.org/web/20010219005250/http://cypressmicro.com- /t...>, Feb. 19, 2001; 21 pages.
Specks et al., "A Mixed Digital-Analog 16B Microcontroller with 0.5MB Flash Memory, On-Chip Power Supply, Physical Newok Interface, and 40V I/0 for Automotive Single-Chip Mechatronics," IEEE, Feb. 9, 2000; 1 page.
Hsieh et al., "Modeling Micro-Controller Peripherals for High-Level Co-Simulation and Synthesis," IEEE, 1997; 4 pages.
USPTO Notice of Allowance for U.S. Appl. No. 09/989,777 dated Nov. 4, 2008; 3 pages.
USPTO Notice of Allowance for U.S. Appl. No. 09/989,777 dated Sep. 15, 2008; 28 pages.
USPTO Notice of Allowance for U.S. Appl. No. 09/989,777 dated Jul. 7, 2008; 23 pages.
USPTO Final Rejection for U.S. Appl. No. 09/989,777 dated Jan. 30, 2008; 14 pages.
USPTO Non-Final Rejection for U.S. Appl. No. 09/989,777 dated Sep. 11, 2007; 18 pages.
USPTO Final Rejection for U.S. Appl. No. 09/989,777 dated Mar. 13, 2007; 24 pages.
USPTO Non-Final Rejection for U.S. Appl. No. 09/989,777 dated Sep. 13, 2006; 18 pages.
USPTO Non-Final Rejection for U.S. Appl. No. 09/989,777 dated Apr. 11, 2006: 21 pages.
USPTO Final Rejection for U.S. Appl. No. 09/989,777 dated Dec. 21, 2005; 29 pages.
USPTO Non-Final Rejection for U.S. Appl. No. 09/989,777 dated Jul. 5, 2005; 36 pages.
USPTO Notice of Allowance for U.S. Appl. No. 09/994,601 dated Dec. 22, 2008; 15 pages.
USPTO Final Rejection for U.S. Appl. No. 09/994,601 dated Apr. 17, 2008; 24 pages.
USPTO U.S. Appl. No. 10/033,027: "Microcontrollable Programmable System on a Chip," Warren Snyder; filed Dec. 22, 2001; 117 pages.
USPTO U.S. Appl. No. 10/803,030: "Programmable Microcontrollable Architecture (Mixed Analog/ Digital)," Snyder et al., filed Mar. 16, 2004; 13 pages.
USPTO Notice of Allowance for U.S. Appl. No. 09/930,021 dated Nov. 26, 2004; 4 pages.
USPTO Final Rejection for U.S. Appl. No. 09/930,021 dated Aug. 31, 2004; 8 pages.
USPTO Non-Final Rejection for U.S. Appl. No. 09/930,021 dated Apr. 26, 2004; 6 pages.
USPTO Miscellaneous Action with Ssp for U.S. Appl. No. 09/930,021dated Oct. 1, 2001; 1 page.
USPTO Notice of Allowance for U.S. Appl. No. 09/953,423 dated Jul. 12, 2004; 6 pages.
Uspto Non-Final Rejection for U.S. Appl. No. 09/953,423 dated Feb. 6, 2004; 5 pages.
USPTO Notice of Allowance for U.S. Appl. No. 09/957,084 dated May 18, 2004; 5 pages.
USPTO Final Rejection for U.S. Appl. No. 09/957,084 dated Jan. 29, 2004; 8 pages.
USPTO Non-Final Rejection for U.S. Appl. No. 09/957,084 dated Aug. 27, 2003; 8 pages.
USPTO Final Rejection for U.S. Appl. No. 09/957,084 dated Apr. 23, 2003; 8 pages.
USPTO Non-Final Rejection for U.S. Appl. No. 09/957,084 dated Aug. 23, 2002; 6 pages.
USPTO Notice of Allowance for U.S. Appl. No. 09/969,313 dated Oct. 04, 2005; 6 pages.
USPTO Non-Final Rejection for U.S. Appl. No. 09/969,313 dated May 6, 2005; 9 pages.
USPTO Requirement for Restriction/Election for U.S. Appl. No. 09/969,313 dated Mar. 18, 2005; 6 pages.
USPTO Notice of Allowance for U.S. Appl. No. 09/969,311 dated Mar. 1, 2005; 4 pages.
USPTO Non-Final Rejection for U.S. Appl. No. 09/969,311 dated Sep. 21, 2004; 4 pages.
USPTO Advisory Action for U.S. Appl. No. 09/969,311 dated Jul. 21, 2003; 2 pages.
USPTO Final Rejection for U.S. Appl. No. 09/969,311 dated Apr. 7, 2003; 7 pages.
USPTO Non-Final Rejection for U.S. Appl. No. 09/969,311 dated Nov. 06, 2002; 8 pages.
USPTO Notice of Allowance for U.S. Appl. No. 09/972,319 dated Dec. 30, 2004; 4 pages.
USPTO Non-Final Rejection for U.S. Appl. No. 09/972,319 dated Sep. 16, 2004; 9 pages.
USPTO Notice of Allowance for U.S. Appl. No. 09/972,003 dated Jul. 14, 2004; 4 pages.
USPTO Requirement for Restriction/Election for U.S. Appl. No. 09/972,003 dated May 6, 2004; 4 pages.
USPTO Non-Final Rejection for U.S. Appl. No. 09/972,003 dated Feb. 2, 2004; 10 pages.
USPTO Non-Final Rejection for U.S. Appl. No. 09/972,003 dated Aug. 19, 2003; 11 pages.
USPTO Notice of Allowance for U.S. Appl. No. 09/972,133 dated Jun. 9, 2006; 6 pages.
USPTO Final Rejection for U.S. Appl. No. 09/972,133 dated Mar. 30, 2006; 8 pages.
USPTO Non-Final Rejection for U.S. Appl. No. 09/972,133 dated Nov. 25, 2005; 9 pages.
USPTO Advisory Action for U.S. Appl. No. 09/972,133 dated Aug. 31, 2005; 3 pages.

USPTO Final Rejection for U.S. Appl. No. 09/972,133 dated Jun. 29, 2005; 10 pages,
USPTO Non-Final Rejection for U.S. Appl. No. 09/972,133 dated Mar. 8, 2005; 9 pages.
USPO Notice of Allowance for U.S. Appl. No. 09/975,104 dated Oct. 19, 2006; 6 pages.
USPTO Non-Final Rejection for U.S. Appl. No. 09/975,104 dated Jun. 16, 2006; 8 pages.
USPTO Final Rejection for U.S. Appl. No. 09/975,104 dated Feb. 15, 2006; 7 pages.
USPTO Non-Final Rejection for U.S. Appl. No. 09/975,104 dated Aug. 16, 2005; 6 pages.
USPTO Non-Final Rejection for U.S. Appl. No. 09/975,104 dated Mar. 21, 2005; 7 pages.
USPTO Notice of Allowance for U.S. Appl. No. 09/975,030 dated Feb. 6, 2006; 7 pages.
USPTO Non-Final Rejection for U.S. Appl. No. 09/975,030 dated Oct. 20, 2005; 7 pages.
USPTO Non-Final Rejection for U.S. Appl. No. 09/975,030 dated Mar. 29, 2005; 13 pages.
USPTO Notice of Allowance for U.S. Appl. No. 09/977,111 dated Sep. 28, 2006; 6 pages.
USPTO Notice of Allowance for U.S. Appl. No. 10/272,231 dated Mar. 8, 2004; 6 pages.
USPTO Final Rejection for U.S. Appl. No. 10/272,231 dated Nov. 5, 2003; pages.
USPTO Non-Final Rejection for U.S. Appl. No. 10/272,231 dated Jul. 14, 2003; 6 pages.
USPTO Notice of Allowance for U.S. Appl. No. 11/125,554 dated Feb. 7, 2008; 4 pages.
USPTO Notice of Allowance for U.S. Appl. No. 11/125,554 dated Apr. 24, 2007; 7 pages.
USPTO Non-Final Rejection for U.S. Appl. No. 11/125,554 dated Dec. 11, 2006; 9 pages.
USPTO Notice of Allowance for U.S. Appl. No. 09/855,868 dated Apr. 25, 2005; 6 pages.
USPTO Non-Final Rejection for U.S. Appl. No. 09/855,868 dated Aug. 26, 2004; 7 pages.
USPTO Notice of Allowance for U.S. Appl. No. 09/887,923 dated Sep. 27, 2004; 5 pages.
USPTO Non-Final Rejection for U.S. Appl. No. 09/887,923 dated May 25, 2004; 7 pages.
USPTO Notice of Allowance for U.S. Appl. No. 09/875,599 dated Oct. 17, 2006; 4 pages.
USPTO Non-Final Rejection for U.S. Appl. No. 09/875,599 dated May 31, 2006; 18 pages.
USPTO Final Rejection for U.S. Appl. No. 09/875,599 dated Feb. 15, 2006; 18 pages.
USPTO Final Rejection for U.S. Appl. No. 09/875,599 dated Nov. 21, 2005; 16 pages.
USPTO Advisory Action for U.S. Appl. No. 09/875,599 dated Jun. 8, 2005; 3 pages.
USPTO Final Rejection for U.S. Appl. No. 09/875,599 dated Mar. 29, 2005; 20 pages.
USPTO Non-Final Rejection for U.S. Appl. No. 09/875,599 dated Dec. 3, 2004; 16 pages.
USPTO Final Rejection for U.S. Appl. No. 09/875,599 dated Aug. 25, 2004; 17 pages.
USPTO Final Rejection for U.S. Appl. No. 09/875,599 dated Apr. 26, 2004; 15 pages.
USPTO Non-Final Rejection for U.S. Appl. No. 09/875,599 dated Oct. 27, 2003; 13 pages.
USPTO Notice of Allowance for U.S. Appl. No. 10/004,197 dated Feb. 9, 2007; 7 pages.
USPTO Notice of Allowance for U.S. Appl. No. 10/004,197 dated Oct. 6, 2006; 7 pages.
USPTO Non-Final Rejection for U.S. Appl. No. 10/004,197 dated Apr. 3, 2006; 13 pages.
USPTO Final Rejection for U.S. Appl. No. 10/004,197 dated Nov. 23, 2005; 17 pages.
USPTO Non-Final Rejection for U.S. Appl. No. 10/004,197 dated Jun. 6, 2005; 21 pages.
USPTO Notice of Allowance for U.S. Appl. No. 10/004,039 dated Aug. 15, 2006; 7 pages.
USPTO Non-Final Rejection for U.S. Appl. No. 10/004,039 dated Apr. 11, 2006; 14 pages.
USPTO Final Rejection for U.S. Appl. No. 10/004,039 dated Nov. 22, 2005; 19 pages.
USPTO Non-Final Rejection for U.S. Appl. No. 10/004,039 dated Jun. 6, 2005; 17 pages
USPTO Notice of Allowance for U.S. Appl. No. 10/001,568 dated Mar. 17, 2006; 9 pages.
USPTO Final Rejection for U.S. Appl. No. 10/001,568 dated Oct. 26, 2005; 16 pages.
USPTO Non-Final Rejection for U.S. Appl. No. 10/001,568 dated May 19, 2005; 16 pages.
USPTO Notice of Allowance for U.S. Appl. No. 09/887,955 dated Oct. 12, 2004; 5 pages.
USPTO Non-Final Rejection for U.S. Appl. No. 09/887,955 dated May 26, 2004; 5 pages.
USPTO Notice of Allowance for U.S. Appl. No. 09/826,397 dated Oct. 7, 2004; 8 pages.
USPTO Non-Final Rejection for U.S. Appl. No. 09/826,397 dated Apr. 21, 2004; 6 pages.
USPTO Notice of Allowance for U.S. Appl. No. 09/893,048 dated Jul. 25, 2006; 4 pages.
USPTO Non-Final Rejection for U.S. Appl. No. 09/893,048 dated Jan. 12, 2006; 6 pages.
USPTO Non-Final Rejection for U.S. Appl. No. 09/893,048 dated Jul. 27, 2005; 6 pages.
USPTO Non-Final Rejection for U.S. Appl. No. 09/893,048 dated Oct. 6, 2004; 5 pages.
USPTO Notice of Allowance for U.S. Appl. No. 09/893,050 dated Jul. 5, 2005; 6 pages.
USPTO Non-Final Rejection for U.S. Appl. No. 09/893,050 dated Jan. 5, 2005; 13 pages.
USPTO Final Rejection for U.S. Appl. No. 09/893,050 dated Aug. 30, 2004; 13 pages.
USPTO Non-Final Rejection for U.S. Appl. No. 09/893,050 dated Jan. 15, 2004; 9 pages.
USPTO Notice of Allowance for U.S. Appl. No. 09/909,047 dated May 11, 2005; 25 pages.
USPTO Notice of Allowance for U.S. Appl. No. 09/909,047 dated Feb. 15, 2005; 6 pages.
USPTO Non-Final Rejection for U.S. Appl. No. 09/909,047 dated Jul. 6, 2004; 9 pages.
USPTO Notice of Allowance for U.S. Appl. No. 09/912,768 dated Sep. 13, 2005; 5 pages.
USPTO Non-Final Rejection for U.S. Appl. No. 09/912,768 dated Apr. 11, 2005; 14 pages.
USPTO Final Rejection for U.S. Appl. No. 09/912,768 dated Nov. 17, 2004; 13 pages.
USPTO Non-Final Rejection for U.S. Appl. No. 09/912,768 dated Jun. 22, 2004; 11 pages.
USPTO Notice of Allowance for U.S. Appl. No. 09/922,579, dated Dec. 28, 2004; 6 pages.
USPTO Non-Final Rejection for U.S. Appl. No. 09/922,579 dated Aug. 18, 2004; 6 pages.
USPTO Notice of Allowance for U.S. Appl. No. 09/923,461 dated May 12, 2005; 6 pages.
USPTO Non-Final Rejection for U.S. Appl. No. 09/923,461 dated Jul. 16, 2004; 6 pages.
USPTO Notice of Allowance for U.S. Appl. No. 09/929,891 dated Dec. 23, 2005; 4 pages.
USPTO Notice of Allowance for U.S. Appl. No. 09/929,891 dated Jun. 15, 2005; 6 pages.
USPTO Non-Final Rejection for U.S. Appl. No. 09/929,891 dated Sep. 13, 2004; 6 pages.
USPTO Notice of Allowance for U.S. Appl. No. 10/011,214 dated Apr. 11, 2005; 4 pages.
USPTO Final Rejection for U.S. Appl. No. 10/011,214 dated Jan. 21, 2005; 8 pages.
USPTO Non-Final Rejection for U.S. Appl. No. 10/011,214 dated Aug. 13, 2004; 10 pages.

Hong et al., "Hierarchial System Test by an IEEE 1149.5 MTM-Bus Slave-Module Interface Core," IEEE, 2000; 14 pages.
Haberl et al., "Self Testable Boards with Standard IEEE 1149.5 Module Test and Maintenance (MTM) Bus Interface," IEEE, 1994; 6 pages.
Varma et al., "A Structured Test Re-Use Methodology for Core-Based System Chips," IEEE, 1998; 9 pages.
Andrews, "Roadmap for Extending IEEE 1149.1 for Hierarchical Control of Locally-Stored, Standardized command Set, Test Programs," IEEE, 1994; 7 pages.
Adham et al., "Preliminary Outline of the IEEE P1500 Scalable Architecture for Testing Embedded Cores," 1999, IEEE; 6 pages.
Ghoshta "A Low Overhed Desgn for Tesablity and Tes Generaton Technique for core-based Sysems," IEEE, 1997; 10 pages.
Zorian, "Test Requirements for Embedded Core-based Systems and IEEE P1500," IEEE, 1997; 9 pages.
Zorian et al., "Testing Embedded-Core Based System Chips," IEEE, 1998; 14 pages.
Papachristou et al., "Microprocessor Based Testing for Core-Based System on a Chip," IEEE, 1999; 6 pages.
Maroufi et al., "Solving the I/O Bandwidth Problem in System on a Chip Testing," IEEE, 2000; 6 pages.
Marsh, "Smart Tools Illuminate Deeply Embedded Systems," EDN, 2000; 7 pages.
York et al., "On-chip Support Needed for SOC Debug," Electronic Engineering Times, 1999; 2 pages.
Atmel Corporation: AT9OSC Summary: "Secure Microcontrollers for Smart Cards," 1999; 7 pages.
Hwang et al., "integrated circuit for automatically varying resistance in computer system, has pair of transistors connected in parallel with respective resistors such that resistors are bypassed when corresponding transistors are enabled," Derwent Information LTD; 2002; 2 pages.
Morrison, "IBM Eyes Merchant Packaging Services," Jul. 13, 1998; Electronic News <http://www.findarticles.com>; 4 pages.
Charles, Jr et al., "VHDL Wirebonding: Reinventing the Process for MCMs," Apr. 1998; IEEE 7th International Conference on Multichip Modules and High Density Packaging; 3 pages.
Tran et al., "Fine Pitch and Wirebonding and Reliability of Aluminum Capped Copper Bond Pads," May 2000, IEEE Electronic Components and Technology Conference; 8 pages.
Song et al., "A 50% Power Reduction Scheme for CMOS Relaxation Oscillator," IEEE, 1999; 4 pages.
"Electronic Circuit Protector-Circuit Breaker;" IBM Technical Disclosure Bulletin; vol. 36, Issue 8, Aug. 1, 1993; 1 page.
USPTO Notice of Allowance for U.S. Appl. No. 09/992,076 dated Feb. 27, 2009; 6 pages.
USPTO Non-Final Rejection for U.S. Appl. No. 09/989,771 dated Apr. 30, 2009; 11 pages.
USPTO Notice of Allowance for U.S. Appl. No. 09/989,762 dated Mar. 25, 2009; 7 pages.
USPTO Notice of Allowance for U.S. Appl. No. 09/989,762 dated Oct. 24, 2008; 7 pages.
USPTO U.S. Appl. No. 09/989,815: "A Data Driven Method and System for Monitoring Hardware Resource Usage for Programming an Electric Device," Bath et al., filed Nov. 19, 2001; 36 pages.
USPTO Notice of Allowance for U.S. Appl. No. 09/989,762 dated Jun. 2, 2008; 6 pages.
USPTO Notice of Allowance for U.S. Appl. No. 09/989,762 dated Jan. 2, 2008; 6 pages.
USPTO Non-Final Rejection for U.S. Appl. No. 09/989,762 dated Jul. 23, 2007; 15 pages.
USPTO Final Rejection for U.S. Appl. No. 09/989,762 dated Jan. 26, 2007; 13 pages.
USPTO Non-Final Rejection for U.S. Appl. No. 09/989,762 dated Aug. 10, 2006; 18 pages.
USPTO Final Rejection for U.S. Appl. No. 09/989,762 dated Mar. 14, 2006; 19 pages.
USPTO Non-Final Rejection for U.S. Appl. No. 09/989,762 dated Jul. 27, 2005; 15 pages.
USPTO U.S. Appl. No. 09/275,336: "Programmable Oscillator Scheme," Mar et al., filed Mar. 24, 1999; 25 pages.

USPTO U.S. Appl. No. 09/721,316: "Programmable Oscillator Scheme," Mar et al., filed Nov. 22, 2000; 26 pages.
USPTO U.S. Appl. No. 10324,455: "Pogrammable Oscillator Scheme," Mar et al., filed Dec. 20, 2002; 23 pages.
USPTO U.S. Appl. No. 09/998,859: "A System and a Method for Checking Lock Step Consistency between in Circuit Emulation and a Microcontroller while Debugging Process is in Progress," Craig Nemecek, filed Nov. 15, 2001; 33 pages.
USPTO U.S. Appl. No. 09/998,834: "A System and a Method for Communication between and Ice and a Production Microcontroller while in a Halt State," Craig Nemecek, filed Nov. 15, 2001; 33 pages.
USPTO U.S. Appl. No. 10/113,065: "System and Method for Automatically Matching Components in a Debugging System," Nemecek et al., filed on Mar. 29, 2002; 32 pages.
USPTO U.S. Appl. No. 09/989,574: "Method and System for using a Graphics user Interface for Programming an Electronic Device," Bartz et al., filed Nov. 19, 2001; 43 pages.
USPTO U.S. Appl. No. 09/989,816: "Datasheet Browsing and Creation with Data-Driven Datasheet Tabs within a Microcontroller Design Tool," Bartz et al., filed Nov. 19, 2001; 55 pages.
"New Object Domain R3 Beta Now Available (Build 134)!" Mar. 13, 2001; <http://web.archive.org/web/200100331202605/www.objectdomain.com/domain30/index.html>; 2 pages.
"OMG XML Metadata Interchange (XMI) Specifications" 2000; 17 pages.
Electronic Tools Company; E-Studio User Manuel; 2000; retrieved from http://web.archive.org for site http://e-tools.com on Mar. 23, 2005; 77 pages.
Cover Pages Technology Reports; XML and Electronic Design Automation (EDA); Aug. 2000; retrieved from http://xml.coverpages.org on Mar. 23, 2005; 5 pages.
Microsoft Computer Dictionary "ActiveX" 2002; Microsoft Press; 5th Edition; 3 pages.
Wikipedia "XML" retrieved on Jan. 29, 2007 from http://en.wikipedia.org/wiki/XML; 16 pages.
"VHDL Samples" retrieved on Jan. 29, 2007 from http://www.csee.umbc.edu/help/VHDL/samples/samples.shtml; 10 pages.
Anonymous, "Lotus Notes FAQ—How do you generate unique document numbers?" Sep. 19, 1999; retrieved from www.keysolutions.com on Jul. 9, 2008; 1 page.
Ashok Bindra, "Programmable SoC Delivers a New Level of System Flexibility"; Electronic Design; Nov. 6, 2000; 11 pages.
Cypress MicroSystem, Inc. "Cypress Customer Forums" retrieved from <http://wvvw.cypress.com/forums/ messageview>; Nov. 30, 2004; 1 page.
Cypress MicroSystem, Inc. "PsoC Designer: Integrated Development Environment User Guide"; Rev. 1.18; Sep. 8, 2003; 193 pages.
Hamblen, "Rapid Prototyping Using Field-Programmable Logic Devices" Jun. 2000, IEEE; 9 pages.
USPTO Final Rejection for U.S. Appl. No. 09/943,062 dated Apr. 30, 2004; 9 pages.
Snyder et al., "Xilinx's A-to-Z Systems Platform" Cahners Microprocessor, The Insider's Guide to Microprocessor Hardware, Feb. 6, 2001; 6 pages.
"PSoC Technology Completely Changes 8-bit MCU System Design" Cypress MicroSystem, Inc. Feb. 19, 2001; 21 pages.
USPTO Non-Final Rejection for U.S. Appl. No. 09/943,062 dated Dec. 8, 2003; 9 pages.
USPTO Advisory Action for U.S. Appl. No. 09/943,062 dated Sep. 25, 2003; 3 pages.
USPTO Final Rejection for U.S. Appl. No. 09/943,062 dated Jun. 27, 2003; 8 pages.
USPTO Non-Final Rejection for U.S. Appl. No. 09/943,062 dated Jan. 27, 2003; 7 pages.
USPTO Non-Final Rejection for U.S. Appl. No. 09/943,062 dated Sep. 11, 2002; 9 pages.
"PSoC Designer: Integrated Development Environment" User Guide; Revision 1.11; Last Revised Jul. 17, 2001; 109 pages.
Cypress Microsystems, "Cypress Microsystems Unveils Programmable System-on-a-Chip for Embedded Internet, Communications and Consumer Systems;" 2000, <http://www.cypressmicro.com/corporate/ CY_Announces_nov_13_2000.html>; 3 pages.

Huang et al., ICEBERG, An Embedded In-Circuit Emulator Synthesizer for Microcontrollers, Proceedings of the 36th Design Automation Conference Jun. 21-26,1999; 6 pages.

Yoo et a., "Fast Hadware-Sofware Co-verfcaion by Optmisic Executon of Real Pocessor" Proceedings of Design, Automation and Test in Europe Conference and Exhibition 2000; 6 pages.

USPTO Advisory Action for U.S. Appl. No. 09/943,062 dated Mar. 27, 2008; 3 pages.

USPTO Final Rejection for U.S. Appl. No. 09/943,062 dated Jan. 18, 2008; 8 pages.

USPTO Non-Final Rejection for U.S. Appl. No. 09/943,062 dated Jun. 22, 2007; 12 pages.

USPTC Miscellaneous Action for U.S. Appl. No. 09/943,062 dated Jan. 30, 2006; 2 pages.

USPTO Notice of Allowance for U.S. Appl. No. 10/113,064 dated Sep. 21, 2006; 7 pages.

USPTO Non-Final Rejection for U.S. Appl. No. 10/113,064 dated Apr. 6, 2006; 19 pages.

USPTO Final Rejection for U.S. Appl. No. 10/113,064 dated Oct. 18, 2005; 22 pages.

USPTO Non-Final Rejection for U.S. Appl. No. 10/113,064 dated Apr. 25, 2005; 15 pages.

USPTO U.S. Appl. No. 10/113,064 "Method and System for Debugging through Supervisory Operating Codes and Self Modifying Codes," Roe et al., filed on Mar. 29, 2002; 36 pages.

USPTO U.S. Appl. No. 10/002,726: "Method and Apparatus for Generating Microcontroller Configuration Information," Ogami et al., filed on Oct. 24, 2001; 54 pages.

USPTO Notice of Allowance for U.S. Appl. No. 10/002,726 dated Feb. 6, 2007; 7 pages.

USPTO Non-Final Rejection for U.S. Appl. No. 10/002,726 dated Aug. 28, 2006; 10 pages.

USPTO Final Rejection for U.S. Appl. No. 10/002,726 dated Mar. 27, 2006; 8 pages.

USPTO Final Rejection for U.S. Appl. No. 10/002,726 dated Nov. 30, 2005; 10 pages.

USPTO Non-Final Rejection for U.S. Appl. No. 10/002,726 dated Jun. 10, 2005; 10 pages.

USPTO Non-Final Rejection for U.S. Appl. No. 10/002,726 dated Dec. 13, 2004; 7 pages.

USPTO Notice of Allowance for U.S. Appl. No. 11/850,260 dated Oct. 27, 2010; 4 pages.

* cited by examiner

```
<!--Project DB Ver 0.03 08/10/00-->
<DEVICE_DB>
  <USER_MODULE_LIST>
    <!--Variable Resolution Incremental ADC-->
    <USER_MODULE NAME="ADCEXP" TYPE="PSOC_ADC" HTML="ADCEXP.HTM" ICON ="ADC.ico" METAFILE="ADCEXP.emf"
      API_PATH_TYPE="CUSTOM">
      <SHAPESHAPE_TYPE="BLOCKLIST">
      <BLOCK_LIST>
        <BLOCK NAME="ADC" TYPE="ANALOG_SC">
          <REGISTER_LIST>
            <REGISTER NAME = "CR0">
              <BITFIELD_LIST>
                <BITFIELD NAME="OSZ" VALUE="OSZ_32"/>
                <BITFIELD NAME="CLOCK_PHASE" VALUE="PHASE_NORM"/>
                <BITFIELD NAME="SIGN" VALUE="POS"/>
                <BITFIELD NAME="CAP_SIZE" VALUE="16"/>
              </BITFIELD_LIST>
            </REGISTER>
            <REGISTER NAME="CR1">
              <BITFIELD_LIST>
                <BITFIELD NAME="CAP_SIZE" VALUE="0"/>
              </BITFIELD_LIST>
            </REGISTER>
            <REGISTER NAME="CR2">
              <BITFIELD_LIST>
                <BITFIELD NAME="A_OUT" VALUE="DISABLED"/>
                <BITFIELD NAME="COMP_OUT" VALUE="ENABLED"/>
                <BITFIELD NAME="AZ_PHASE" VALUE="AZ_PHI"/>
```

FIGURE 7A

```xml
    <BITFIELD NAME="CAP_SIZE" VALUE="0"/>
   </BITFIELD_LIST>
  </REGISTER>
  <REGISTER NAME="CR3">
   <BITFIELD_LIST>
    <BITFIELD NAME="REF_SELECT" VALUE="COMP"/>
    <BITFIELD NAME="FB_CAP_SELECT" VALUE="PH2_AZ_ENABLE"/>
    <BITFIELD NAME="FB_CAP_GND" VALUE="GND_PHI"/>
    <BITFIELD NAME="SCA_INPUT_MUX_B" VALUE="IN2B"/>
    <BITFIELD NAME="SCB_INPUT_MUX_B" VALUE="IN2B"/>
    <BITFIELD NAME="SBB" VALUE="DISABLE"/>
    <BITFIELD NAME="PWR_SELECT" VALUE="PWR_OFF"/>
   </BITFIELD_LIST>
  </REGISTER>
 </REGISTER_LIST>
 <INPUT_LIST/>
</BLOCK>
</BLOCK_LIST>
<BLOCK_LIST>
<BLOCK NAME="TMR" TYPE="DIGITAL" INTERRUPT_SOURCE="_TMR_INT" INTERRUPT_TYPE="JUMP">
 <REGISTER_LIST>
```

```xml
<REGISTER NAME="DIG_BasicFunction">
<BITFIELD_LIST>
    <BITFIELD NAME="END" VALUE="IsEnd"/>
    <BITFIELD NAME="CompareType" VALUE="LTorEQ"/>
    <BITFIELD NAME="InterruptType" VALUE="TerminalCount"/>
    <BITFIELD NAME="Function" VALUE="Timer"/>
</BITFIELD_LIST>
</REGISTER>
<REGISTER NAME="DIG_Input">
<BITFIELD_LIST>
    <BITFIELD NAME="DataSelecvt" VALUE="High"/>
</BITFIELD_LIST>
</REGISTER>
```

FIGURE 7B (Continued)

```
<REGISTER NAME="DIG_Output">
  <BITFIELD_LIST>
    <BITFIELD NAME="AUXOutputEnable" VALUE="DISABLE"/>
    <BITFIELD NAME="DigOutputEnable" VALUE="DISABLE"/>
  </BITFIELD_LIST>
</REGISTER>
</REGISTER_LIST>
<INPUT_LIST/>
</BLOCK>
</BLOCK_LIST>
</BLOCK_LIST>
<BLOCK NAME="CNT_LSB" TYPE="DIGITAL">
  <REGISTER_LIST>
    <REGISTER NAME="DIG_BasicFunction">
      <BITFIELD_LIST>
        <BITFIELD NAME="Function" VALUE="Counter"/>
        <BITFIELD NAME="CompareType" VALUE="LTorEQ"/>
      </BITFIELD_LIST>
    </REGISTER>
  </REGISTER_LIST>
```

FIGURE 7C

```
<INPUT_LIST>
  <INPUT SOURCE="AnalogOut" TYPE="RESERVED_RESOURCE" REGISTER_NAME="DIG_Input" BITFIELD="DataSelect"/>
</INPUT_LIST>
</BLOCK>
<BLOCK NAME="CNT_MSB" TYPE="DIGITAL" INTERRUPT_SOURCE="_CNT_INT" INTERRUPT_TYPE="JUMP">
<REGISTER_LIST>
<REGISTER NAME="DIG_BasicFunction">
  <BITFIELD_LIST>
    <BITFIELD NAME = "Function" VALUE="Counter"/>
    <BITFIELD NAME = "END" VALUE="IsEnd"/>
    <BITFIELD NAME = "CompareType" VALUE="LTorEQ"/>
  </BITFIELD_LIST>
</REGISTER>
```

FIGURE 7C (Continued)

```xml
<REGISTER_LIST>
<INPUT_LIST>
<INPUT SOURCE="CNT_LSB" TYPE="BLOCK" REGISTER_NAME="DIG_Input" BITFIELD="DataSelect"/>
</INPUT_LIST>
</BLOCK>
</BLOCK_LIST>
<RESOURCE_LIST>
725 — <RESOURCE NAME="AnalogOut" TYPE="ANALOG_COMPARATOR_OUTPUT">
   730 — <INPUT_LIST>
<INPUT SOURCE="ADC" TYPE="BLOCK"/>
</INPUT_LIST>
</RESOURCE>
</RESOURCE_LIST>
</SHAPE>
740 — <PARAMETER_LIST>
<PARAMETER NAME="ADCINPUT_SCB" TYPE="INPUT" SOURCE="ADC" REGISTER_NAME="CRI" BITFIELD="SCB_INPUT_MUX_A"/>
<PARAMETER NAME="ADCINPUT_SCA" TYPE="INPUT" SOURCE="ADC" REGISTER_NAME="CRI" BITFIELD="SCA_INPUT_MUX_A_C"/>
<PARAMETER NAME="ClockPhase" TYPE="BLOCK" SOURCE="ADC" REGISTER_NAME="CR0" BITFIELD="CLOCK_PHASE"/>
<PARAMETER NAME="TMRCLK" TYPE="CLOCK" SOURCE="TMR" REGISTER_NAME="DIG_Input" BITFIELD="ClockSelect"/>
<PARAMETER NAME="CTRCLKL" TYPE="CLOCK" SOURCE="CNT_LSB" REGISTER_NAME="DIG_Input" BITFIELD="ClockSelect"/>
<PARAMETER NAME="CTRCLKM" TYPE="CLOCK" SOURCE="CNT_MSB" REGISTER_NAME="DIG_Input" BITFIELD="ClockSelect"/>
```

FIGURE 7D

```
</PARAMETER_LIST>
<API_REGISTER_ALIAS_LIST>
    <API_REGISTER_ALIAS_NAME="AtoDcr0" SOURCE="ADC" REGISTER_NAME="CR0"/>
    <API_REGISTER_ALIAS_NAME="AtoDcr1" SOURCE="ADC" REGISTER_NAME="CR1"/>
    <API_REGISTER_ALIAS_NAME="AtoDcr2" SOURCE="ADC" REGISTER_NAME="CR2"/>
    <API_REGISTER_ALIAS_NAME="AtoDcr3" SOURCE="ADC" REGISTER_NAME="CR3"/>
    <API_REGISTER_ALIAS_NAME="CounterMSBFN" SOURCE="CNT_MSB" REGISTER_NAME="DIG_BasicFunction"/>
```

FIGURE 7D (Continued)

```xml
<API_REGISTER_ALIAS_NAME="CounterMSBSL" SOURCE="CNT_MSB" REGISTER_NAME="DIG_Input"/>
<API_REGISTER_ALIAS_NAME="CounterMSBOS" SOURCE="CNT_MSB" REGISTER_NAME="DIG_Output"/>
<API_REGISTER_ALIAS_NAME="CounterMSBDR0" SOURCE="CNT_MSB" REGISTER_NAME="DATA_0"/>
<API_REGISTER_ALIAS_NAME="CounterMSBDR1" SOURCE="CNT_MSB" REGISTER_NAME="DATA_1"/>
<API_REGISTER_ALIAS_NAME="CounterMSBDR2" SOURCE="CNT_MSB" REGISTER_NAME="DATA_2"/>
<API_REGISTER_ALIAS_NAME="CounterMSBCR0" SOURCE="CNT_MSB" REGISTER_NAME="CONTROL_0"/>
<API_REGISTER_ALIAS_NAME="CounterLSBFN" SOURCE="CNT_LSB"REGISTER_NAME="DIG_BasicFunction"/>
<API_REGISTER_ALIAS_NAME="CounterLSBSL" SOURCE="CNT_LSB" REGISTER_NAME="DIG_Input"/>
<API_REGISTER_ALIAS_NAME="CounterLSBOS" SOURCE="CNT_LSB" REGISTER_NAME="DIG_Output"/>
<API_REGISTER_ALIAS_NAME="CounterLSBDR0" SOURCE="CNT_LSB" REGISTER_NAME="DATA_0"/>
<API_REGISTER_ALIAS_NAME="CounterLSBDR1" SOURCE="CNT_LSB" REGISTER_NAME="DATA_1"/>
<API_REGISTER_ALIAS_NAME="CounterLSBDR2" SOURCE="CNT_LSB" REGISTER_NAME="DATA_2"/>
<API_REGISTER_ALIAS_NAME="CounterLSBCR0" SOURCE="CNT_LSB" REGISTER_NAME="CONTROL_0"/>
<API_REGISTER_ALIAS_NAME="TimerFN" SOURCE="TMR" REGISTER_NAME="Dig_BasicFunction"/>
<API_REGISTER_ALIAS_NAME="TimerSL" SOURCE="TMR" REGISTER_NAME="Dig_Input"/>
<API_REGISTER_ALIAS_NAME="TimerOS" SOURCE="TMR" REGISTER_NAME="Dig_Output"/>
<API_REGISTER_ALIAS_NAME="TimerDR0" SOURCE="TMR" REGISTER_NAME="Data_0"/>
<API_REGISTER_ALIAS_NAME="TimerDR1" SOURCE="TMR" REGISTER_NAME="Data_1"/>
<API_REGISTER_ALIAS_NAME="TimerDR2" SOURCE="TMR" REGISTER_NAME="Data_2"/>
<API_REGISTER_ALIAS_NAME="TimerCR0" SOURCE="TMR" REGISTER_NAME="CONTROL_0"/>
<API_REGISTER_ALIAS_NAME="Comp_Ctrl" SOURCE="AnalogComp" TYPE="RESERVED_RESOURCE" REGISTER_NAME="AnalogComparatorControl"/>
</API_REGISTER_ALIAS_LIST>
</USER_MODULE>
</USER_MODULE_LIST>
</DEVICE_DB>
```

FIGURE 7E

TECHNIQUES FOR GENERATING MICROCONTROLLER CONFIGURATION INFORMATION

CROSS-REFERENCE TO RELATED APPLICATIONS

This is a continuation of application Ser. No. 10/002,726 filed Oct. 24, 2001 now U.S. Pat. No. 7,406,674.

FIELD OF THE INVENTION

Embodiments of the present invention generally relate to the field of microcontrollers. More specifically, embodiments of the present invention pertain to a method and apparatus for generating the configuration information for microcontrollers.

BACKGROUND OF THE INVENTION

Microcontrollers function to replace mechanical and electromechanical components in a variety of applications and devices. Microcontrollers have evolved since they were first introduced approximately 30 years ago, to the point where they can be used for increasingly complex applications. Some microcontrollers in use today are also programmable, expanding the number of applications in which they can be used.

However, even though there are a large number of different types of microcontrollers available on the market with a seemingly wide range of applicability, it is still often difficult for a designer to find a microcontroller that is particularly suited for a particular application. Unique aspects of the intended application may make it difficult to find an optimum microcontroller, perhaps necessitating a compromise between the convenience of using an existing microcontroller design and less than optimum performance.

In those cases in which a suitable microcontroller is found, subsequent changes to the application and new requirements placed on the application will likely affect the choice of microcontroller. The designer thus again faces the challenge of finding a suitable microcontroller for the intended application.

One solution to the problems described above is to design (or have designed) a microcontroller customized for the intended application. However, this solution may still not be practical because of the time needed to develop a custom microcontroller and the cost of doing so. In addition, should the design of the intended application be changed, it may also be necessary to change the design of the custom microcontroller, further increasing costs and lead times. Moreover, the option of designing a custom microcontroller is generally only available to very large volume customers.

Application specific integrated circuits (ASICs) may suggest a solution to the problem of finding a suitable microcontroller for an application. However, ASICs can also be problematic because they require a sophisticated level of design expertise, and the obstacles of long development times, high costs, and large volume requirements still remain. Solutions such as gate arrays and programmable logic devices provide flexibility, but they too are expensive and require a sophisticated level of design expertise.

In an effort to overcome some of these disadvantages, some microcontroller suppliers (for example, Cypress MicroSystems in Bothell, Wash.) have started to offer standard parts that combine a microprocessor with several user-configurable "building blocks." These building blocks may be configured to form many standard microprocessor peripherals, as well as to form unique peripherals as may be required by a specific application. Thus, a user of such products may be able to tailor (or configure) such a standard product to meet his specific microcontroller requirements, in less time and at less cost than through other means.

Unfortunately, the process by which such configurable blocks are configured is burdensome. The configurable blocks are designed to have wide application. As such, configuration generally involves setting a large number of bits in a specific sequence in order to define a specific function and interconnection with other blocks.

Many existing microcontrollers also have numerous configuration settings. For example, it is not unusual for a given input/output port to be designed such that it is either input or output, and it may further have a selectable pull up resistor.

In the prior art, the configuration process for both standard microcontrollers and configurable microcontrollers has been similar. A designer would study the device's information data sheets and manually determine the value and order of a long string of bits that would create the desired configuration. Subsequently, this string would be encoded into microprocessor instructions for execution during the early stages of operation, or initialization of the system.

In a very few instances, when a microcontroller has found very high acceptance in a particular application, high level tools have been created to support that particular microcontroller in that particular application. In such cases, a standard configuration is used and various software tools are built based on the standard configuration.

Unfortunately, in most design situations calling for a microcontroller, this is not the case. Configuration has been, for the most part, a labor-intensive manual process. Further, changes in the hardware configuration tend to ripple though to the higher level software, requiring changes and recompilation of application software as well as in any software tools designed to ease the development process. In effect, if the microcontroller hardware changed, the software had to change. Not just the application specific software, but also the software tools (such as compilers) had to change.

SUMMARY OF THE INVENTION

Therefore, it would be advantageous to provide a method and system for the automatic generation of configuration information. A further need exists for a text readable description of the hardware resources of a microcontroller. A still further need exists for the use of open standards in describing configurable hardware.

Embodiments of the present invention provide a method and system for the automatic generation of configuration information. Further embodiments of the present invention provide for a text readable description of the hardware resources of a microcontroller. Still further embodiments of the present invention may use eXtensible Markup Language, an open standard, to describe configurable hardware.

A method and apparatus for configuring a microcontroller is disclosed. An XML description of the microcontroller's hardware resources may be accessed. A user may select from available hardware resources and pre-defined user modules to select a configuration. Configuration information, which may include register bit patterns and microprocessor instructions, may be automatically generated. Additionally, application programming interface calls and structure, as well as interrupt vector tables may be automatically generated.

Another embodiment of the present invention may access predetermined configurations of a microcontroller's hardware resources.

In one embodiment of the present invention, a microcontroller having a number of configurable building blocks may be automatically configured.

In another embodiment of the present invention, user selected configuration choices are combined with predetermined configurations to automatically generate configuration information.

In yet another embodiment of the present invention, user configuration selections are checked against the hardware description for validity.

In still another embodiment of the present invention, a user may edit configurable parameters within a computer implemented graphical user interface.

Embodiments of the present invention provide improved ease of use and the ability to manage greater complexity in the configuration of configurable microcontrollers.

Therefore, these and other objects and advantages of the present invention will become obvious to those of ordinary skill in the art after having read the following detailed description of the preferred embodiments that are illustrated in the various drawing figures.

BRIEF DESCRIPTION OF THE DRAWINGS

Embodiments of the present invention are illustrated by way of example and not by way of limitation, in the figures of the accompanying drawings and in which like reference numerals refer to similar elements and in which:

FIGS. 7A, 7B, 7C, 7D and 7E illustrate an exemplary User Module description written in eXtensible Markup Language (XML), as may be used by embodiments of the present invention.

DETAILED DESCRIPTION OF THE INVENTION

Figure 1:
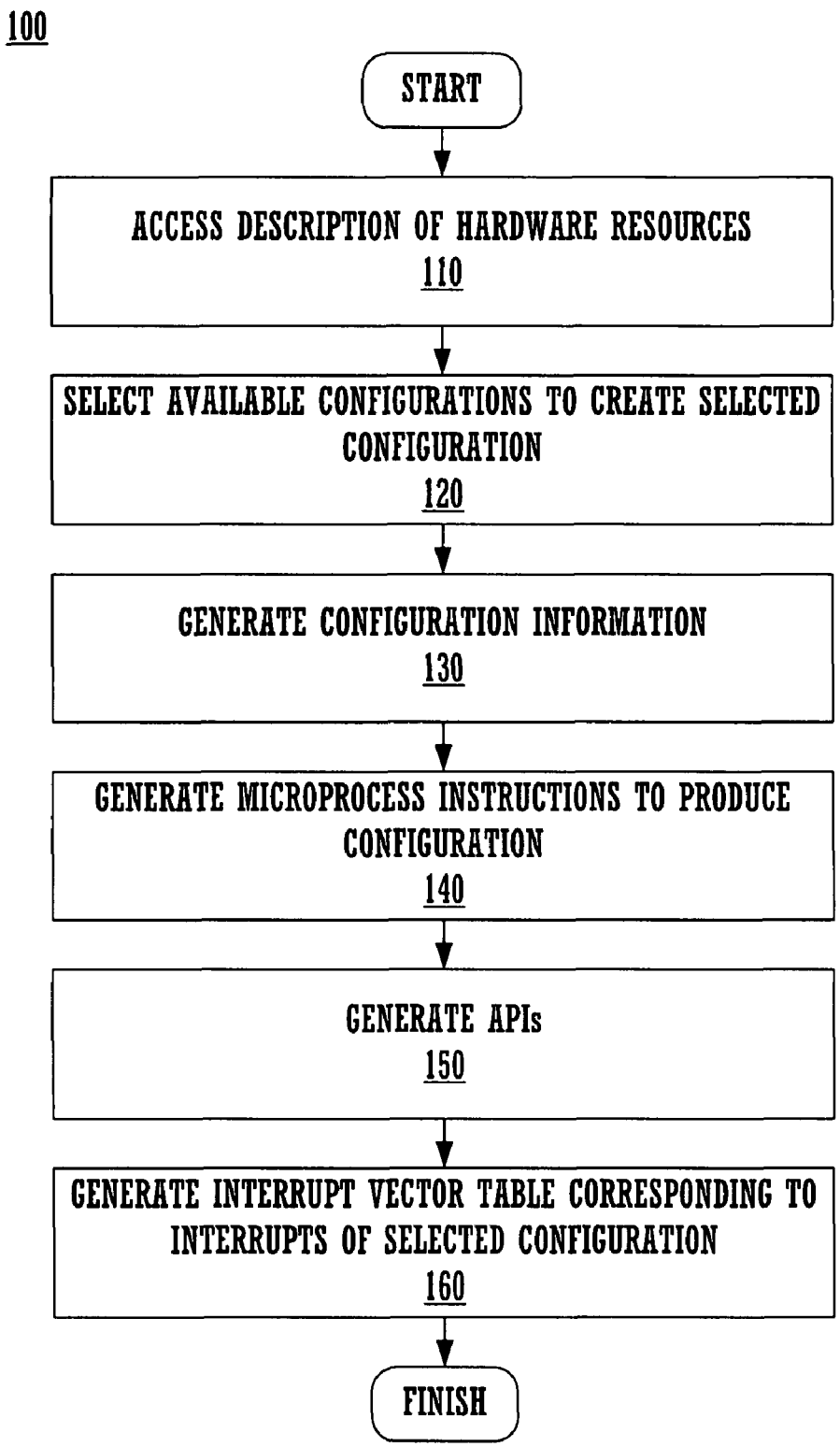
FIG. 1 is an illustration of a method of configuring a microcontroller, according to an embodiment of the present invention.

In the following detailed description of the present invention, method and apparatus for generating microcontroller configuration information, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Notation and Nomenclature

Some portions of the detailed descriptions which follow (e.g., process 100) are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "indexing" or "processing" or "computing" or "translating" or "calculating" or "determining" or "scrolling" or "displaying" or "recognizing" or "generating" or "accessing" or "selecting" or "tracking" or "displaying" or "informing" or "editing" or "adding" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Method and Apparatus for Generating
Microcontroller Configuration Information

This application makes reference to co-pending commonly-owned U.S. patent application Ser. No. 10/033,027, filed Oct. 22, 2001, entitled "Microcontroller System on a Chip," which is hereby incorporated herein by reference in its entirety.

The present invention is described in the context of development tools for designing with embedded microcontrollers. However, it is appreciated that the present invention may be utilized in other types of computer-aided hardware and software design systems (for example compilers) where it may be necessary to describe various resources.

Traditional microcontrollers have a fixed set of digital and/or analog peripherals. Many of these peripherals may have configurable parameters. For example, a universal asynchronous receiver transmitter (UART) may have provision for several user-selectable configurations. These may include a choice of baud rates, clock sources (internal or external), number of stop bits, parity (even, odd or none), etc. However, all such configuration parameters apply to the same function, that of UART. Such a fixed peripheral generally may not be reconfigured to perform a completely different function, for example, a display controller.

A new class of microcontroller provides an analog and/or digital subsystem comprising many dynamically configurable blocks. An example of such a device is the CY8C25x/26x family, commercially available from Cypress MicroSystems of Washington. These blocks do not, in general, provide the equivalent function of a traditional microprocessor peripheral. They may be thought of as fundamental building blocks. However, these blocks may be combined to create such functions. In further contrast to the fixed peripherals of a traditional microcontroller, these blocks may be recombined in a different combination to perform a different function.

Importantly, these different combinations of blocks producing different functions may exist at different times within the same system. For example, a set of blocks configured to perform the function of analog to digital conversion may sample a signal. After processing that signal in the digital domain, those same blocks (perhaps in conjunction with a few others) may be recombined in a different configuration to perform the function of digital to analog conversion to produce an output signal.

The present invention provides a method and system for managing the configuration of and generating configuration information for both traditional microcontrollers with configurable peripherals and this new class of microcontrollers with dynamically configurable blocks.

FIG. 1 illustrates a method 100 of configuring a microcontroller, according to an embodiment of the present invention.

In step 110, a description of the hardware resources may be accessed. This description may include a definition of the underlying hardware, i.e., what peripherals or configurable blocks are available, and the configurable parameters that must be set to operate. In a preferred embodiment of the present invention, the underlying hardware is described in well understood names versus mnemonics, e.g., "conversion_complete_interrupt" versus "INT6." It is appreciated that other well-known naming conventions are well suited to embodiments of the present invention.

In a preferred embodiment, this description is a data set, which may be contained in a plurality of files substantially compliant with eXtensible Markup Language, or XML.

XML is a well-known open standard, and is text based. As a text based structure, a wide variety of computer tools may be used to create and edit such a description. Being text based, it is also compatible with the widest variety of network transmissions and can be easily transferred between computers having different character set descriptions, such as ASCII and EBCDIC. Descriptions having non-text characters may be more limited in their applications.

It is appreciated, however, that embodiments of the present invention are well suited to other well-known data formats.

In an embodiment of the present invention, a separate software tool accesses the descriptive data set. A significant benefit of separating the data set from the software tool is that the software tool does not have to change (e.g., re-writing or recompiling) if the hardware changes. Only the data set needs to be modified to reflect such a change. Changes to a text based data file are significantly less complex than changes to executable software.

Additional benefits derive from this arrangement as well. For example, supporting new hardware may only require the mere addition of new files into a module library (directory). Additionally, the hardware description files may be used across a variety of computer platforms and operating systems. Further, since the software tool isn't changing with each new or modified piece of hardware, engineering resources may be dedicated to increasing the quality of the software, rather than supporting new functionality.

This description may also include lists of standard configurations that have been predetermined, either by the users or the manufacturers, to be useful. Such a configuration in a traditional microcontroller might be "RS-232 9600 baud," which would be a set of bit patterns to configure the (fixed function) UART to select the appropriate clock source, stop bits, parity, etc. for this standard form of communication.

Similarly, a standard configuration of configurable blocks might be an analog to digital converter labeled "6_bit_ADC." This standard configuration would combine analog and digital blocks to produce a six-bit analog to digital converter.

We label such standard configurations as user modules, and such user modules may be defined in the description of hardware resources.

Still referring to FIG. 1, in step 120 a user, typically interacting with a computer implemented design tool, may select from available configurations, including user modules and other capabilities of the microcontroller hardware, to produce a desired configuration.

In a preferred embodiment of the present invention, the design tool may track resources as they are assigned, providing feedback to the designer such as available blocks and user modules. It is appreciated that such feedback is not required in embodiments of the present invention.

In step 130, the bit patterns corresponding to the selected configuration may be automatically generated. In optional step 140, microprocessor instructions may be generated which, when executed cause the hardware to be configured according the selected configuration.

In optional step 150, application programming interface (API) call structures may be automatically generated. Such APIs may correspond to user modules. For example, using the previous example of "6_BIT_ADC," an API call might take the form of "GET_6_BIT_ADC_VALUE." Using meaningful names in such an automatically generated structure is more useful to human designers who must maintain the software than pseudo-random unique names generated by computer processes, such as "ZYX-1." Microprocessor instructions required to perform this task and return the value to the calling software may be automatically generated.

In optional step 160, an interrupt vector table may be automatically generated. Again using the example of "6_BIT_ADC," instructions to set the "conversion complete" interrupt to level 6 may be automatically generated. Further, instructions to initialize the interrupt vector corresponding to level 6 may be automatically generated, and a shell for the interrupt service routine may be automatically created. Finally, since this example also includes an API, the shell software may be completed to, for example, read the result register from the "6_BIT_ADC" and place that value on the stack to be passed back to the calling program.

Figure 2:
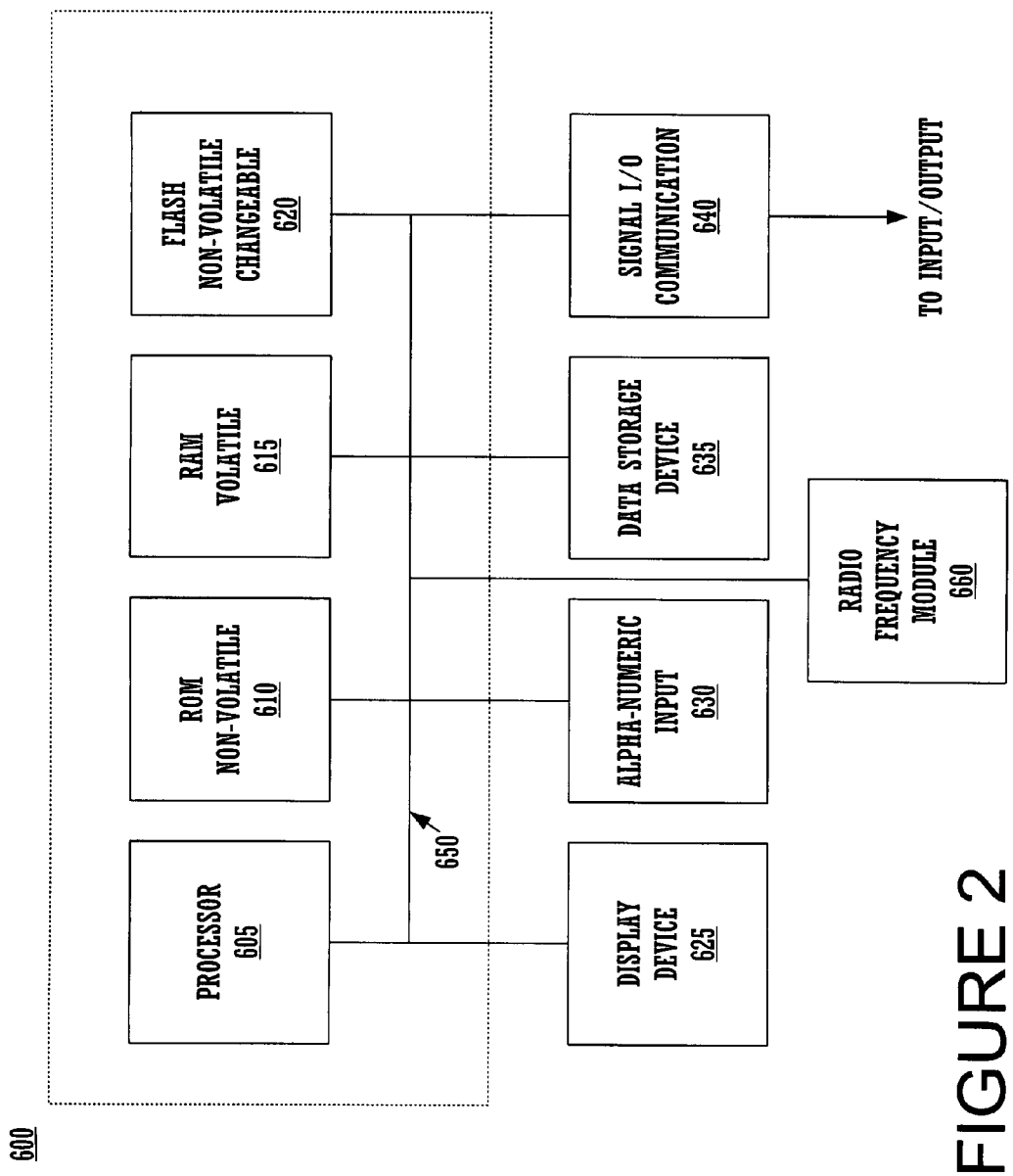
FIG. 2 is a block diagram of a computer system, which may be used as a platform to implement embodiments of the present invention.

FIG. 2 illustrates circuitry of computer system 600, which may form a platform for the implementation of embodiments of the present invention. Computer system 600 includes an address/data bus 650 for communicating information, a central processor 605 functionally coupled with the bus for processing information and instructions, a volatile memory 615 (e.g., random access memory RAM) coupled with the bus 650 for storing information and instructions for the central processor 605 and a non-volatile memory 610 (e.g., read only memory ROM) coupled with the bus 650 for storing static information and instructions for the processor 605. Computer system 600 also optionally includes a changeable, non-volatile memory 620 (e.g., flash) for storing information and instructions for the central processor 605, which can be updated after the manufacture of system 600.

Computer system 600 also optionally includes a data storage device 635 (e.g., a rotating magnetic disk) coupled with the bus 650 for storing information and instructions.

Also included in computer system 600 of FIG. 2 is an optional alphanumeric input device 630. Device 630 can communicate information and command selections to the central processor 600. Device 630 may take the form of a touch sensitive digitizer panel or typewriter-style keyboard. Display device 625 utilized with the computer system 600 may be a liquid crystal display (LCD) device, cathode ray tube (CRT), field emission device (FED, also called flat panel CRT), light emitting diode (LED), plasma display device, electro-luminescent display, electronic paper or other display device suitable for creating graphic images and alphanumeric characters recognizable to the user. Optional signal input/output communication device 640 is also coupled to bus 650.

System 600 optionally includes a radio frequency module 660, which may implement a variety of wireless protocols, for example IEEE 802.11 or Bluetooth.

Figure 3:
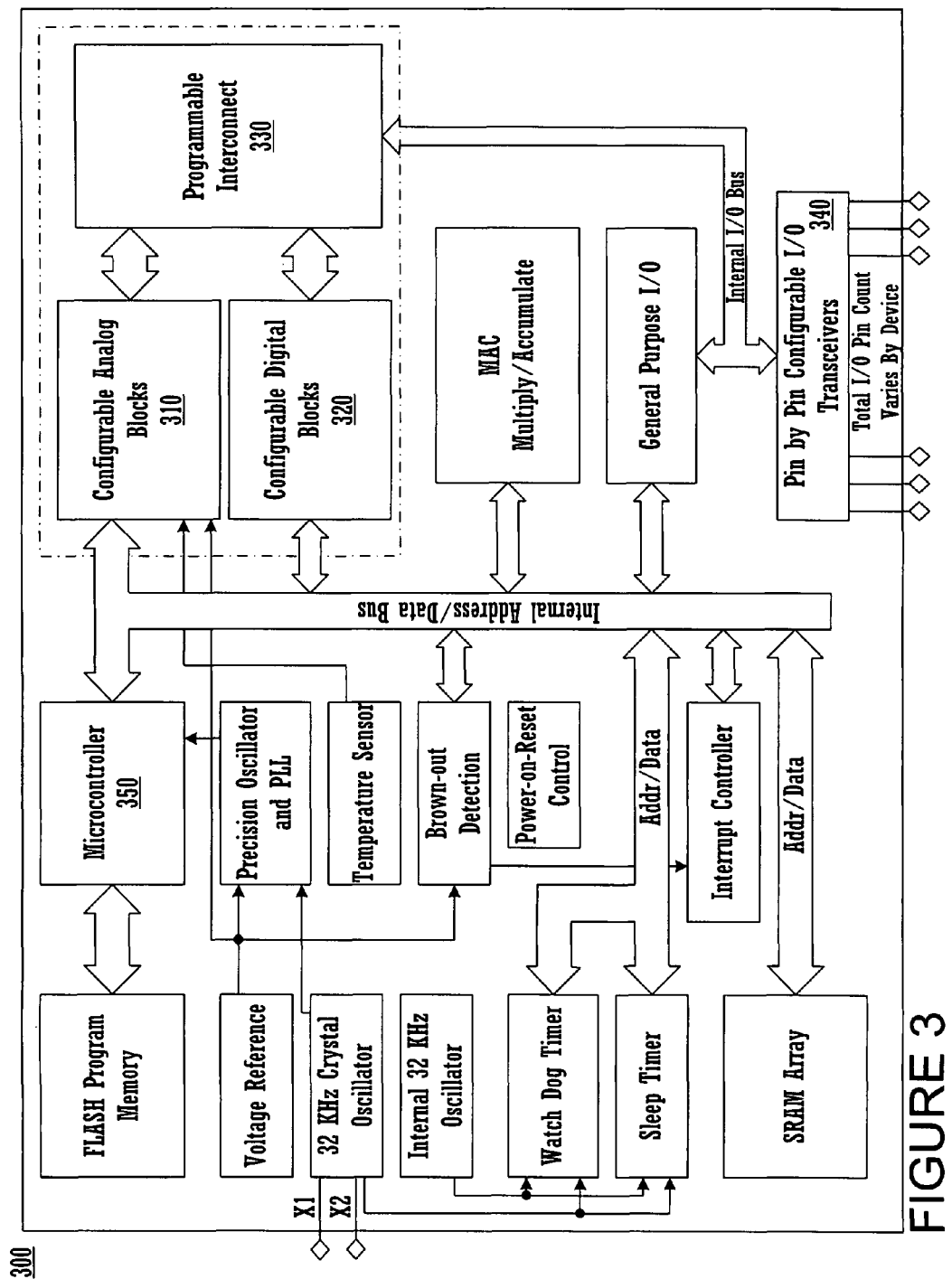
FIG. 3 illustrates an exemplary configurable microcontroller system, upon which embodiments of the present invention may be practiced.

FIG. 3 illustrates an exemplary configurable microcontroller system 300, upon which embodiments of the present invention may be practiced. It is appreciated that the present invention is well suited to a wide range of well know and future configurable microcontroller systems.

Microcontroller system 300 may contain microcontroller 350. Microcontroller 350 may execute instructions stored within memory elements of microprocessor system 300 to configure configurable elements of microcontroller system 300, including analog SoCblocs 310, Digital SoCblocs 320, programmable interconnect 330 and configurable I/O transceivers 340. Configuration information for these configurable elements may have been generated by embodiments of the present invention.

Microcontroller system 300 may include analog SoCblocs 310. "SoC" is a trade name of Cypress MicroSystems of Washington for "System on (a) Chip," and refers to an architecture of low-level building blocks for creating a wide variety of on-chip functions associated with a microcontroller. Analog SoCblocs 310 may be an array of such low level building blocks designed to implement analog functions. Similarly, digital SoCblocs 320 may be an array of low level building blocks designed to implement digital functions.

Programmable interconnect 330 may be an array of configurable multiplexing elements designed to interconnect low level building blocks together and with other system resources. Configurable I/O transceivers 340 allow signals created or accessed by configurations of building blocks to communicate off-chip.

Figure 4:
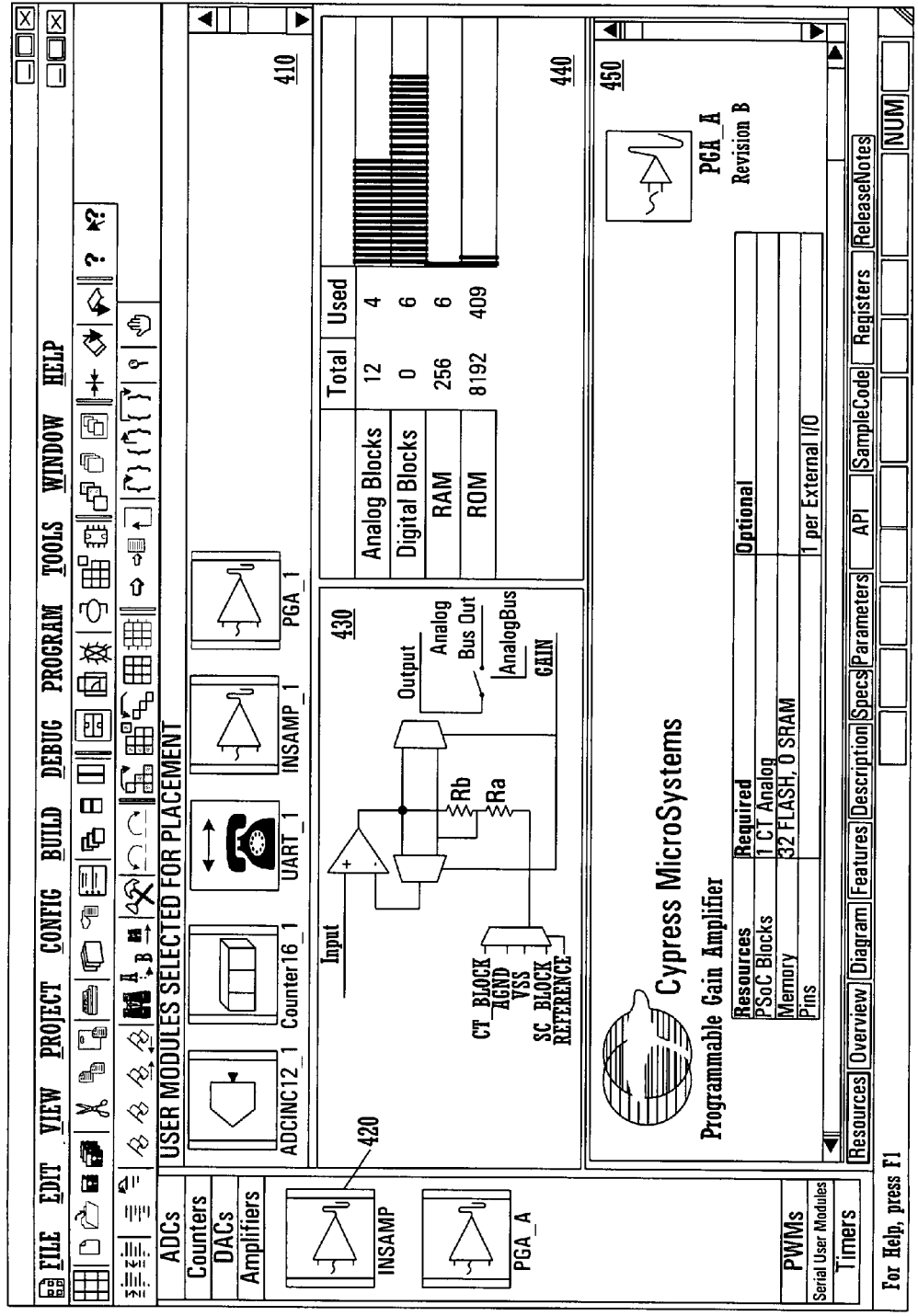
FIG. 4 shows an exemplary User Module selection display, according to an embodiment of the present invention.

FIG. 4 shows an exemplary User Module selection display 400, according to an embodiment of the present invention. User Module selection display 400 may contain User Module Catalog window 420. User Module Catalog window 420 may display all User Modules automatically loaded from the User Module libraries. The User Modules may be organized by type. The displayed names correspond to the type of the User Module.

User Module Selection Bar 410 may display the User Modules selected for the current project. The instance name for the User Module may be shown below the icon in User Module Selection Bar 410. The instance name can be changed at any time before code generation.

Block Diagram 430 and Data Sheet 450 correspond to the User Modules highlighted in the User Module catalog window 420. Block Diagram 430 may provide a block diagram of the highlighted user module, and may indicate configurable elements of the user module.

Data Sheet 450 may display a detailed datasheet for the selected user module, as would have been contained in a data book or accessed via the world wide web in prior art systems. In this manner, a designer has immediate access to detailed engineering information regarding the selected user module, without having to refer to a printed book, or open an interne browser window which may obscure his work.

Embodiments of the present invention may be configured to allow only User Modules that are seen in the User Module Selection bar 410 to be placed during User Module placement.

Resource assignment window 440 may display the total resources available in a particular device, and a summary of the resources used as they are placed into the design. Resource assignment window 440 may display a summary of resources used/assigned in numerical and/or bar graph formats. Resource assignment window 440 may further change the color of the graph, for example, to yellow, to indicate that a specific resource, for example digital blocks, are almost used up. In addition, resource assignment window 440 may display the graph in yet another color, for example red, to indicate that all available resources of a particular type have been used.

Figure 5:
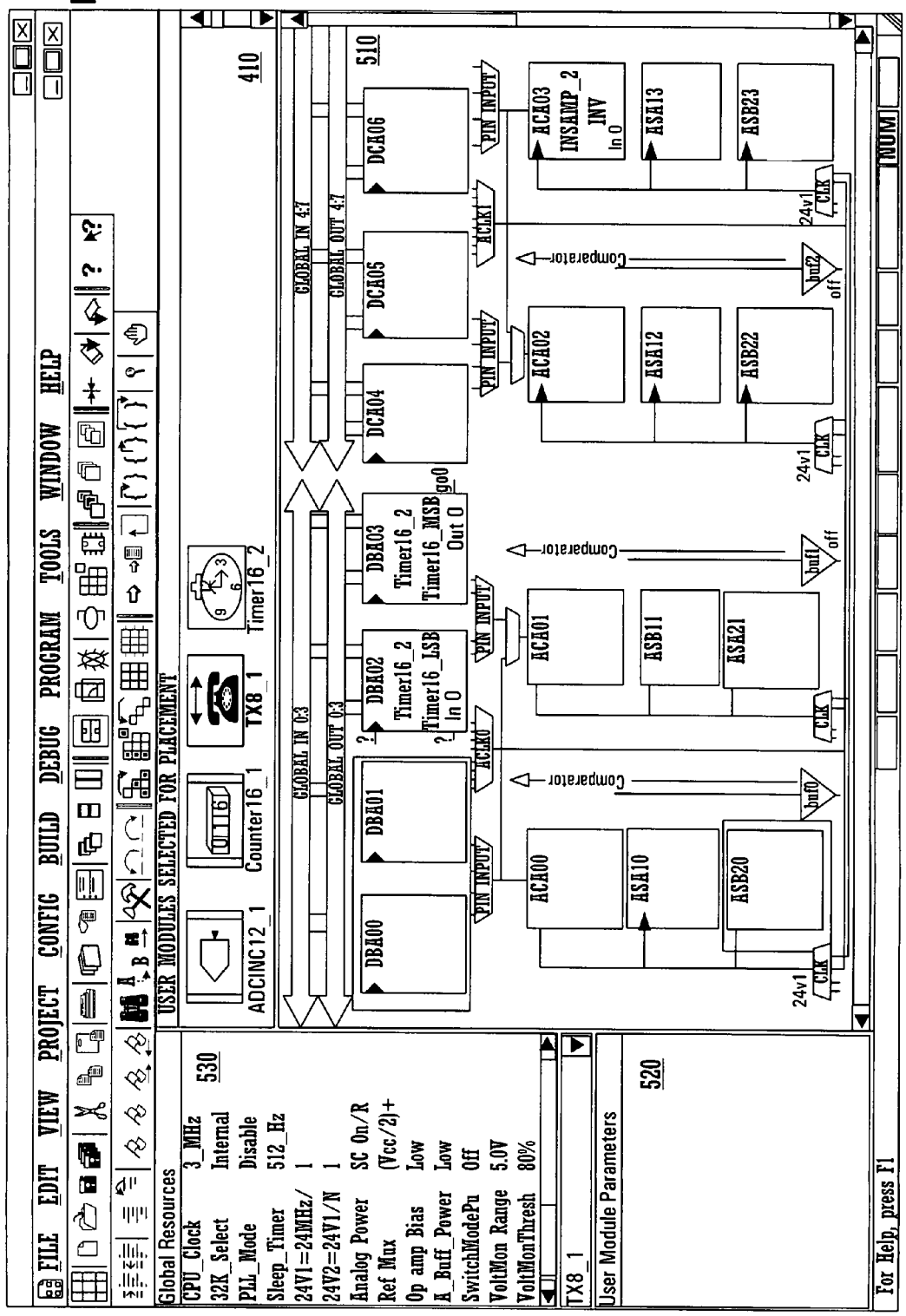
FIG. 5 shows an exemplary User Module placement display, according to an embodiment of the present invention.

FIG. 5 shows an exemplary User Module placement display 500, according to an embodiment of the present invention. User Module placement involves the placement of selected User Modules onto the PSoC blocks available on the selected device.

User Module placement display 500 may include placement pane 510. Placement pane 510 may display a graphical representation of placed blocks and signal routings. The graphical placement and routing may correspond to the physical placement of such blocks on an integrated circuit, or the graphical placement and routing may correspond to simplified renderings of the microcontroller architecture.

Placed User Modules may have colored rectangles around their icons in the User Module Selection Bar 410 and one or more blocks in the Placement Pane 510 may be colored with the same color. The instance name and block name will also be shown on the corresponding blocks. Embodiments of the present invention may be configured to allow only placed User Modules to be parameterized and included in application generation.

User Module placement display 500 may also include global resources window 530 that displays a list of the global resources available in the chosen device.

User Module placement display 500 may further include user module parameters window 520 that displays a list of configurable parameters for the user module selected in user modules selection bar 410. In this example, there are no user configurable parameters for the selected user module "TX8_1."

Figure 6:
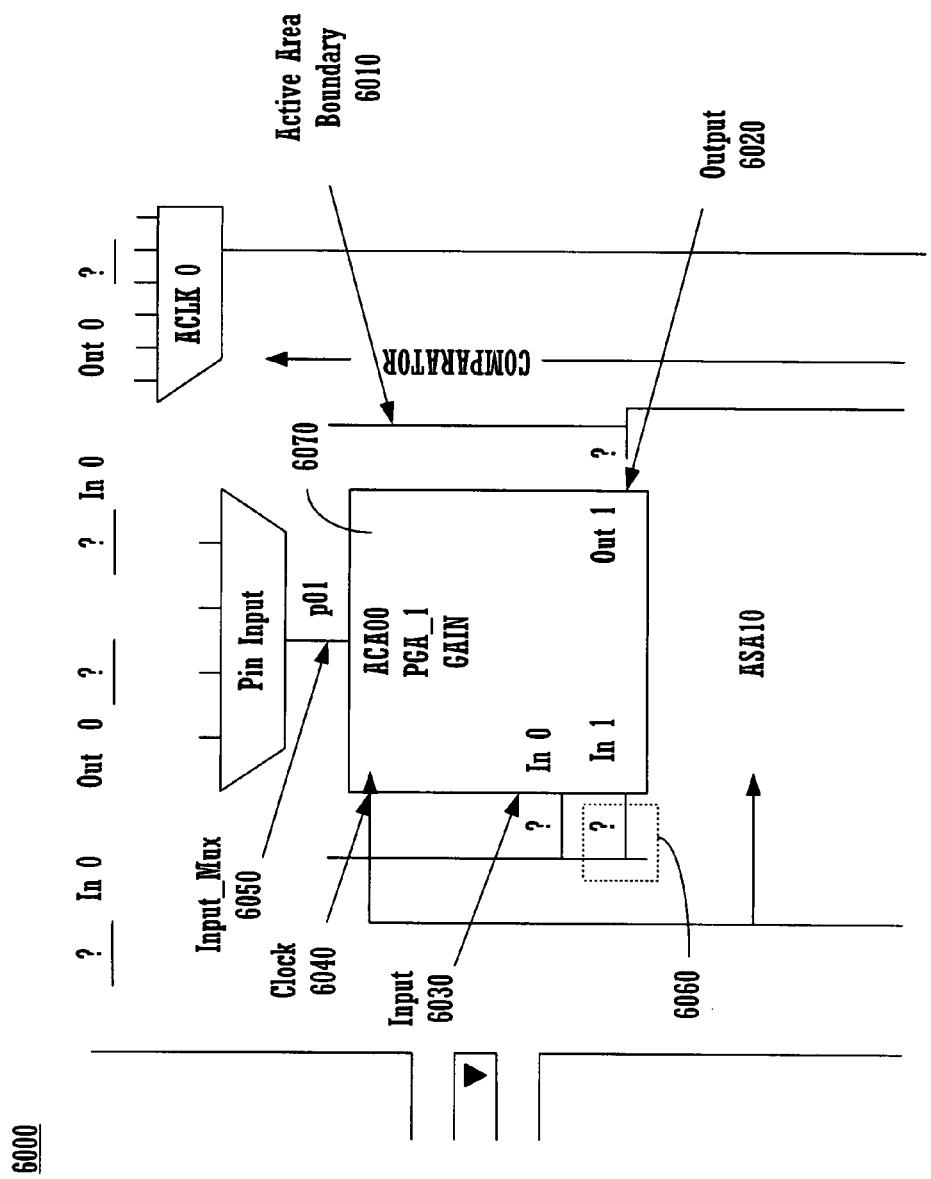
FIG. 6 shows an exemplary screen detail of elements of FIG. 5, according to an embodiment of the present invention.

FIG. 6 shows an exemplary screen detail 6000, which is a detail of placement pane 510. Detail 6000 shows the active areas for block parameters, in particular block 6070, which may be displayed or edited by a user. In general, the active areas for the cursor indicator on block 6070 associated with the parameter may be within the graphical representation of the block 6070 immediately surrounding the text block and outside the block 6070 immediately adjacent to the text block while extending to the end of the active area boundary line 6010.

When the mouse or other pointing device causes a cursor indicator (not shown) to move within the active area of a parameter, for example parameter text area 6060, the cursor may change to a horizontal Dual In-line Package (DIP) shape. If the cursor is left over the active area for about one second, then a tool tip may appear showing the name of the parameter and its value.

The parameter value may be shown in the active area of the parameter immediately above the line, for example parameter area 6060. If the parameter value has not yet been set, then the line may be rendered in an indicator color, for example, red, and a question mark may be displayed in place of the parameter value. The question mark may also be displayed in the same indicator color.

The CLOCK parameter 6040 may always map to an area in the upper left corner of the block 6070. Embodiments of the present invention may be configured so that there is only one parameter whose TYPE attribute is set to CLOCK in any one PSoC block within any User Module. The CLOCK parameter does not have a text block similar to parameter text area 6060, but shows the triangle symbol within the block 6070.

The INPUT 6030 parameters (including parameter text area 6060) appear in the lower left area of the block 6070. A maximum of 2 inputs can be shown on a block. The text may always be shown as "In 0" or "In 1" that are assigned in alphabetical order of the INPUT parameters. If only one INPUT parameter is defined for a particular block, then that input will appear at the bottom of the block and be shown as "In 0."

The INPUT_MUX parameter 6050 is a special case parameter that may cause the line to be drawn between the top row of analog PSoC blocks, the ANALOG_CT blocks, and the Pin Input MUX control above them. The INPUT_MUX 6050 parameter does not have a bitfield associated with it, so the BITFIELD attribute should be set to NONE. Consequently, an INPUT_MUX 6050 parameter will not appear in the Parameter Pane. The value shown next to the line is controlled by the Pin Input MUX control above. The INPUT_MUX 6050 parameter must only be used with ANALOG_CT blocks.

The OUTPUT 6020 parameters appear in the lower right area of the block. A maximum of 2 outputs can be shown on a block. The text may be always shown as "Out 0" or "Out 1" that are assigned in alphabetical order of the OUTPUT parameters. If only one OUTPUT parameter is defined for a particular block, then that parameter will appear at the bottom of the block and be shown as "Out 0."

The OUTPUT_0 and OUTPUT_1 parameters are similar to the OUTPUT 6020 parameter except that the position of each parameter type is fixed in the block and the line outside the block is extended to connect to one of the two bus lines to the right of the blocks. The OUTPUT_0 parameter appears in the upper output position and the line extends to the comparator bus line. The OUTPUT_1 parameter appears in the lower output position and the line extends to the analog bus line.

The OUTPUT_0_HIDDEN and OUTPUT_1_HIDDEN parameters are similar to the OUTPUT_0 and OUTPUT_1 parameters, except that the "_HIDDEN" implies that the parameter value itself is not made available to the GUI. For these parameters, the lines are drawn to the respective bus line, but the text block within the block and the parameter value may not be shown.

FIGS. 7A, 7B, 7C, 7D and 7E illustrate an exemplary User Module description 700 written in eXtensible Markup Language (XML), as may be used by embodiments of the present invention.

The syntax of XML files follows other mark-up languages in that it consists of tags, which represent elements. Elements can contain attributes, and, in turn, attributes have values. All names in XML files, whether they are tag names, attribute names, or attribute values, are case sensitive.

The user module description 700 may contain data including user module resource requirements, interconnection details, parameter description, and API code generation substitutions. Ultimately, the user module description 700 may define registers, which are divided into bitfields. Bitfields may be set according to User Module placement and parameterization, thereby setting registers. The bitfields are associated with resources, which are presented to the user, for example in screen detail 6000. The resources are also how the GUI and the User Module XML file access the bitfields.

The specific device description files reference the base device description file and may define the pins that are available on the part and the RAM and ROM that is available on the part. The specific device description files also cover all parts that share a common package type insomuch as the package falls into a similar category, for example 28-pin dual-inline package, or 44-pin TQFP. Whether the part is DIP or TSOP does may not distinguish it as a distinct part description. In other words, if a part shares a common pinout, including total pin count, with another part, then it may share a specific device description file.

According to an embodiment of the present invention, the values of some of the attributes in user module description 700 are controlled by the names used in the Device Description XML files, while others are controlled by the elements and attributes in the User Module XML file itself. Each User Module XML file may contain the specifications for one, and only one User Module. From the root node <PSOC_DEVICE_DB> 702, the User Module XML file may contain one-and-only-one <PSOC_USER_MODULE_LIST> 704 element. The <PSOC_USER_MODULE_LIST> 704 element can contain a multiplicity of <PSOC_USER_MODULE> elements, for example <PSOC_USER_MODULE_LIST> 706, but generally will contain only one. The <PSOC_USER_MODULE> element may have the following attributes as described below.

A NAME attribute may be the name of the User Module. A TYPE attribute may be the enumerated type of User Module. "HTML" attribute may be the name of file containing a User Module data sheet, for example data sheet 450 in FIG. 4. The ICON attribute may be the name of file containing a User Module icon graphic. METAFILE attribute may be the name of file containing User Module block diagram. API_PATH_TYPE attribute may be the XML file path relative to other files. RAM attribute may be the amount of RAM used by the User Module API. ROM attribute may be the amount of ROM used by the User Module API.

The NAME attribute is the reference for the User Module used by the Device Editor. It is also the name that appears in under the icon in the User Module Catalog on the User Module Selection view.

The TYPE attribute is an enumeration that places the User Module in a category. The User Modules types serve to partition the User Modules onto the different Outlook bars in the User Module catalog.

The HTML, ICON, and METAFILE attributes relate to the other files used in the User Module Selection view. All of these attribute values are the literal file names that must include the extension. The HTML attribute specifies the data sheet file that is displayed in the Data Sheet area of the view. The METAFILE attribute specifies the extended metafile that contains the User Module block diagram. The block diagram appears in the Block Diagram pane of the User Module Selection view. The ICON attribute specifies the file containing the User Module icon. The icon is used in the User Module Catalog pane and the User Module Selection Bar.

The RAM and ROM attributes are the values used to determine the resource usage for the User Module. The values of the RAM and ROM attributes are subtracted from the total amount available on the device when the User Module is selected. The resource usage gauge in the configuration tool tracks the RAM and ROM usage for the User Modules selected in the current configuration.

The API_PATH_TYPE attribute specifies the relative path between the User Module XML file and the other files. With the current library scheme, all User Modules should be set for CUSTOM. The other value, NORMAL is not used or the attribute should not be included.

The <PSOC_USER_MODULE> element may contain one, and only one of each of the following elements <SHAPE>, <PARAMETER_LIST> and <API_REGISTER_ALIAS_LIST>.

The <SHAPE> element, for example <SHAPE> element 707, specifies the PSoC blocks and the resources required by the User Module, and establishes some reference names for use in other parts of the User Module description. The <SHAPE> element has only a SHAPE_TYPE attribute. The SHAPE_TYPE attribute may be set to BLOCK_LIST.

The <SHAPE> element consists of one or more <BLOCK_LIST> elements, for example <BLOCK_LIST> element 710, and at most one <RESOURCE_LIST> element.

The <BLOCK_LIST> element describes a collection of PSoC blocks that are connected between blocks within the <BLOCK_LIST> element. When multiple <BLOCK_LIST> elements are included within a <SHAPE> element, each <BLOCK_LIST> is placed on the device PSoC blocks independently. Connections between PSoC blocks from distinct <BLOCK_LIST> elements can exist through resources identified in the <RESOURCE_LIST> element.

The <BLOCK_LIST> has no attributes and consists of several <BLOCK> elements, for example <BLOCK> element 710. The <BLOCK> elements specify the following information: Block name, the type of block required, Block interrupt generation, Block personalization and Block interconnection.

The <BLOCK> element may have the attributes described below. NAME attribute may be the block reference name. The TYPE attribute may be the enumerated PSoC block type. The INTERRUPT_SOURCE attribute may be the block interrupt handler name. The INTERRUPT_TYPE attribute may be the enumerated interrupt calling type.

The NAME attribute is a local name that identifies the block within the User Module description. The NAME must be unique within a User Module, but similar names can be used in different User Modules. The NAME attribute value appears in the GUI in the User Module Placement view. When a User Module is placed, the PSoC blocks onto which the User Module is placed show the instance name of the User Module with the local name directly under it.

The TYPE attribute specifies the type of PSoC block that the User Module requires. The valid values for the TYPE attributes include: DIGITAL, DIGITAL_COMM, ANALOG_CT, ANALOG_SCA, ANALOG_SCB and ANALOG_SC.

The difference between this list and the PSoC block types used in the device description is the addition of the ANALOG_SC type in the User Module description. The ANALOG_SC block type indicates that the specified block can be placed on an ANALOG_SCA or an ANALOG_SCB block. Similarly, a DIGITAL block type can be placed on a DIGITAL or a DIGITAL_COMM block.

The INTERRUPT_SOURCE and INTERRUPT_TYPE attributes relate to an interrupt handler associated with the PSoC block. If an interrupt handler is not associated with the PSoC block, then the INTERRUPT_SOURCE and INTERRUPT_TYPE attributes should not be included in the <BLOCK> element. The INTERRUPT_SOURCE attribute value is a name that is used to generate the interrupt handler name. The INTERRUPT_SOURCE attribute value is appended to the User Module instance name to form the interrupt handler name. The INTERRUPT_TYPE attribute specifies whether a LJMP (long jump) or a CALL (to subroutine) is used when calling the interrupt handler from the vector table.

The <BLOCK> element may consist of one <REGISTER_LIST> element and at most one <INPUT_LIST> element.

The <REGISTER_LIST> element, for example <REGISTER_LIST> element 712, may specify the PSoC block personalization. The bitfield values set in this element are set on the PSoC block where the User Module is located.

The <REGISTER_LIST> consists of one-or-more <REGISTER> elements, for example <REGISTER> element 714. The <REGISTER> element may have a NAME attribute and one <BITFIELD_LIST> element. The NAME attribute value must match one of the names of the registers in a PSoC block of similar type contained in the <COMMON_BLOCK_LIST> element of the device description.

The <BITFIELD_LIST>, for example <BITFIELD_LIST> 716, consists of one-or-more <BITFIELD> elements. The <BITFIELD> elements, for example <BITFIELD> element 718, may have NAME and VALUE attributes. The bitfield NAME attribute must be one of those included in the <BITFIELD_LIST> of a block of similar type contained in the <COMMON_BLOCK_LIST> of the device description. Similarly, the VALUE attribute must be a value that is valid for the specified bitfield as defined in the device description.

The <INPUT_LIST> element, for example <INPUT_LIST> 720 of FIG. 7B, specifies the interconnection between blocks and resources within the User Module description. The <INPUT_LIST> element has no attributes and consists of one-or-more <INPUT> elements. The <INPUT> element specifies a connection between the block and another block or resource within the User Module description. The relevance of an <INPUT> element is that a connection with another PSoC block or resource on the device implies that a bitfield within the block registers must be set to a particular value.

The <INPUT> element may have the attributes described below. The SOURCE attribute may be the name of the resource or PSoC block that is the source of the input. The TYPE attribute may be an enumeration of the type of the SOURCE, either BLOCK or RESERVED_RESOURCE. The BLOCK_TYPE attribute may be an enumeration of the type of the block on which the block is placed, either ANALOG_SCA or ANALOG_SCB. The REGISTER_NAME attribute may be the name of the register within the block <REGISTER_LIST> containing the relevant bitfield. The BITFIELD attribute may be the name of the bitfield associated with the input.

The SOURCE attribute must match the name of another block or resource within the User Module.

The TYPE attribute must match the SOURCE, whether the SOURCE is a BLOCK or RESERVED_RESOURCE.

The BLOCK_TYPE attribute is only relevant when the TYPE of the <BLOCK> element is ANALOG_SC. In this case, the bitfield for a connection may vary depending on whether the <BLOCK> element was placed on an ANALOG_SCA or an ANALOG_SCB block. If the bitfield is different, then distinct <INPUT> elements specifying both cases must be included in the <INPUT_LIST> element for that <BLOCK> element.

The REGISTER_NAME attribute specifies the NAME attribute of the <REGISTER> element in the <REGISTER_LIST> element of the <BLOCK> that contains the relevant bitfield. If the bitfield name is unique, then the REGISTER_NAME can be omitted, but it is better practice to always include it.

The BITFIELD attribute value specifies the NAME attribute of the <BITFIELD> element that is associated with the input.

The <RESOURCE_LIST> element, for example <RESOURCE_LIST> element 725 of FIG. 7D, specifies the resources that the User Module requires. The User Module uses resources to enable parameterization, enable connection between blocks, or restrict placement options. There may be only one <RESOURCE_LIST> element in a <SHAPE> element. The one <RESOURCE_LIST> element contains all resources used by the User Module.

A <RESOURCE_LIST> consists of one-or-more <RESOURCE> elements. The <RESOURCE> element specifies the type of resource and connections from other blocks or resources in the User Module description. The <RESOURCE> element may have attributes as described below.

The NAME attribute may be the reference name for the resource. The

TYPE attribute may be the resource type.

The NAME attribute defines the reference name for the resource within the User Module. The TYPE attribute specifies the type of resource required. Valid values for TYPE may include: COLUMN_INPUT, ANALOG_COLUMN_CLOCK_MUX, ANALOG_CLOCK_SELECT, ANALOG_DRIVER, GLOBAL_BUS, ANALOG_COMPARATOR_OUTPUT, ANALOG_COLUMN_OUTPUT, ANALOG_COMPARATOR_CONTROL, DECIMATOR, ANALOG_MODULATOR, PIN, TEMPERATURE_VOLTAGE and DIRECT_INPUT.

These values correspond to resources in the <RESERVED_RESOURCE_LIST> in the device description.

The <RESOURCE> element contains an <INPUT_LIST> element, for example <INPUT_LIST> element 730 of FIG. 7D. The <INPUT> elements within the <INPUT_LIST> are similar to the <INPUT_LIST> element in the <BLOCK> element. The <INPUT> element for resources may have the following attributes.

The SOURCE attribute may be the name of the resource or PSoC block that is the source of the input. The TYPE attribute may be an enumeration of the type of the SOURCE, either BLOCK or RESERVED_RESOURCE. The REGISTER_NAME attribute may be the name of the register within the block <REGISTER_LIST> containing the relevant bitfield. The BITFIELD attribute may be the name of the bitfield associated with the input.

In many cases, the resource does not have a register associated with it. In these cases, the BITFIELD attribute is set to NONE and the REGISTER_NAME attribute can be omitted.

The <PARAMETER_LIST> element, for example <PARAMETER_LIST> element 740 of FIG. 7D, exposes bitfields to the GUI to allow the user to set their values. The <PARAMETER> element associates the parameter with a bitfield defines in the User Module shape. The values shown for the parameters are controlled by the bitfield values or a <PARAMETER_VALUE_LIST> element. The value list can also be limited with an <ALLOWED_VALUE_LIST> element. If a parameter has an ambiguous SOURCE, in terms of block type, then it is possible that the bitfield associated with the parameter has a different name depending on block placement. For example, if the SOURCE block is TYPE ANALOG_SC, then some of the registers have different names for the same bitfield in an ANALOG_SCA block as opposed to an ANALOG_SCB block. In this case, a parameter should be specified for both block types based on the unique register names. When the block is placed, the parameter that does not apply will disappear.

The <PARAMETER_LIST> element may contain at least one <PARAMETER> elements. The <PARAMETER> element may have the following attributes. The NAME attribute may be the name of parameter. The TYPE attribute may be the enumeration of parameter type. The SOURCE attribute may be the name of PSoC block or resource containing the bitfield associated with the parameter. The REGISTER_NAME attribute may be the name of the register containing the bitfield associated with the parameter. The BITFIELD attribute may be the name of the bitfield associated with the parameter. The ORDER attribute may be the order that the parameters appear in the list. The VALUE attribute may be the default value. The VALUE_TYPE attribute may be ENUM or INT. The default value is ENUM if attribute is missing. The MN attribute may apply only to VALUE_TYPE=INT, which is the minimum inclusive parameter value. The MAX attribute may apply only to VALUE_TYPE=INT, which may be the maximum inclusive parameter value.

The NAME attribute may be the reference name for the parameter within the User Module. In the User Module Placement view, the NAME attribute is the name that appears in the Parameter Pane grid control. The ORDER attribute determines the order that the parameters appear, where the ORDER "0" parameter is at the top with the remaining parameter listed down in ascending order. If the ORDER attribute is not specified, then the parameters are listed in alphabetical order.

The SOURCE, REGISTER_NAME, and BITFIELD attributes specify the PSoC block, or resource, and the bitfield, in the shape that contains the bitfield associate with the parameter. The SOURCE must be set to a NAME included in the <SHAPE> element of a <BLOCK> element, or of a <RESOURCE> element. The REGISTER_NAME and BITFIELD attributes must also be included in the <BLOCK> or <RESOURCE> element. A special keyword for the SOURCE attribute is ALL_DIGITAL. If the SOURCE for a parameter is set to ALL_DIGITAL, then the parameter applies to a similar bitfield for all digital PSoC blocks defined in the User Module. This value can be used to set all clocks for the digital blocks to the same value.

The VALUE attribute specifies the default value for the parameter. In the case of a parameter that does not include a <PARAMETER_VALUE_LIST> element, the VALUE attribute must be included in the <BITVALUE_LIST> of the bitfield associated with the parameter. If a <PARAMETER_VALUE_LIST> is included, then the VALUE attribute value must be included in the <PARAMETER_VALUE_LIST> element.

The TYPE attribute may be a UI helper that controls the appearance of parameters on the PSoC blocks in the Placement Pane. When a User Module is placed on to the PSoC blocks, some of the parameters may be shown on the blocks. When parameters are shown on the PSoC blocks, then they may be set from the Placement Pane by clicking on the active area for the parameter on the block, as shown in the Parameter Block Selection screen. The enumerated values of the TYPE attribute determine where on the block the active area for the parameter is shown. The valid values for the TYPE attribute are described below.

The CLOCK attribute may be the clock selection parameter. The INPUT attribute may be the input parameter. The INPUT_MUX attribute may be the special MUX input parameter. The INPUT_HIDDEN attribute may be the hidden parameter for input. The BLOCK attribute may be the general block parameters. The BLOCK_HIDDEN attribute may be hidden parameter for a block. The OUTPUT attribute may be the general output parameter. The OUTPUT_0 attribute may be the output parameter to comparator bus. The OUTPUT_1 attribute may be the output parameter to analog bus. The OUTPUT_0_HIDDEN attribute may be the hidden parameter to comparator bus. The OUTPUT_1_HIDDEN attribute may be the hidden parameter to analog bus. The API attribute may be the parameter not associated with any bitfields.

The preferred embodiment of the present invention, a method and apparatus for generating microcontroller configuration information, is thus described. While the present invention has been described in particular embodiments, it should be appreciated that the present invention should not be construed as limited by such embodiments, but rather construed according to the below claims.

What is claimed is:

1. A computer readable storage medium comprising computer executable instructions that, when executed by a processor, perform a method comprising:
   displaying a first user module and a second user module for selection by a user, the first user module identifying a first configuration for a circuit block that is reconfigurable by a microcontroller, and the second user module identifying a second, different configuration for the circuit block;
   receiving an input from a user to select the first user module and the first configuration or the second user module and the second configuration;
   generating instructions that, when processed by the microcontroller, reconfigure the circuit block to function according to the selected configuration; and
   displaying a resource assignment window reflecting a number of reconfigurable circuit blocks that are available to be reconfigured by the microcontroller.

2. The computer-readable storage medium according to claim 1, further comprising:
   storing a first text file describing the first user module and the first configuration; and
   storing a second text file describing the second user module and the second configuration.

3. The computer-readable storage medium according to claim 2, wherein the first text file and the second text file comprise XML descriptions of the first configuration and the second configuration.

4. The computer-readable medium according to claim 1, further comprising instructions to display a number of reconfigurable circuit blocks that have already been selected by the user for reconfiguration by the microcontroller.

5. The computer-readable medium according to claim 1, wherein the user module further identifies circuit configurations for at least one additional circuit block that is reconfigurable by the microcontroller.

6. The computer-readable medium according to claim 1, wherein the circuit block and microcontroller are part of a microcontroller system, the microcontroller system comprising an analog circuit block, a digital circuit block, a programmable interconnect, and an input/output transceiver.

7. The computer-readable medium according to claim 6, further comprising instructions to:
   receive inputs from the user selecting additional user modules, and
   generate instructions that, when processed by the microcontroller, reconfigure the analog circuit block, the digital circuit block, the programmable interconnect, and the input/output transceiver based on the selected additional user modules.

8. A computer-implemented method comprising:
   displaying a first user module and a second user module for selection by a user, the first user module identifying a first configuration for a circuit block that is reconfigurable by a microcontroller, and the second user module identifying a second, different configuration for the circuit block;
   receiving an input from a user to select the first user module and the first configuration or the second user module and the second configuration;
   generating instructions that, when processed by the microcontroller, reconfigure the circuit block to function according to the selected configuration; and
   displaying a resource assignment window reflecting a number of reconfigurable circuit blocks that are available to be reconfigured by the microcontroller.

9. The computer-implemented method according to claim 8, further comprising:
   storing a first text file describing the first user module and the first configuration; and
   storing a second text file describing the second user module and the second configuration.

10. The computer-implemented method according to claim 9, wherein the first text file and the second text file comprise XML descriptions of the first configuration and the second configuration.

11. The computer-implemented method according to claim 8, further comprising displaying a number of reconfigurable circuit blocks that have already been selected by the user for reconfiguration by the microcontroller.

12. The computer-implemented method according to claim 8, wherein the user module further identifies circuit configurations for at least one additional circuit block that is reconfigurable by the microcontroller.

13. The computer-implemented method according to claim 8, wherein the circuit block and microcontroller are part of a microcontroller system, the microcontroller system comprising an analog circuit block, a digital circuit block, a programmable interconnect, and an input/output transceiver.

14. The computer-implemented method according to claim 13, further comprising:
   receiving inputs from the user selecting additional user modules, and
   generating instructions that, when processed by the microcontroller, reconfigure the analog circuit block, the digital circuit block, the programmable interconnect, and the input/output transceiver based on the selected additional user modules.

* * * * *